US006630378B1

(12) United States Patent
Tanigawa

(10) Patent No.: US 6,630,378 B1
(45) Date of Patent: Oct. 7, 2003

(54) METHOD OF FABRICATING A DYNAMIC RANDOM ACCESS MEMORY DEVICE HAVING STACKED CAPACITOR MEMORY CELL ARRAYS

(75) Inventor: Takaho Tanigawa, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 08/827,414

(22) Filed: Mar. 27, 1997

(30) Foreign Application Priority Data

Mar. 27, 1996 (JP) .............................................. 8-071907

(51) Int. Cl.[7] .......................................... H01L 21/8242
(52) U.S. Cl. ........................ 438/210; 438/239; 438/241; 438/253; 438/396
(58) Field of Search ................................ 257/296, 306, 257/308; 361/301.4, 301.1; 438/210, 241, 239, 253, 396, 254, 397

(56) References Cited

U.S. PATENT DOCUMENTS 5,117,273 A * 5/1992 Stark et al. .................. 257/773
5,346,844 A * 9/1994 Cho et al. .................... 438/396

(List continued on next page.)

FOREIGN PATENT DOCUMENTS

EP        0 738 003 A2 * 10/1996    ......... H01L/21/316

OTHER PUBLICATIONS

Chittipeddi et al., "The Flow Characteristics of Borophosphosilicate (TEOS Based) Glass," VLSI Multilevel Interconnection Conference, 1991, Proceedings, Eighth Intern IEEE, 1991, pp. 68–74.*
Wolf et al., Processing For the VLSI Era: Processing Technology—vol. 1; pp. 57, 181–182, 184–185, 193, and 555, 1986.*

Primary Examiner—Stephen D. Meier
Assistant Examiner—Toniae M. Thomas
(74) Attorney, Agent, or Firm—Young & Thompson

(57) ABSTRACT

A method of forming stacked capacitors over first field effect transistors having been provided in a memory cell area of a semiconductor memory device and at least a second field effect transistor in a peripheral circuit area of the semiconductor memory device. A first insulation film is entirely formed which extends over first gate electrodes of the first field effect transistors and within first apertures defined between the first gate electrodes as well as a second gate electrode of the second field effect transistor. A first inter-layer insulator is entirely formed which extends over the first insulation film. A surface of the first inter-layer insulator is planarized. A first contact hole is formed in the first insulation film. A first conductive film is entirely formed over the first planarized surface of the first inter-layer insulator and within the first contact hole. The first conductive film is subjected to a first anisotropic etching to selectively remove part of the first conductive film which extends only over the first planarized surface of the first inter-layer insulator except both in the vicinity of and within the first contact hole to pattern stacked capacitor storage electrodes in the memory cell array area, wherein the first inter-layer insulator protects the first insulation film from the first anisotropic etching. A stacked capacitor insulation film and a second conductive film are formed and patterned to form stacked capacitors. Selective removal is made of the first inter-layer insulator extending only in the peripheral circuit area by a wet etching with use of a first photo-resist film provided over the stacked capacitors in the memory cell array area to thereby show the first insulation film only in the peripheral circuit area. The first insulation film only in the peripheral circuit area is subjected to an etch-back by use of a second photo-resist film provided over the stacked capacitors in the memory cell array area so that the first insulation film remains only on opposite side walls of the second gate electrode of the second field effect transistor to thereby form side wall oxide films at the opposite side walls of the second gate electrode.

55 Claims, 25 Drawing Sheets

U.S. PATENT DOCUMENTS 5,712,202 A * 1/1998 Liaw et al. ................. 438/253
5,726,083 A * 3/1998 Takaishi .................... 438/210
5,801,079 A * 9/1998 Takaishi .................... 438/396
5,804,479 A * 9/1998 Aoki et al. ................. 438/253
6,251,721 B1 * 6/2001 Kanazawa et al. .......... 438/240
6,331,462 B1 * 12/2001 Kasaoka et al. ............ 438/253

* cited by examiner

METHOD OF FABRICATING A DYNAMIC RANDOM ACCESS MEMORY DEVICE HAVING STACKED CAPACITOR MEMORY CELL ARRAYS

BACKGROUND OF THE INVENTION

The present invention relates to a method of fabricating a semiconductor memory device, and more particularly to a method of fabricating a dynamic random access memory device having stacked capacitor memory cell arrays.

Generally, in fabricating a dynamic random access memory device having stacked capacitor memory cell arrays, transistors have been formed before stacked capacitor memory cells are then formed. In order to form the stacked capacitor memory cells, it is necessary to carry out a large number of heat treatments. This means that a large number of heat treatments are carried out after the transistors have already been formed. For example, a reflow process is carried out to planarize an inter-layer insulator to be formed between a gate electrode and a capacitor storage electrode. An impurity diffusion process is carried out to reduce a resistivity of a stacked capacitor electrodes. A thermal oxidation process is further carried out to form a capacitor insulation film. Such heat treatments are generally carried out at a temperature, for example, in the range of 800° C. to 950° C. An approximate total time of the heat treatments is 120 minutes. Such high temperature heat treatments for a long time period cause impurity diffusions from source/drain diffusion regions whereby the source/drain diffusion regions are made deep and expand in lateral directions. As a result, it becomes likely to cause a reduction of a threshold voltage of the transistor due to short channel effects. In order to avoid this problem with the short channel effects, it is necessary to so design that a channel length defined as a distance between the source and drain regions be not shorter than a critical channel length. A possible reduction in the channel length of the transistor is important for improvement in the switching speed of the transistor. The limitation of the reduction in the channel length of the transistor results in a limitation in improvement in the high speed switching performance of the transistors such as transistors for peripheral circuits, for example, word drivers and timing generators. In order to try to settle the above problems, a technique was proposed for fabricating the dynamic random access memory device having stacked capacitor memory cell arrays. This technique is disclosed in the Japanese laid-open patent publication No. 4-134859. This technique will then be described in detail with reference to FIGS. 1A through 1E which are fragmentary cross sectional elevation views illustrative of a conventional method of fabricating a dynamic random access memory device having stacked capacitor memory cell arrays. The dynamic random access memory device has a memory cell area and a peripheral circuit area including a CMOS circuit. The memory cell array area and an n-channel MOS field effect transistor of the CMOS circuit are illustrated while a p-channel MOS field effect transistor of the CMOS circuit is not illustrated.

With reference to FIG. 1A, a p-well 2 and an n-well 3 are formed over a p-type silicon substrate 1. Over the p-well 2 and the n-well 3, field oxide films 4 are selectively formed by a local oxidation of silicon method. An ion-implantation of impurity is carried out to control a threshold voltage. A gate oxide film 5 is then formed by a thermal oxidation of silicon method. A phosphorus-doped polysilicon film is entirely deposited over the wafer so that the phosphorus-doped polysilicon film extends over the field oxide films 4 and the gate oxide film 5. The phosphorus-doped polysilicon film has a thickness of 300 nanometers. The phosphorus-doped polysilicon film is then patterned to form gate electrodes 6A and 6B. By use of the gate electrodes 6A and 6B and the field oxide films 4 as masks, an ion-implantation of phosphorus is carried out at a dose of $1 \times 10^{13}$ cm$^{-2}$ to form phosphorus doped regions. A heat treatment to the substrate is carried out to cause a phosphorus diffusion to thereby form n$^-$-type diffusion layers 7. A first silicon oxide film 8 is then entirely deposited by a chemical vapor deposition method. The first silicon oxide film 8 extends over the field oxide films 4, the gate electrodes 6A and 6B and the n$^-$-type diffusion layers 7. The first silicon oxide film 8 has a thickness of 200 nanometers. The first silicon oxide film 8 is to serve as an inter-layer insulator between MOS transistors and stacked capacitors which will be formed later. The n$^-$-type diffusion layers 7 serve as source/drain diffusion regions of the MOS transistors.

With reference to FIG. 1B, the first silicon oxide film 8 is selectively etched to form stacked capacitor storage electrode contacts 11 over the n$^-$-type diffusion layers 7 adjacent to the field oxide films 4. Other phosphorus-doped polysilicon film is entirely deposited over the wafer so that the other phosphorus-doped polysilicon film is entirely deposited over the wafer so that the other phosphorus-doped polysilicon film extends over the n$^-$-type diffusion layers 7 shown through the stacked capacitor storage electrode contacts 11 and over the first silicon oxide film 8. The other phosphorus-doped polysilicon film has a thickness of 400 nanometers. The phosphorus-doped polysilicon film is then patterned to form stacked capacitor storage electrodes 12 which extends within the stacked capacitor storage electrode contacts 11 to contact with the n$^-$-type diffusion layers 7 shown through the stacked capacitor storage electrode contacts 11 as well as over parts of the first silicon oxide film 8 overlying the gate electrodes 6A. A silicon nitride film is entirely deposited for subsequent oxidation thereof in a steam atmosphere at a temperature of 950° C. for 20 minutes to thereby form a stacked capacitor insulation film 13. Still another phosphorus-doped polysilicon film is entirely deposited over the wafer so that the still other phosphorus-doped polysilicon film extends over the stacked capacitor insulation film 13. The still other phosphorus-doped polysilicon film has a thickness of 200 nanometers. A photo-resist 15 is formed over the still other phosphorus-doped polysilicon film. By use of the photo-resist 15 as a mask, the stacked capacitor insulation films 13 and the still other phosphorus-doped polysilicon film are etched to form the stacked capacitor insulation film 13 and stacked capacitor opposite electrode 14. The stacked capacitor insulation films 13 extend over the stacked capacitor storage electrodes 12 and parts of the first silicon oxide film 8 adjacent to the stacked capacitor storage electrodes 12. The stacked capacitor opposite electrodes 14 extend over the stacked capacitor insulation films 13. As a result, the stacked capacitor has been fabricated, which comprises the stacked capacitor storage electrode 12, the stacked capacitor insulation films 13 and the stacked capacitor opposite electrode 14.

With reference to FIG. 1C, by use of the photo-resist 15 as a mask, the first silicon oxide film 8 is then subjected to etch-back to form side wall oxide films 17 on opposite side walls of the gate electrode 6B. Namely, the remaining first silicon oxide films 8 on opposite side walls of the gate electrode 6B serve as the side wall oxide films 17.

With reference to FIG. 1D, the used photo-resist 15 is removed before another photo-resist 16 is selectively formed on a memory cell array area except on a peripheral circuit area. By use of the photo-resist 16, the gate electrode 6B and the side wall oxide films 17 as masks, an ion-implantation of arsenic is carried out at a dose of $3\times10^{15}$ cm$^{-2}$ to form n$^+$-diffusion layers 18 in the p-well 2 in the peripheral circuit area. As a result, an n-channel MOS field effect transistor having a lightly doped drain structure has been fabricated in the p-well 2 in the peripheral circuit area. The used photo-resist 16 is then removed before another photo-resist not shown is formed which extends over the memory cell area and over the n-channel MOS field effect transistor. By use of the photo-resist not shown, the gate electrode not shown and the side wall oxide films not shown as masks, an ion-implantation of BF$_2$ is carried out at a dose of $3\times10^{15}$ cm$^{-2}$ to form p-diffusion layers not shown but in the n-well 3 in the peripheral circuit area. As a result, a p-channel MOS field effect transistor having a lightly doped drain structure has been fabricated in the n-well 3 in the peripheral circuit area.

With reference to FIG. 1E, the used photo-resist not shown is removed. A first inter-layer insulator 10 comprising boro-phopho silicate glass film is entirely deposited, which bury the stacked capacitors and the n-channel MOS field effect transistors in the memory cell array area as well as the n-channel and p-channel MOS field effect transistors in the peripheral circuit area. The first inter-layer insulator 10 is then selectively etched to form bit line contacts 20 which are positioned over the n$^-$-type diffusion layers 7 not adjacent to the field oxide films 4 in the memory cell array area as well as over the n$^+$-diffusion layer 18 in the peripheral circuit area and adjacent to the boundary between the memory cell array area and the peripheral circuit area so that the n$^-$-type diffusion layers 7 and the n$^+$-diffusion layer 18 are shown through the bit line contacts 20. A bit line 21 is formed which extends over the first inter-layer insulator 10 and within the bit line contacts 20 so that the bit line 21 is made into contact with the n$^-$-type diffusion layers 7 and the n$^+$-diffusion layer 18 shown through the bit line contacts 20. A second inter-layer insulator 19 comprising boro-phopho silicate glass film is entirely deposited, which extends over the bit line 21 and the first inter-layer insulator 10. The first inter-layer insulator 10 and the second inter-layer insulator 19 are then selectively etched to form a contact hole 23 which is positioned over the n$^+$-diffusion layer 18 in the peripheral circuit area and closer to the n-well 3 so that the n$^+$-diffusion layer 18 in the peripheral circuit area and closer to the n-well 3 is shown through the contact hole 23. An aluminum film is entirely deposited, which extends over the second inter-layer insulator 19 and within the contact hole 23 so that the aluminum film is partially made into contact with the n$^+$-diffusion layer 18 in the peripheral circuit area and closer to the n-well 3. The aluminum film is patterned to form an aluminum interconnection 24 which extends within the contact hole 23 and over the n$^+$-diffusion layer 18 as well as over the second inter-layer insulator 19 but in the vicinity of the contact hole 23. As a result, the dynamic random access memory device having the stacked capacitor memory cell arrays has been fabricated.

The above conventional dynamic random access memory device having the stacked capacitor memory cell arrays has the following problem. In the memory cell array area, the MIS field effect transistors and the stacked capacitors are formed, whilst in the peripheral circuit area the lightly doped drain structure MOS field effect transistors are formed. The inter-layer insulator formed between the MIS field effect transistors and the stacked capacitors comprises the first inter-layer insulator 10 in the memory cell array area. The side wall oxide films 17 are formed from the remaining parts of the first inter-layer insulator 10 in the peripheral circuit area. Namely, the inter-layer insulator formed between the MIS field effect transistors and the stacked capacitors and the side wall oxide films 17 have been formed from the common silicon oxide film as the first inter-layer insulator 10. The side wall oxide films 17 are needed to be the silicon oxide film but may not be available to be reflowed for surface planarization thereof because if the first inter-layer insulator 10 were the boro-phospho silicate glass film and further if the first inter-layer insulator 10 were reflowed for surface planarization thereof, then it is difficult to form desired side wall insulation films at opposite sides of the gate electrode 6B even by use of the etch-back process to the reflowed first inter-layer insulator 10. For this reason, the inter-layer insulator formed between the MIS field effect transistors and the stacked capacitors is not allowed to comprise such boro-phospho silicate glass film and nor permitted to be reflowed for surface planarization thereof. Namely, it is not permitted to carry out the reflow process to the inter-layer insulator formed between the MIS field effect transistors and the stacked capacitors for the purpose of the surface planarization thereof.

Since the surface planarization of the inter-layer insulator to be formed between the MIS field effect transistors and the stacked capacitors, it is extremely difficult to carry out a precise etching to the polysilicon film in order to precisely define the stacked capacitor storage electrodes particularly when advanced dynamic random access memory devices such as 64 M-bits dynamic random access memory devices are designed with 0.35 μm minimum scale. In the 64 M-bits dynamic random access memory devices, word lines or gate electrodes are, for example, designed to be arranged at a distance of approximately 0.4 micrometers, for which reason if the side wall oxide films to be formed at the opposite sides of the gate electrodes are required to have a thickness of 0.1 micrometers, then the first inter-layer insulator is also required to have the same thickness of 0.1 micrometers. A distance between the side wall oxide films of the adjacent gate electrodes provided in the memory cell array area is only 0.2 micrometers as can be understood from the above description with reference to FIG. 1A. In order to form the stacked capacitor storage electrodes, an impurity doped polysilicon film is once deposited entirely not only over the first inter-layer insulator but also within apertures of 0.2 micrometers defined between the side wall oxide films of the adjacent gate electrodes in the memory cell array area. Thereafter, the impurity doped polysilicon film is then selectively etched to form the stacked capacitor storage electrodes. Namely, the polysilicon film deposited within the aperture of 0.2 micrometers defined between the side wall oxide films of the adjacent gate electrodes in the memory cell array area is required to be etched completely as illustrated in FIG. 1B. Actually, however, it is difficult to completely etch the polysilicon film deposited within the aperture of 0.2 micrometers defined between the side wall oxide films of the adjacent gate electrodes in the memory cell array area. When the polysilicon film deposited within the aperture defined between the side wall oxide films of the adjacent gate electrodes in the memory cell array area is not completely etched, a short circuit may be caused between the adjacent stacked capacitor storage electrodes. In order to forcibly carry out the complete removal of the polysilicon film deposited within the aperture of 0.2 micrometers, it is required to carry out an excess etching for a longer etching time, for example, two or three times of the normal etching time during which the polysilicon film on the flat first inter-layer insulator over the gate electrodes has just been removed. Such excess etching causes a slight etching of the side walls of the remaining polysilicon film to be formed as the stacked capacitor storage electrodes. This means it is difficult to obtain the desired definition of the polysilicon film stacked capacitor storage electrodes.

The above conventional dynamic random access memory device having the stacked capacitor memory cell arrays has a further problem to be described below. As described above, the inter-layer insulator formed between the MIS field effect transistors and the stacked capacitors in the memory cell array area and the side wall oxide films 17 comprise the common insulation film, for example, the first inter-layer insulator 10. The first inter-layer insulator 10 to be formed into the side wall oxide films 17 are undesirably etched by the following etching processes. Any spontaneous oxide films having been formed over the $n^-$-type diffusion layers 7 under the stacked capacitor storage electrode contacts 11 are removed by a wet etching with a buffered hydrofluoric acid solution for subsequent deposition of the impurity doped polysilicon film to form the stacked capacitor storage electrodes. At this time, the first inter-layer insulator 10 to be formed into the side wall oxide films 17 are also etched by the buffered hydrofluoric acid solution.

When the impurity doped polysilicon film having been entirely deposited is patterned by etching process to form the stacked capacitor storage electrodes, the first inter-layer insulator 10 to be formed into the side wall oxide films 17 is also undesirably etched.

Any spontaneous oxide films having been formed over the stacked capacitor storage electrodes are removed by a wet etching with the buffered hydrofluoric acid solution for subsequent deposition of the silicon nitride film to form the stacked capacitor insulation films. At this time, the first inter-layer insulator 10 to be formed into the side wall oxide films 17 are also etched by the buffered hydrofluoric acid solution.

When the impurity doped polysilicon film having been entirely deposited is patterned by etching process to form the stacked capacitor opposite electrodes, the first inter-layer insulator 10 to be formed into the side wall oxide films 17 is also undesirably etched.

In each of the above four etching processes, the first inter-layer insulator 10 to be formed into the side wall oxide films 17 is etched by approximately 10–20 nanometers, for which reasons it is difficult to precisely define the side wall oxide films. This means it difficult to obtain desired lightly doped drain structure of the MOS field effect transistors in the peripheral circuit area.

Furthermore, advanced dynamic random access memory devices such as 64 M-bits dynamic random access memory devices may utilize "capacitor over bit-line structure" wherein bit lines are provided under the stacked capacitors because of facilitation of the process of the bit lines and of allowance of a larger plane area of the stacked capacitors. This technique is disclosed by M. Sakao et al. in IEDM'90, 655.

If the fabrication processes described above is applied to the dynamic random access memory devices having such capacitor over bit-line structure, then the stacked capacitors have been formed before the side wall oxide films are formed at the opposite sides of the gate electrode in the peripheral circuit area and the ion-implantation of As and $BF_2$ are sequentially carried out to at high doses to form source/drain diffusion regions of the n-channel and p-channel MOS field effect transistors. The gate electrodes of the MIS field effect transistors is the memory cell array area and the bit lines are formed from a common polysilicon or conductive film. Further, the inter-layer insulator formed between the MIS field effect transistors and the stacked capacitors in the memory cell array area and the side wall oxide films formed at opposite sides of the gate electrode in the peripheral circuit area have been formed from a common insulation film. For the same reasons as described above, it is difficult to carry out the surface planarization of the insulation film. Also for the same reasons as described above, it is difficult to completely etch the polysilicon film deposited within the aperture of 0.2 micrometers defined between the side wall oxide films of the adjacent gate electrodes in the memory cell array area. Furthermore, the insulation film or inter-layer insulator underlying the bit lines remains unetched by the mask of the bit lines.

If, however, in the peripheral circuit area, the MOS field effect transistors have been formed under the bit lines, then it is impossible to form under the bit lines any side wall oxide films of the lightly doped drain structure MOS field effect transistors or source/drain diffusion regions thereof.

In the above circumstances, it had been required to develop a novel method of fabricating a highly advanced dynamic random access memory device having stacked capacitor memory cell arrays so as to allow the required 0.4 micrometers design rule.

SUMMARY OF THE INVENTION

Accordingly, it is an object of the present invention to provide a novel method of fabricating a highly advanced dynamic random access memory device having stacked capacitor memory cell arrays formed under bit lines, which is free from any problems as described above.

It is a further object of the present invention to provide a novel method of fabricating a highly advanced dynamic random access memory device having stacked capacitor memory cell arrays formed under bit lines, which is suitable for high integration.

It is a still further object of the present invention to provide a novel method of fabricating a highly advanced dynamic random access memory device having stacked capacitor memory cell arrays formed under bit lines, which is free from a substantial reduction in threshold voltage of MOS field effect transistors formed in a peripheral circuit area and also free from any short channel effects.

It is yet a further object of the present invention to provide a novel method of fabricating a highly advanced dynamic random access memory device having stacked capacitor memory cell arrays formed under bit lines, which allows MOS field effect transistors formed in a peripheral circuit area to show high speed switching performances.

It is a further more object of the present invention to provide a novel method of fabricating a highly advanced dynamic random access memory device having stacked capacitor memory cell arrays formed under bit lines, which allows side wall oxide films to be precisely defined at opposite sides of a gate electrode in a peripheral circuit area.

It is another object of the present invention to provide a novel method of fabricating a highly advanced dynamic random access memory device having stacked capacitor memory cell arrays formed over bit lines, which is free from any problems as described above.

It is further another object of the present invention to provide a novel method of fabricating a highly advanced dynamic random access memory device having stacked capacitor memory cell arrays formed over bit lines, which is suitable for high integration.

It is still another object of the present invention to provide a novel method of fabricating a highly advanced dynamic random access memory device having stacked capacitor memory cell arrays formed over bit lines, which is free from a substantial reduction in threshold voltage of MOS field effect transistors formed in a peripheral circuit area and also free from any short channel effects.

It is yet another object of the present invention to provide a novel method of fabricating a highly advanced dynamic random access memory device having stacked capacitor memory cell arrays formed over bit lines, which allows MOS field effect transistors formed in a peripheral circuit area to show high speed switching performances.

It is still more object of the present invention to provide a novel method of fabricating a highly advanced dynamic random access memory device having stacked capacitor memory cell arrays formed over bit lines, which allows side wall oxide films to be precisely defined at opposite sides of a gate electrode in a peripheral circuit area.

The above and other objects, features and advantages of the present invention will be apparent from the following descriptions.

The present invention also provides a method of forming stacked capacitors over first field effect transistors having been provided in a memory cell area of a semiconductor memory device and at least a second field effect transistor in a peripheral circuit area of the semiconductor memory device. The method comprises the following steps. A first insulation film is entirely formed which extends over first gate electrodes of the first field effect transistors and within first apertures defined between the first gate electrodes of the first field effect transistors as well as extends over a second gate electrode of the second field effect transistor. A first inter-layer insulator is entirely formed which extends over the first insulation film to completely bury the first and second gate electrodes of the first and second field effect transistors. A surface of the first inter-layer insulator is planarized so that the first inter-layer insulator has a first planarized surface, where the first and second gate electrodes of the first and second field effect transistors are buried in the first inter-layer insulator. At least a first contact hole is selectively formed in the first insulation film extending within the apertures defined between the first gate electrodes to show a surface of one of source and drain regions of the first field effect transistors. A first conductive film is entirely formed which extends over the first planarized surface of the first inter-layer insulator and within the first contact hole so that the first conductive film is made into contact with the one of the source and drain regions of the first field effect transistors. The first conductive film is subjected to a first anisotropic etching to selectively remove part of the first conductive film which extends only over the first planarized surface of the first inter-layer insulator except both in the vicinity of and within the first contact hole to pattern stacked capacitor storage electrodes in the memory cell array area, wherein the first inter-layer insulator protects the first insulation film from the first anisotropic etching. A stacked capacitor insulation film is entirely formed which extends over the stacked capacitor storage electrodes as well as over the first planarized surface of the first inter-layer insulator. A second conductive film is entirely formed which extends over the stacked capacitor insulation film. The second conductive film and the stacked capacitor insulation film are subjected to a second anisotropic etching to selectively remove parts of the second conductive film and the stacked capacitor insulation film from the first planarized surface of the first inter-layer insulator except over and in the vicinity of the first gate electrodes of the first field effect transistors to pattern stacked capacitor insulation films and stacked capacitor opposite electrodes to thereby form stacked capacitors in the memory cell array area, wherein the first inter-layer insulator protects the first insulation film from the second anisotropic etching. Selective removal is made of the first inter-layer insulator extending only in the peripheral circuit area by a wet etching with use of a first photo-resist film provided over the stacked capacitors in the memory cell array area to thereby show the first insulation film only in the peripheral circuit area. Removal is made of the first photo-resist film. The first insulation film only in the peripheral circuit area is subjected to an etch-back by use of a second photo-resist film provided over the stacked capacitors in the memory cell array area so that the first insulation film remains only on opposite side walls of the second gate electrode of the second field effect transistor to thereby form side wall oxide films at the opposite side walls of the second gate electrode.

The present invention also provides a method of forming stacked capacitors over a bit line extending over first field effect transistors having been provided in a memory cell area of a semiconductor memory device and at least a second field effect transistor in a peripheral circuit area of the semiconductor memory device. The method comprises the following steps. A first insulation film is entirely formed which extends over first gate electrodes of the first field effect transistors and within first apertures defined between the first gate electrodes of the first field effect transistors as well as extends over a second gate electrode of the second field effect transistor. A first inter-layer insulator is entirely formed which extends over the first insulation film to completely bury the first and second gate electrodes of the first and second field effect transistors. Planarization is made of a surface of the first inter-layer insulator so that the first inter-layer insulator has a first planarized surface, where the first and second gate electrodes of the first and second field effect transistors are buried in the first inter-layer insulator. Bit line contact holes are selectively formed in the first inter-layer insulator and the first insulation film so as to show surfaces of one of the source and drain regions of each of the first and second field effect transistors. A bit line is selectively formed which extends over the first planarized surface of the first inter-layer insulator and within the bit line contact holes so that the bit line is made into contact with the surfaces of the one of the source and drain regions of each of the first and second field effect transistors. A second inter-layer insulator is entirely formed which extends over the bit line and the first planarized surface of the first inter-layer insulator. Planarization is made of a surface of the second inter-layer insulator so that the second inter-layer insulator has a second planarized surface. At least a first contact hole is formed in the first and second inter-layer insulators and in the first insulation film extending within the apertures defined between the first gate electrodes so as to show a surface of opposite one of the source and drain regions of the first field effect transistors. A first conductive film is entirely formed which extends over the second planarized surface of the second inter-layer insulator and within the first contact hole so that the first conductive film is made into contact with the opposite one of the source and drain regions of the first field effect transistors. The first conductive film is subjected to a first anisotropic etching to selectively remove part of the first conductive film which extends only over the second planarized surface of the second inter-layer insulator except both in the vicinity of and within the first contact hole to pattern stacked capacitor storage electrodes in the memory cell array area, wherein the first and second inter-layer insulators protect the first insulation film from the first anisotropic etching. A stacked capacitor insulation film is formed which extends over the stacked capacitor storage electrodes as well as over the second planarized surface of the second inter-layer insulator. A second conductive film is entirely formed which extends over the stacked capacitor insulation film. The second conductive film and the stacked capacitor insulation film are subjected to a second anisotropic etching to selectively remove parts of the second conductive film and the stacked capacitor insulation film from the second planarized surface of the second inter-layer insulator except over and in the vicinity of the first gate electrodes of the first field effect transistors to pattern stacked capacitor insulation films and stacked capacitor opposite electrodes to thereby form stacked capacitors in the memory cell array area, wherein the first inter-layer insulator protects the first insulation film from the second anisotropic etching. Selective removal is made of the first and second inter-layer insulators extending only in the peripheral circuit area by a wet etching with use of a first photo-resist film provided over the stacked capacitors in the memory cell array area to thereby show the first insulation film only in the peripheral circuit area. Removal is made of the first photo-resist film. The first insulation film only in the peripheral circuit area is subjected to an etch-back by use of a second photo-resist film provided over the stacked capacitors in the memory cell array area so that the first insulation film remains only on opposite side walls of the second gate electrode of the second field effect transistor to thereby form side wall oxide films at the opposite side walls of the second gate electrode.

BRIEF DESCRIPTIONS OF THE DRAWINGS

Preferred embodiments of the present invention will be described in detail with reference to the accompanying drawings.

DISCLOSURE OF THE INVENTION

Figure 1A:
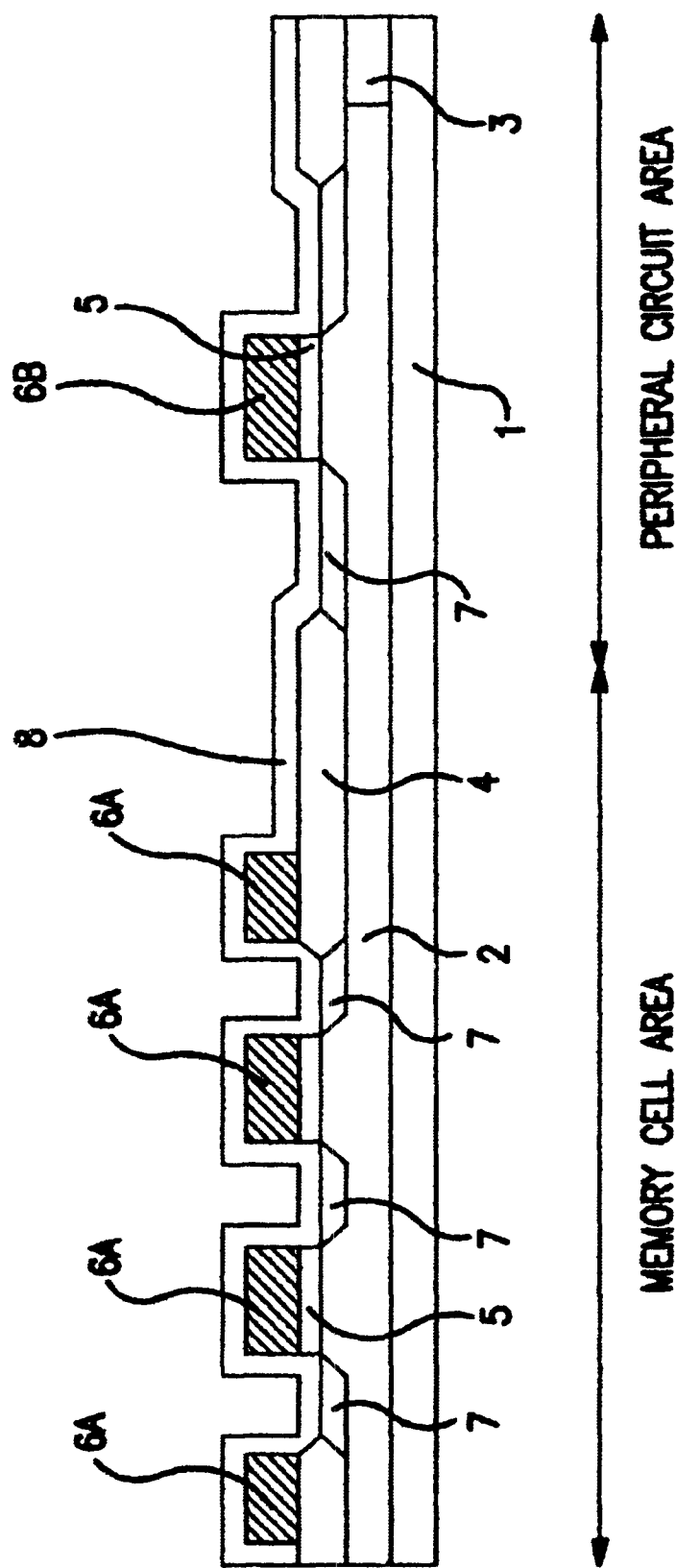
FIGS. 1A through 1E are fragmentary cross sectional elevation views illustrative of the conventional method of fabricating a dynamic random access memory device having stacked capacitor memory cell arrays under bit lines.
Figure 1B:
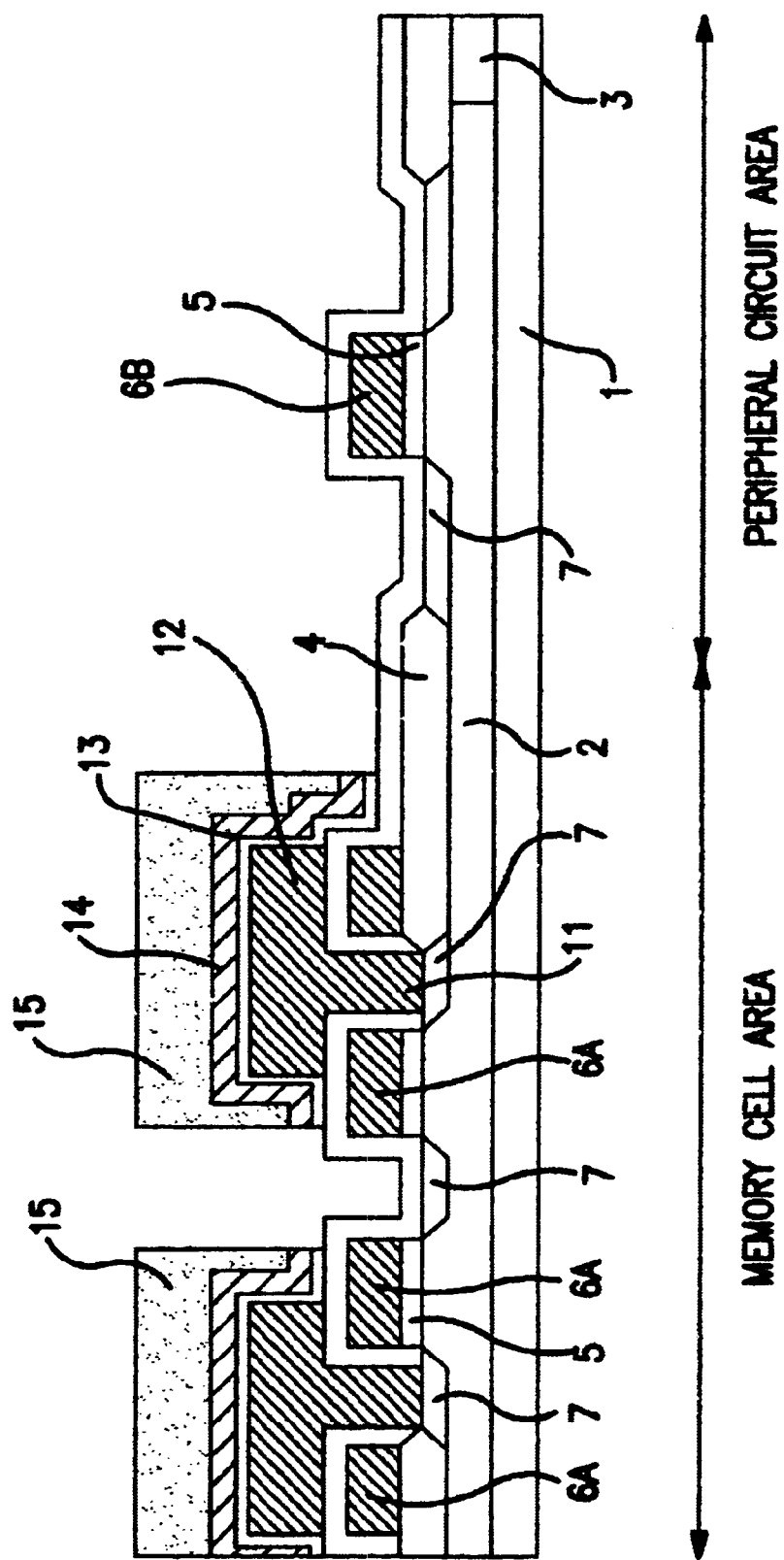
Figure 1C:
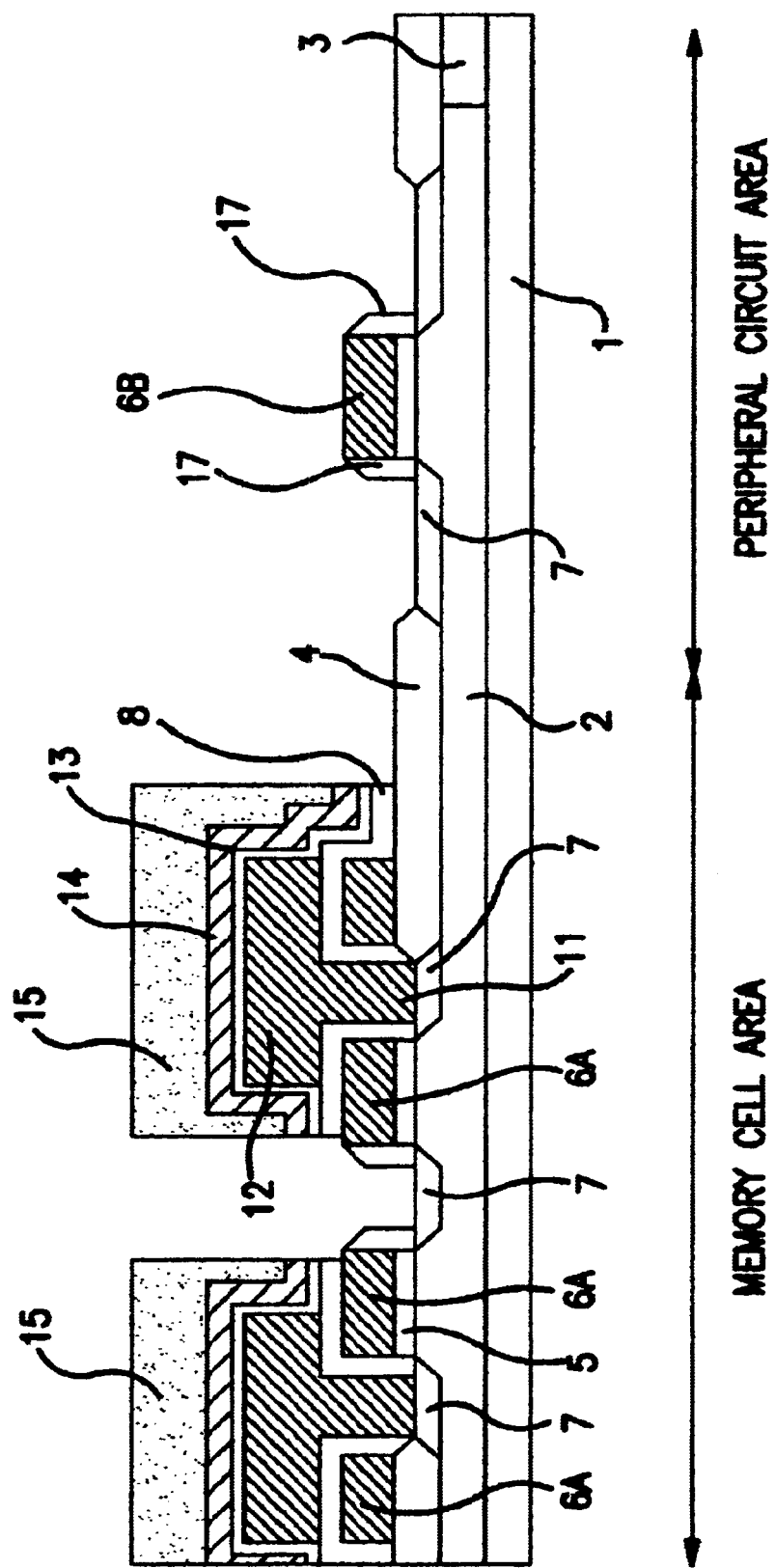
Figure 1D:
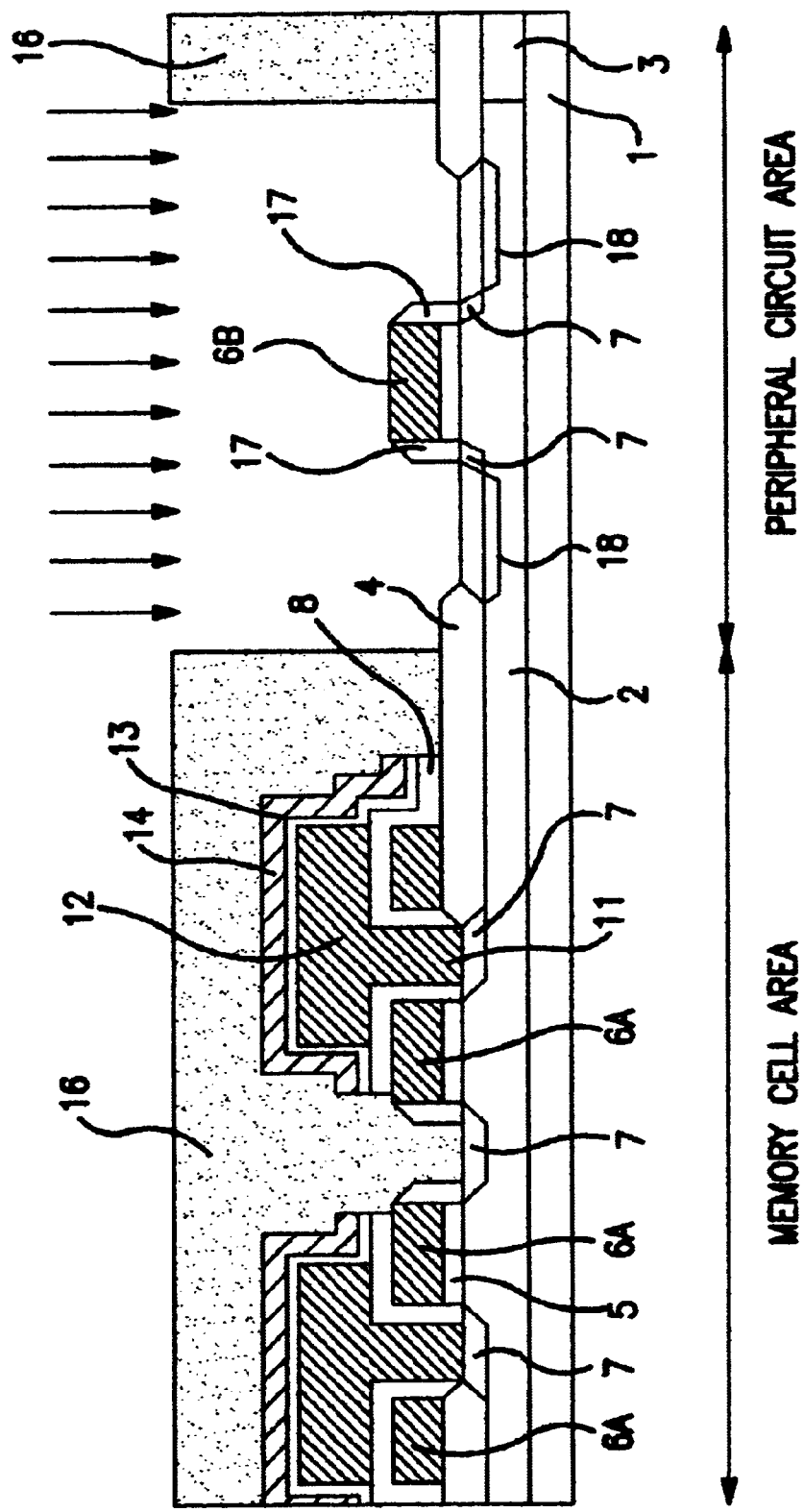
Figure 1E:
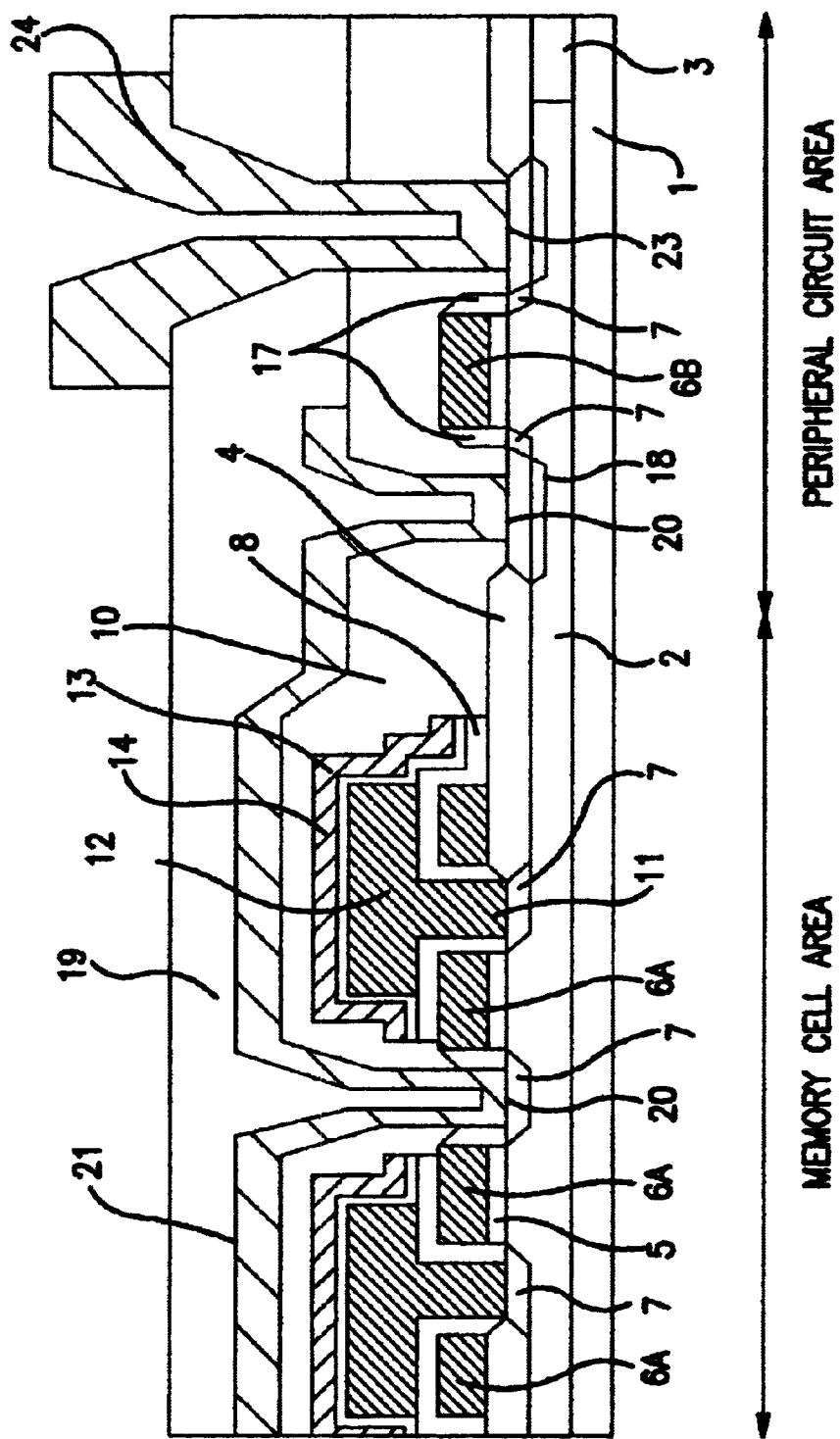

The present invention provides a method of forming stacked capacitor storage electrodes over field effect transistors having been provided in a memory cell area of a semiconductor memory device. The method comprises the following steps. A first insulation film is entirely formed which extends over gate electrodes of the field effect transistors and within apertures defined between the gate electrodes of the field effect transistors. A surface of the first insulation film is planarized so that the first insulation film has a planarized surface, where the gate electrodes of the field effect transistors are buried in the first insulation film. At least a first contact hole is selectively formed in the first insulation film extending within the apertures defined between the gate electrodes to show a surface of one of source and drain regions of the field effect transistors. A first conductive film is entirely formed which extends over the planarized surface of the first insulation film and within the first contact hole so that the first conductive film is made into contact with the source/drain regions of the field effect transistors. The first conductive film is subjected to an anisotropic etching to selectively remove part of the first conductive film which extends only over the planarized surface of the first insulation film except both in the vicinity of and within the first contact hole to pattern stacked capacitor storage electrodes.

It is possible that the step of forming the first insulation film further comprises the following steps. A silicon oxide film is entirely formed which extends over the gate electrodes and within apertures defined between the gate electrodes. A silicon nitride film is formed over the silicon oxide film. An impurity doped silicate glass film is formed over the silicon nitride film. A surface of the impurity doped silicate glass film is planarized.

It is preferable that the impurity doped silicate glass film comprises a boro-phospho silicate glass film which has been formed by a low pressure chemical vapor deposition using $Si(OC_2H_5)_4$ gas, $PH_3$ gas, $B(COH_3)_3)$ gas and $O_2$.

In the above case, it is also preferable that the silicon oxide film comprises an HTO film which has been formed by a low pressure chemical vapor deposition using $SiH_4$ and $N_2O$ as source gases.

In the above case, it is alternatively preferable that the silicon nitride film is formed by a low pressure chemical vapor deposition using $SiH_2Cl_2$ and $NH_3$ as source gases.

It is preferable that the first contact hole is formed by an anisotropic etching process using a fluoro-carbon system etching gas.

It is also preferable that the first conductive film is formed by depositing an impurity doped amorphous silicon film.

It is also preferable that the first conductive film is formed by depositing an undoped polysilicon film for subsequent ion-implantation of an impurity into the undoped polysilicon film to form an impurity doped polysilicon film.

It is also preferable that the first conductive film is formed by depositing an undoped polysilicon film for subsequent thermal diffusion by an impurity into the undoped polysilicon film to form an impurity doped polysilicon film.

It is possible to further comprise the step of subjecting a surface of the semiconductor substrate to a wet etching to remove a spontaneous oxide film from surfaces of the stacked capacitor storage electrodes, wherein the impurity doped silicate glass film serves as a mask and the silicon nitride film serves as an etching stopper so as to prevent the silicon oxide film from being etched.

It is also preferable that the planarization of the first insulation film is carried out by a reflow of a surface region of the first insulation film.

It is also preferable that the planarization of the first insulation film is carried out by a reflow of a surface region of the impurity doped silicate glass film.

It is also preferable that the planarization of the first insulation film is carried out by a rapid thermal anneal of the impurity doped silicate glass film for subsequent chemical and mechanical polishing to the impurity doped silicate glass film.

It is also preferable that the planarization of the first insulation film is carried out by a rapid thermal anneal of the impurity doped silicate glass film for subsequent spin coating of a silica film prior to an anneal of the impurity doped silicate glass film before the impurity doped silicate glass film is then subjected to an etch back by an anisotropic etching process.

The present invention also provides a method of forming stacked capacitor storage electrodes over a bit line extending over field effect transistors having been provided in a memory cell area of a semiconductor memory device. The method comprises the following steps. A first insulation film is entirely formed which extends over gate electrodes of the field effect transistors and within apertures defined between the gate electrodes of the field effect transistors. A surface of the first insulation film is planarized so that the first insulation film has a first planarized surface, where the gate electrodes of the field effect transistors are buried in the first insulation film. At least a bit line contact hole is selectively formed in the first insulation film extending within the apertures defined between the gate electrodes to show a surface of one of source and drain regions of the field effect transistors. At least a bit line is selectively formed which extends over the first planarized surface of the first insulation film and within the bit line contact hole. A second insulation film is entirely formed which extends over the bit line and over the first insulation film. A surface of the second insulation film is planarized so that the second insulation film has a second planarized surface, where the bit line is buried in the second insulation film. At least a stacked capacitor storage electrode contact hole is selectively formed in the first and second insulation films to show a surface of the opposite one of the source and drain regions of the field effect transistors. A first conductive film is entirely formed which extends over the second planarized surface of the second insulation film and within the stacked capacitor storage electrode contact hole so that the first conductive film is made into contact with the opposite one of the source and drain regions. The first conductive film is subjected to an anisotropic etching to selectively remove part of the first conductive film which extends only over the second planarized surface of the second insulation film except both in the vicinity of and within the stacked capacitor storage electrode contact hole to pattern stacked capacitor storage electrodes.

It is possible that the step of forming the first insulation film further comprises the following steps. A silicon oxide film is entirely formed which extends over the gate electrodes and within apertures defined between the gate electrodes. A silicon nitride film is formed over the silicon oxide film. An impurity doped silicate glass film is formed over the silicon nitride film. A surface of the impurity doped silicate glass film is planarized.

It is preferable that the impurity doped silicate glass film comprises a boro-phospho silicate glass film which has been formed by a low pressure chemical vapor deposition using $Si(OC_2H_5)_4$ gas, $PH_3$ gas, $B(COH_3)_3$ gas and $O_2$.

It is also preferable that the silicon oxide film comprises an HTO film which has been formed by a low pressure chemical vapor deposition using $SiH_4$ and $N_2O$ as source gases.

It is also preferable that the silicon nitride film is formed by a low pressure chemical vapor deposition using $SiH_2Cl_2$ and $NH_3$ as source gases.

It is also preferable that the first contact hole is formed by an anisotropic etching process using a fluoro-carbon system etching gas.

It is also preferable that the first conductive film is formed by depositing an impurity doped amorphous silicon film.

It is also preferable that the first conductive film is formed by depositing an undoped polysilicon film for subsequent ion-implantation of an impurity into the undoped polysilicon film to form an impurity doped polysilicon film.

It is also preferable that the first conductive film is formed by depositing an undoped polysilicon film for subsequent thermal diffusion of an impurity into the undoped polysilicon film to form an impurity doped polysilicon film.

It is also preferable to further comprise the step of subjecting a surface of the semiconductor substrate to a wet etching to remove a spontaneous oxide film from surfaces of the stacked capacitor storage electrodes, wherein the impurity doped silicate glass film serves as a mask and the silicon nitride film serves as an etching stopper so as to prevent the silicon oxide film from being etched.

It is also preferable that the planarization of the first insulation film is carried out by a reflow of a surface region of the first insulation film.

It is also preferable that the planarization of the first insulation film is carried out by a reflow of a surface region of the impurity doped silicate glass film.

It is also preferable that the planarization of the first insulation film is carried out by a rapid thermal anneal of the impurity doped silicate glass film for subsequent chemical and mechanical polishing to the impurity doped silicate glass film.

It is also preferable that the planarization of the first insulation film is carried out by a rapid thermal anneal of the impurity doped silicate glass film for subsequent spin coating of a silica film prior to an anneal of the impurity doped silicate glass film before the impurity doped silicate glass film is then subjected to an etch back by an anisotropic etching process.

It is also preferable that the second insulation film is formed by entirely depositing an impurity doped silicate glass film.

It is also preferable that the impurity doped silicate glass film comprises a boro-phospho silicate glass film which has been formed by a low pressure chemical vapor deposition using $Si(OC_2H_5)_4$ gas, $PH_3$ gas, $B(COH_3)_3$ gas and $O_2$.

It is also preferable that the step of forming the second insulation film further comprises the following steps. An impurity doped silicate glass film is formed over the silicon nitride film for subsequent planarization of a surface of the impurity doped silicate glass film.

It is also preferable that the impurity doped silicate glass film comprises a boro-phospho silicate glass film which has been formed by a low pressure chemical vapor deposition using $Si(OC_2H_5)_4$ gas, $PH_3$ gas, $B(COH_3)_3$ gas and $O_2$.

It is also preferable that the planarization of the second insulation film is carried out be a reflow of a surface region of the second insulation film.

It is also preferable that the planarization of the second insulation film is carried out by a reflow of a surface region of the impurity doped silicate glass film.

It is also preferable that the planarization of the second insulation film is carried out by a rapid thermal anneal of the impurity doped silicate glass film for subsequent chemical and mechanical polishing to the impurity doped silicate glass film.

It is also preferable that the planarization of the second insulation film is carried out by a rapid thermal anneal of the impurity doped silicate glass film for subsequent spin coating of a silica film prior to an anneal of the impurity doped silicate glass film before the impurity doped silicate glass film is then subjected to an etch back by an anisotropic etching process.

It is also preferable that the bit line is formed by the steps of depositing an impurity doped polysilicon film over the first planarized surface of the first insulation film and within the bit line contact, forming a tungsten silicide film over the impurity doped polysilicon film to thereby form a tungsten polyside film, and selectively removing part of the tungsten polyside film from the first planarized surface of the first insulation film.

The present invention also provides a method of forming stacked capacitors over first field effect transistors having been provided in a memory cell area of a semiconductor memory device and at least a second field effect transistor in a peripheral circuit area of the semiconductor memory device. The method comprises the following steps. A first insulation film is entirely formed which extends over first gate electrodes of the first field effect transistors and within first apertures defined between the first gate electrodes of the first field effect transistors as well as extends over a second gate electrode of the second field effect transistor. A first inter-layer insulator is entirely formed which extends over the first insulation film to completely bury the first and second gate electrodes of the first and second field effect transistors. A surface of the first inter-layer insulator is planarized so that the first inter-layer insulator has a first planarized surface, where the first and second gate electrodes of the first and second field effect transistors are buried in the first inter-layer insulator. At least a first contact hole is selectively formed in the first insulation film extending within the apertures defined between the first gate electrodes to show a surface of one of source and drain regions of the first field effect transistors. A first conductive film is entirely formed which extends over the first planarized surface of the first inter-layer insulator and within the first contact hole so that the first conductive film is made into contact with the one of the source and drain regions of the first field effect transistors. The first conductive film is subjected to a first anisotropic etching to selectively remove part of the first conductive film which extends only over the first planarized surface of the first inter-layer insulator except both in the vicinity of and within the first contact hole to pattern stacked capacitor storage electrodes in the memory cell array area, wherein the first inter-layer insulator protects the first insulation film from the first anisotropic etching. A stacked capacitor insulation film is entirely formed which extends over the stacked capacitor storage electrodes as well as over the first planarized surface of the first inter-layer insulator. A second conductive film is entirely formed which extends over the stacked capacitor insulation film. The second conductive film and the stacked capacitor insulation film are subjected to a second anisotropic etching to selectively remove parts of the second conductive film and the stacked capacitor insulation film from the first planarized surface of the first inter-layer insulator except over and in the vicinity of the first gate electrodes of the first field effect transistors to pattern stacked capacitor insulation films and stacked capacitor opposite electrodes to thereby form stacked capacitors in the memory cell array area, wherein the first inter-layer insulator protects the first insulation film from the second anisotropic etching. Selective removal is made of the first inter-layer insulator extending only in the peripheral circuit area by a wet etching with use of a first photo-resist film provided over the stacked capacitors in the memory cell array area to thereby show the first insulation film only in the peripheral circuit area. Removal is made of the first photo-resist film. The first insulation film only in the peripheral circuit area is subjected to an etch-back by use of a second photo-resist film provided over the stacked capacitors in the memory cell array area so that the first insulation film remains only on opposite side walls of the second gate electrode of the second field effect transistor to thereby form side wall oxide films at the opposite side walls of the second gate electrode.

It is possible to further comprise the step of removal of a spontaneous oxide film from the surface of the source and drain regions shown through the first contact hole by a first wet etching, wherein the first inter-layer insulator protects the first insulation film from the first wet etching, before the first conductive film is formed.

It is possible to further comprise the step of removal of a spontaneous oxide film from surfaces of the stacked capacitor storage electrodes by a third wet etching, wherein the first inter-layer insulator protects the first insulation film from the third wet etching, before the stacked capacitor insulation film is formed.

It is possible to further comprise the step of carrying out an ion-implantation of an impurity into the source and drain regions of the second field effect transistor by use of the second gate electrode, the side wall oxide films and the second photo-resist film as masks to form lightly doped drain structure of the second field effect transistor.

It is possible to further comprise the step of, after the second photo-resist film has been removed, entirely depositing a titanium film for subsequent rapid heat anneal to cause a silicidation reaction of titanium with silicon to thereby form titanium silicide films over at least the stacked capacitor opposite electrodes and the source and drain regions of the second field effect transistor before an unreacted titanium film is then removed.

It is possible to further comprise the following steps. A second inter-layer insulator is entirely formed to bury the stacked capacitors in the memory cell array area and the second field effect transistor in the peripheral circuit area. Bit line contact holes are formed in the first and second inter-layer insulators and the first insulation film so as to show surfaces of opposite one of the source and drain regions of each of the first and second field effect transistors. A bit line is formed which extends over the second inter-layer insulator and within the bit line contact holes so that the bit line is made into contact with the surfaces of the opposite one of the source and drain regions of each of the first and second field effect transistors.

It is possible that the bit line is formed by the steps of depositing an impurity doped polysilicon film over the second inter-layer insulator and within the bit line contact, forming a tungsten silicide film over the impurity doped polysilicon film to thereby form a tungsten polyside film, and patterning the tungsten polyside film.

It is possible that the step of forming the first insulation film further comprises the steps of entirely forming a silicon oxide film which extends over the gate electrodes and within apertures defined between the gate electrodes, and forming a silicon nitride film over the silicon oxide film.

It is preferable that the first inter-layer insulator is formed by depositing an impurity doped silicate glass film.

In the above case, it is preferable that the impurity doped silicate glass film comprises a boro-phospho silicate glass film which has been formed by a low pressure chemical vapor deposition using $Si(OC_2H_5)_4$ gas, $PH_3$ gas, $B(COH_3)_3)$ gas and $O_2$.

It is also preferable that the silicon oxide film comprises an HTO film which has been formed by a low pressure chemical vapor deposition using $SiH_4$ and $N_2O$ as source gases.

It is also preferable that the silicon nitride film is formed by a low pressure chemical vapor deposition using $SiH_2Cl_2$ and $NH_3$ as source gases.

It is also preferable that the first contact hole is formed by an anisotropic etching process using a fluoro-carbon system etching gas.

It is also preferable that the first conductive film is formed by depositing an impurity doped amorphous silicon film.

It is also preferable that the first conductive film is formed by depositing an undoped polysilicon film for subsequent ion-implantation of an impurity into the undoped polysilicon film to form an impurity doped polysilicon film.

It is also preferable that the first conductive film is formed by depositing an undoped polysilicon film for subsequent thermal diffusion of an impurity into the undoped polysilicon film to form an impurity doped polysilicon film.

It is also preferable that the planarization of the first inter-layer insulator is carried out by a reflow of a surface region of the first inter-layer insulator.

It is also preferable that the planarization of the first inter-layer insulator is carried out by a reflow of a surface region of the impurity doped silicate glass film.

It is also preferable that the planarization of the first inter-layer insulator is carried out by a rapid thermal anneal of the impurity doped silicate glass film for subsequent chemical and mechanical polishing to the impurity doped silicate glass film.

It is also preferable that the planarization of the first inter-layer insulator is carried out by a rapid thermal anneal of the impurity doped silicate glass film for subsequent spin coating of a silica film prior to an anneal of the impurity doped silicate glass film before the impurity doped silicate glass film is then subjected to an etch back by an anisotropic etching process.

The present invention also provides a method of forming stacked capacitors over a bit line extending over first field effect transistors having been provided in a memory cell area of a semiconductor memory device and at least a second field effect transistor in a peripheral circuit area of the semiconductor memory device. The method comprises the following steps. A first insulation film is entirely formed which extends over first gate electrodes of the first field effect transistors and within first apertures defined between the first gate electrodes of the first field effect transistors as well as extends over a second gate electrode of the second field effect transistor. A first inter-layer insulator is entirely formed which extends over the first insulation film to completely bury the first and second gate electrodes of the first and second field effect transistors. Planarization is made of a surface of the first inter-layer insulator so that the first inter-layer insulator has a first planarized surface, where the first and second gate electrodes of the first and second field effect transistors are buried in the first inter-layer insulator. Bit line contact holes are selectively formed in the first inter-layer insulator and the first insulation film so as to show surfaces of one of the source and drain regions of each of the first and second field effect transistors. A bit line is selectively formed which extends over the first planarized surface of the first inter-layer insulator and within the bit line contact holes so that the bit line is made into contact with the surfaces of the one of the source and drain regions of each of the first and second field effect transistors. A second inter-layer insulator is entirely formed which extends over the bit line and the first planarized surface of the first inter-layer insulator. Planarization is made of a surface of the second inter-layer insulator so that the second inter-layer insulator has a second planarized surface. At least a first contact hole is formed in the first and second inter-layer insulators and in the first insulation film extending within the apertures defined between the first gate electrodes so as to show a surface of opposite one of the source and drain regions of the first field effect transistors. A first conductive film is entirely formed which extends over the second planarized surface of the second inter-layer insulator and within the first contact hole so that the first conductive film is made into contact with the opposite one of the source and drain regions of the first field effect transistors. The first conductive film is subjected to a first anisotropic etching to selectively remove part of the first conductive film which extends only over the second planarized surface of the second inter-layer insulator except both in the vicinity of and within the first contact hole to pattern stacked capacitor storage electrodes in the memory cell array area, wherein the first and second inter-layer insulators protect the first insulation film from the first anisotropic etching. A stacked capacitor insulation film is formed which extends over the stacked capacitor storage electrodes as well as over the second planarized surface of the second inter-layer insulator. A second conductive film is entirely formed which extends over the stacked capacitor insulation film. The second conductive film and the stacked capacitor insulation film are subjected to a second anisotropic etching to selectively remove parts of the second conductive film and the stacked capacitor insulation film from the second planarized surface of the second inter-layer insulator except over and in the vicinity of the first gate electrodes of the first field effect transistors to pattern stacked capacitor insulation films and stacked capacitor opposite electrodes to thereby form stacked capacitors in the memory cell array area, wherein the first inter-layer insulator protects the first insulation film from the second anisotropic etching. Selective removal is made of the first and second inter-layer insulators extending only in the peripheral circuit area by a wet etching with use of a first photo-resist film provided over the stacked capacitors in the memory cell array area to thereby show the first insulation film only in the peripheral circuit area. Removal is made of the first photo-resist film. The first insulation film only in the peripheral circuit area is subjected to an etchback by use of a second photo-resist film provided over the stacked capacitors in the memory cell array area so that the first insulation film remains only on opposite side walls of the second gate electrode of the second field effect transistor to thereby form side wall oxide films at the opposite side walls of the second gate electrode.

It is possible to further comprise the step of removal of a spontaneous oxide film from the surface of the source and drain regions shown through the first contact hole by a first wet etching, wherein the first and second inter-layer insulators protect the first insulation film from the first wet etching, before the first conductive film is formed.

It is also possible to further comprise the step of removal of a spontaneous oxide film from the surface of the source and drain regions shown through the bit line contact hole by a second wet etching, wherein the first inter-layer insulator protects the first insulation film from the second wet etching, before the bit line is formed.

It is also possible to further comprise the step of removal of a spontaneous oxide film from surfaces of the stacked capacitor storage electrodes by a third wet etching, wherein the first and second inter-layer insulators protect the first insulation film from the third wet etching, before the stacked capacitor insulation film is formed.

It is also possible to further comprise the step of carrying out an ion-implantation of an impurity into the source and drain regions of the second field effect transistor by use of the second gate electrode, the side wall oxide films and the second photo-resist film as masks to form lightly doped drain structure of the second field effect transistor.

It is also possible to further comprise the step of, after the second photo-resist film has been removed, entirely depositing a titanium film for subsequent rapid heat anneal to cause a silicidation reaction of titanium with silicon to thereby form titanium silicide films over at least the stacked capacitor opposite electrodes and the source and drain regions of the second field effect transistor before an unreacted titanium film is then removed.

It is preferable that the step of forming the first insulation film further comprises the steps of entirely forming a silicon oxide film which extends over the gate electrodes and within apertures defined between the gate electrodes, and forming a silicon nitride film over the silicon oxide film.

It is also preferable that the first inter-layer insulator is formed by depositing an impurity doped silicate glass film.

In the above case, it is also preferable that the impurity doped silicate glass film comprises a boro-phospho silicate glass film which has been formed by a low pressure chemical vapor deposition using $Si(OC_2H_5)_4$ gas, $PH_3$ gas, $B(COH_3)_3$ gas and $O_2$.

In the above case, it is also preferable that the silicon oxide film comprises an HTO film which has been formed by a low pressure chemical vapor deposition using $SiH_4$ and $N_2O$ as source gases.

It is also preferable that the silicon nitride film is formed by a low pressure chemical vapor deposition using $SiH_2Cl_2$ and $NH_3$ as source gases.

It is also preferable that the first contact hole is formed by an anisotropic etching process using a fluoro-carbon system etching gas.

It is also preferable that the first conductive film is formed by depositing an impurity doped amorphous silicon film.

It is also preferable that the first conductive film is formed by depositing an undoped polysilicon film for subsequent ion-implantation of an impurity into the undoped polysilicon film to form an impurity doped polysilicon film.

It is also preferable that the first conductive film is formed by depositing an undoped polysilicon film for subsequent thermal diffusion of an impurity into the undoped polysilicon film to form an impurity doped polysilicon film.

It is also preferable that the planarization of the first inter-layer insulator is carried out by reflow of a surface region of the first inter-layer insulator.

It is also preferable that the planarization of the first inter-layer insulator is carried out by a reflow of a surface region of the impurity doped silicate glass film.

It is also preferable that the planarization of the first inter-layer insulator is carried out by a rapid thermal anneal of the impurity doped silicate glass filer for subsequent chemical and mechanical polishing to the impurity doped silicate glass film.

It is also preferable that the planarization of the first inter-layer insulator is carried out by a rapid thermal anneal of the impurity doped silicate glass film for subsequent spin coating of a silica film prior to an anneal of the impurity doped silicate glass film before the impurity doped silicate glass film is then subjected to an etch back by an anisotropic etching process.

It is also preferable that the second inner-layer insulator is formed by depositing an impurity doped silicate glass film.

It is also preferable that the impurity doped silicate glass comprises a boro-phosphor silicate glass film which has been formed by a low pressure chemical vapor deposition using $Si(OC_2H_5)_4$ gas, $PH_3$ gas, $B(COH_3)_3$) gas and $O_2$.

It is also preferable that the planarization of the second inter-layer insulator is carried out by a reflow of a surface region of the first inter-layer insulator.

It is also preferable that the planarization of the first inter-layer insulator is carried out by a reflow of a surface region of the impurity doped silicate glass film.

It is also preferable that the planarization of the first inter-layer insulator is carried out by a rapid thermal anneal of the impurity doped silicate glass film for subsequent chemical and mechanical polishing to the impurity doped silicate glass film.

It is also preferable that the planarization of the first inter-layer insulator is carried out by a rapid thermal anneal of the impurity doped silicate glass film for subsequent spin coating of a silica film prior to an anneal of the impurity doped silicate glass film before the impurity doped silicate glass film is then subjected to an etch back by an anisotropic etching process.

It is also preferable that the bit line is formed by the steps of depositing an impurity dosed polysilicon film over the first planarized surface of the first inter-layer insulator and within the bit line contact, forming a tungsten silicide film over the impurity doped polysilicon film to thereby form a tungsten polyside film, and patterning the tungsten polyside film.

PREFERRED EMBODIMENTS

A first embodiment according to the present invention will be described with reference to FIGS. 2A through 2E which are illustrative of a novel method of fabricating a dynamic random access memory device having stacked capacitor memory cell arrays under bit lines.

Figure 2A:
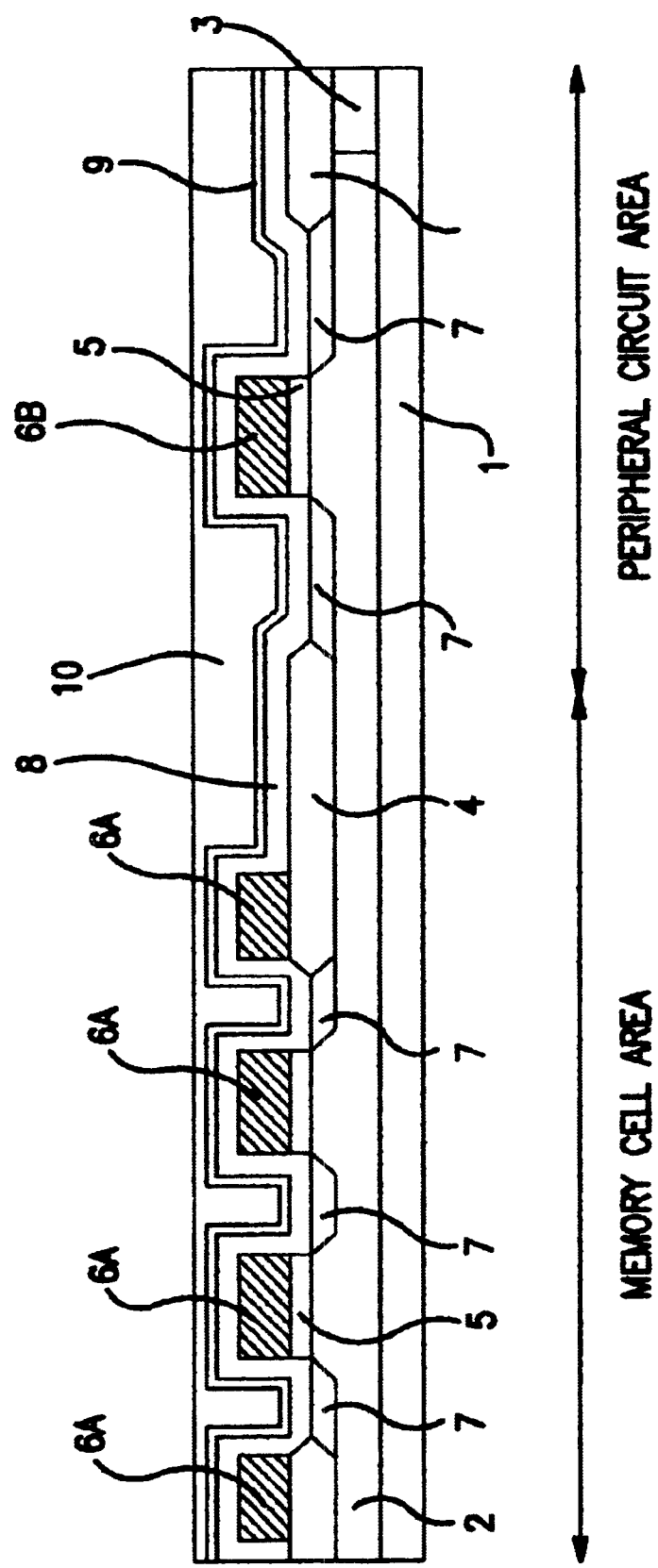
FIGS. 2A through 2E are fragmentary cross sectional elevation views illustrative of a novel method of fabricating a dynamic random access memory device having stacked capacitor memory cell arrays under bit lines in a first embodiment according to the present invention.

With reference to FIG. 2A, a p-well 2 and an n-well 3 are formed over a p-type silicon substrate 1. Over the p-well 2 and the p-well 3, field oxide films 4 are selectively formed by a local oxidation of silicon method. A silicon nitride film not shown is entirely deposited, which extends over the n-well 2 and the p-well. A photo-resist film is then provided to selectively etch the silica nitride film so that the silicon nitride film remains only over active regions on which respective elements will be formed later. The used photo-resist film is then removed. Field oxide films 4 are selectively formed over the n-well and the p-well by use of a local oxidation of silicon method using the remaining silicon nitride film as a mask. The field oxide films 4 have a thickness of approximately 300 nanometers. The used silicon nitride film is then removed. An ion-implantation of impurity may optionally be carried out to control a threshold voltage. A gate oxide film 5 is then formed on the active region by a thermal oxidation of silicon method. The gate oxide film 5 has a thickness of approximately 10–12 nanometers. A phosphorus-doped polysilicon film is entirely deposited over the wafer so that the phosphorus-doped polysilicon film extends over the field oxide films 4 and the gate oxide film 5. The phosphorus-doped polysilicon film has a thickness of approximately 100 nanometers. Further, a tungsten silicide film not shown is subsequently and entirely deposited over the wafer so that the tungsten silicide film extends over the phosphorus-doped polysilicon film. The phosphorous-doped polysilicon film and the tungsten silicide film are then patterned to form gate electrodes 6A and 6B. By use of the gate electrodes 6A and 6B and the field oxide films 4 as masks, an ion-implantation of phosphorus is carried out at a dose of $2 \times 10^{13}$ cm$^{-2}$ and an ion-implantation energy of 40 keV to form phosphorus doped regions. A heat treatment to the substrate is carried out to cause a phosphorus diffusion to thereby form n$^-$-type diffusion layers 7. The n$^-$-type diffusion layers 7 serves as source/drain diffusion regions of the MOS transistors. A first silicon oxide film 8 is then entirely deposited by a chemical vapor deposition method. The first silicon oxide film 8 extends over the field oxide films 4 the gate electrode 6A and 6B and the n$^-$-type diffusion layers 7. The first silicon oxide film is to serve as an inter-layer insulator between MOS transistors and stacked capacitors which will be formed later as well as serve as side wall oxide films to be formed at opposite sides of the gate electrode 6B in a peripheral circuit area. The first silicon oxide film 8 may comprise an HTO film. In this case, the HTO film may be formed by a low pressure chemical vapor deposition method which has been carried out at a temperature of approximately 800° C. by use of SiH$_4$ and N$_2$O as source gases. The HTO film has a thickness of approximately 100 nanometers.

Further, a silicon nit ride film 9 is entirely deposited over the wafer by a low pressure chemical vapor deposition method using dichlorosilane (SiH$_2$Cl$_2$) and ammonia (NH$_3$) as source gases. The silicon nitride film 9 has a thickness of approximately 50 nanometers. The silicon nitride film 9 extends over the first silicon oxide film 8. Furthermore, a boro-phospho silicate glass film is entirely deposited over one wafer by a low pressure chemical vapor deposition method using Si(OC$_2$H$_5$)4, PH$_3$, B(OCH$_3$)$_3$ and O$_2$ as source gases. The boro-phospho silicate glass film extends over the silicon nitride film 9 The boro-phospho silicate glass film has a thickness of approximate) 300 nanometers The boro-phospho silicate glass film is then reflowed at a temperature in the range of 750–900° C. for surface planarization thereof to thereby form a first inter-layer insulator 10.

Figure 2B:
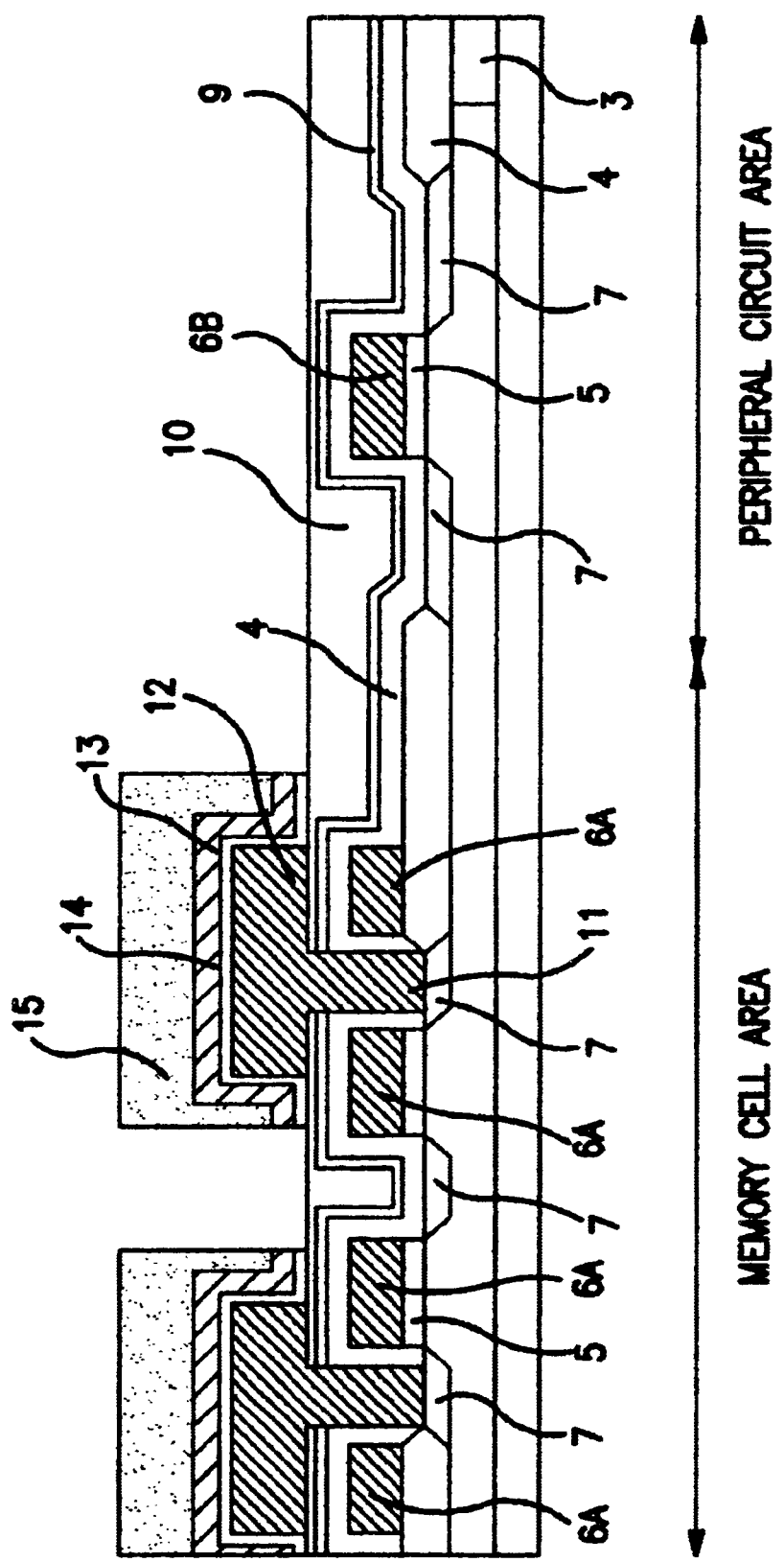

With reference to FIG. 2B, a photo-resist film is provided over the first inter-layer insulator 10. An anisotropic etching process is carried out by use of a fluoro-carbon system etching gas, such as CHF$_3$ and CF$_4$ to selectively etch the silicon nitride film 9, the first inter-layer insulator 10 and the first silicon oxide film 8 so as to form stacked capacitor storage electrode contacts 11 over the n$^-$-type diffusion layers 7 adjacent to the field oxide films 4. An n-type impurity doped amorphous silicon film is entirely deposited over the wafer by a low pressure chemical vapor deposition method using SiH$_4$ and PH$_3$ as source gases so that the n-type impurity doped amorphous silicon film extends over the n$^-$-type diffusion layers 7 shown through the stacked capacitor storage electrode contacts 11 as well as over the first inter-layer insulator 10. The n-type impurity doped amorphous silicon film has a thickness of approximately 800 nanometers. In place of the n-type impurity doped amorphous silicon film, it is possible to deposit a non-doped poly silicon film for subsequent ion-implantation of arsenic or phosphorus into the non-doped polysilicon film or a thermal diffusion of phosphorus into the non-doped polysilicon film so that the non-doped polysilicon is made into an n-type impurity doped polysilicon film. The impurity concentration of the n-type impurity doped amorphous silicon film or the n-type impurity doped polysilicon film is approximately $1 \times 10^{20}$ cm$^{-2}$. A photo-resist film is then formed over the n-type impurity doped amorphous silicon film or the n-type impurity doped polysilicon film. By use of the photo-resist film as a mask, an anisotropic etching is carried out to selectively pattern the n-type impurity doped amorphous silicon film or the n-type impurity doped polysilicon film so as to form stacked capacitor storage electrodes 12. The stacked capacitor storage electrode 12 extend within the stacked capacitor storage electrode contacts 11 and so extend over the first inter-layer insulator 10 in the vicinity of the stacked capacitor storage electrode contacts 11. A cleaning of surfaces of the stacked capacitor storage electrodes 12 is made and a spontaneous oxide film is removed from the surfaces of the stacked capacitor storage electrodes 12. A rapid thermal nitration is carried out at a temperature of approximately 870° C. for 60 seconds in an ammonium atmosphere to form a silicon nitride film not shown, which, however, extends over the surfaces of the stacked capacitor storage electrodes 12 and over the first inter-layer insulator 10. The silicon nitride film has a thickness of 0.5 nanometers. Another silicon nitride film not shown is further formed entirely over the above silicon nitride film by a low pressure chemical vapor deposition method. The other silicon nitride film has a thickness of 6 nanometers. The silicon nitride films are then subjected to a steam atmosphere at a temperature of 850° C. for 30 minutes for thermal oxidation of a surface of the silicon nitride film to thereby form a silicon oxide film on the silicon nitride film. The silicon oxide film has an approximated thickness of 5 nanometers. As a result, a stacked capacitor insulation film 13 is formed over the stacked capacitor storage electrodes 12 and over the first inter-layer insulator 10. An n-type impurity doped polysilicon film is entirely deposited over the wafer so that the n-type impurity doped polysilicon film extends over the stacked capacitor insulation film 13. The n type impurity doped polysilicon film has a thickness of 150 nanometers. A photo-resist 15 is formed over the n-type impurity doped polysilicon film. By use of the photo-resist 15 as a mask, the stacked capacitor insulation films 13 and the n-type impurity doped polysilicon film are etched to form the stacked capacitor insulation films 13 and stacked capacitor opposite electrodes 14. The stacked capacitor insulation films 13 extend over the stacked capacitor storage electrodes 12 and parts of the first inter-layer insulator adjacent to the stacked capacitor storage electrodes 12. The stacked capacitor opposite electrodes 14 extend over the stacked capacitor insulation films 13. As a result, the stacked capacitor has been fabricated, which comprises the stacked capacitor storage electrode 12, the stacked capacitor insulation film 13 and the stacked capacitor opposite electrode 14.

Figure 2C:
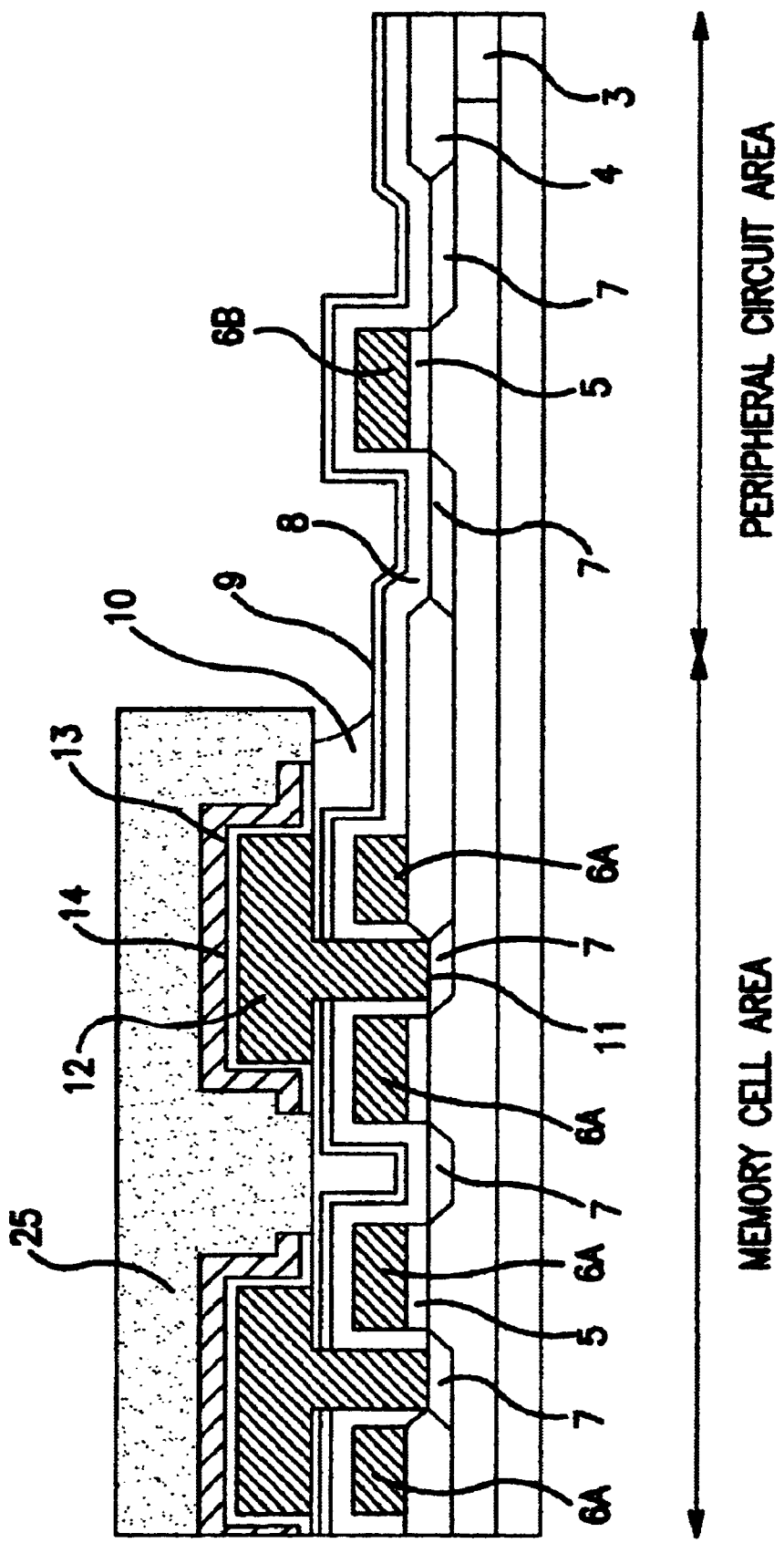

With reference to FIG. 2C, the used photo-resist 15 is removed. A photo-resist film 25 is provided, which extends over the memory cell array area. By use of the photoresist film 25 as a mask, the first inter-layer insulator 10 is selectively removed by a wet etching of a hydrofluoric solution so that the first inter-layer insulator 10 remains in the memory cell array area. As a result, the silicon nitride film is shown in the peripheral circuit area. If the hydrofluoric solution is used as an etchant for the wet etching process, then an etching rate of the boro-phospho silicate glass film serving as the first inter-layer insulator 10 to the silicon nitride film 9 is approximately 100. The silicon nitride film 9 serves as an etching stopper. In order to remove the boro-phospho silicate glass film having a thickness of 300 nanometers, it is necessary to use the silicon nitride film having a thickness of 50 nanometers as the etching stopper, so that it is possible to suppress any etching of the field oxide films 4 and the first oxide film 8 whilst the first inter-layer insulator 10 is removed but only in the peripheral circuit area.

In place of the silicon nitride film 9, it is possible to form a silicon oxide film. In place of the wet etching by use of the hydrofluoric solution, it is possible to use a low pressure vapor phase etching by use of a hydrofluoric gas. In this case, for the silicon oxide film, an HTO is used, which has a thickness of 50 nanometers and has been formed by a low pressure chemical vapor deposition method. The low pressure vapor phase etching is carried out at a pressure of 600 Pa by use of hydrofluoric acid and carried out at a pressure of 300 Pa by use of a steam ($H_2O$) at a temperature of 30° C. Under those conditions, the etching rate of the boro-phospho silicate glass film to the silicon oxide film is approximately 1000. This means that under those etching conditions, the silicon oxide film is available as the etching stopper. Therefore, it is possible to suppress etching of the field oxide film 4 and the first silicon oxide film 8, whilst the first inter-layer insulator is completely removed.

By use of the photo-resist 25 as a mask, the silicon nitride film 9 and the first silicon oxide film 8 are sequentially subjected to etch-back to thereby form side wall oxide films 17 which comprises the remaining parts of the first silicon oxide film 8. The etch back process is a reactive ion etching which has been carried out at a power of 250 W and a pressure of 700 mTorr by use of argon gas as a carrier gas and $CHF_3$ gas and $CF_4$ gas as etching gases, wherein gas flow rates are $CHF_3$:$CF_4$:Ar=40 sccm; 40 sccm: 800 sccm.

The silicon nitride film 9 remains at the opposite sides of the gate electrode 6B in the peripheral circuit area. The silicon nitride film 9 is however, not in contact with the silicon substrate 1. The silicon nitride film 9 is separated by the first silicon oxide film 8 from the silicon substrate 1. There is no possibility of increase in junction leakage current by the silicon nitride film 9. Even in order to remove the silicon nitride film 9 from the side wall oxide films, it is possible to remove the silicon nitride film by a wet etching process using a thermal phosphorus acid and by use of the stacked capacitor opposite electrode as a mask for subsequent etch back process of the first silicon oxide film 8 so as to completely remove the silicon nitride film 9.

Figure 2D:
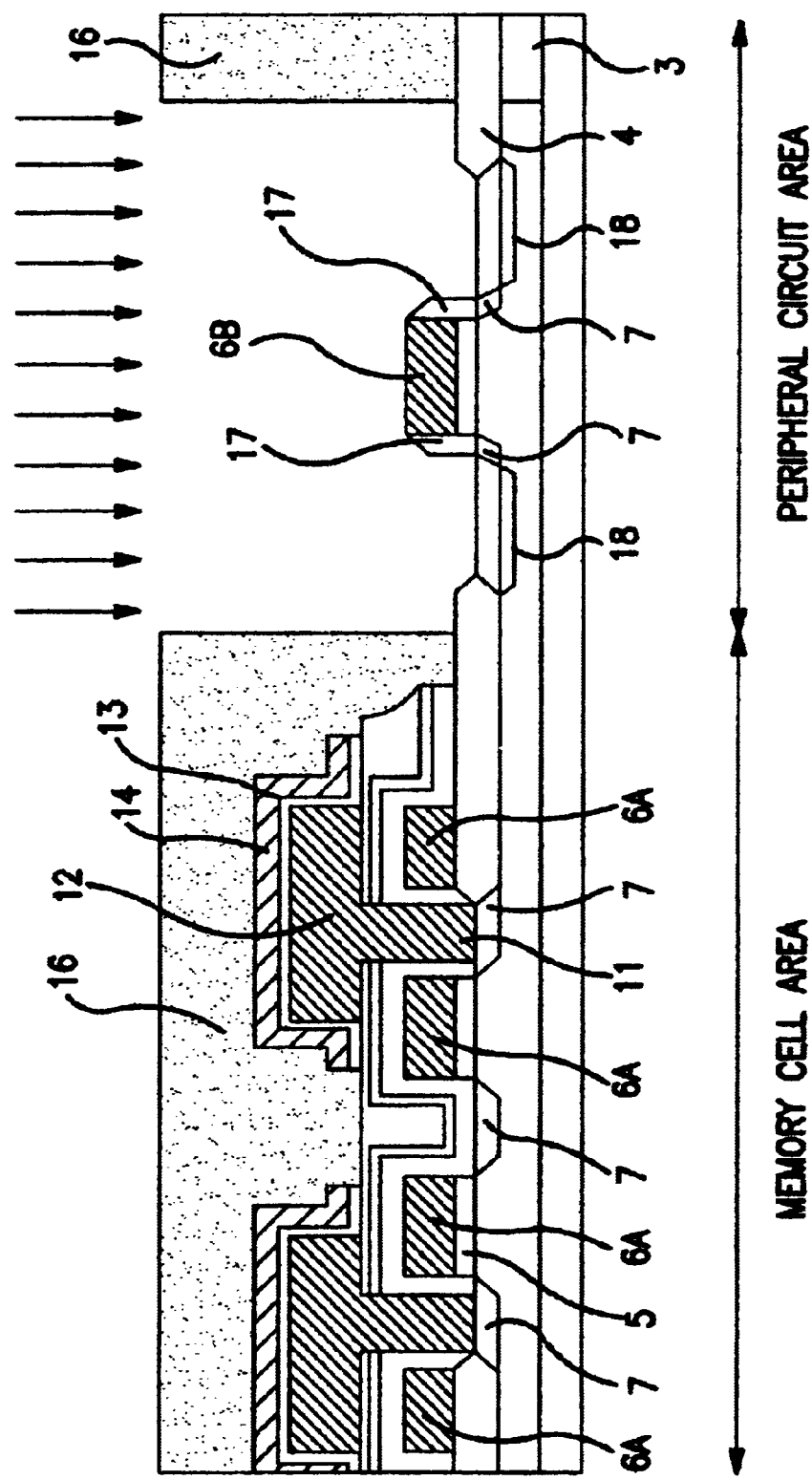

With reference to FIG. 2D, the used photo-resist 25 is removed before another photo-resist 16 is selectively formed on the memory cell array area except on the peripheral circuit area. By use of the photo-resist 16, the gate electrode 6B and the side wall oxide films 17 as masks, an ion-implantation of arsenic is carried out at a dose of $3 \times 10^{15}$ $cm^{-2}$ to form $n^+$-diffusion layers 18 in the p-well 2 in the peripheral circuit area. As a result, an n-channel MOS field effect transistor having a lightly doped drain structure has been fabricated in the p-well 2 in the peripheral circuit area. The used photo-resist 16 is then removed before still another photo-resist not shown is formed which extends over the memory cell area and over the n-channel MOS field effect transistor. By use of the photo-resist not shown, the gate electrode not shown and the side wall oxide films not shown as masks, an ion-implantation of BF2 is carried out at a dose of $3 \times 10^{15}$ $cm^{-2}$ to form p-diffusion layers not shown but in the n-well 3 in the peripheral circuit area. As a result, a p-channel MOS field effect transistor having a lightly doped drain structure has been fabricated in the n-well 3 in the peripheral circuit area.

Figure 2E:
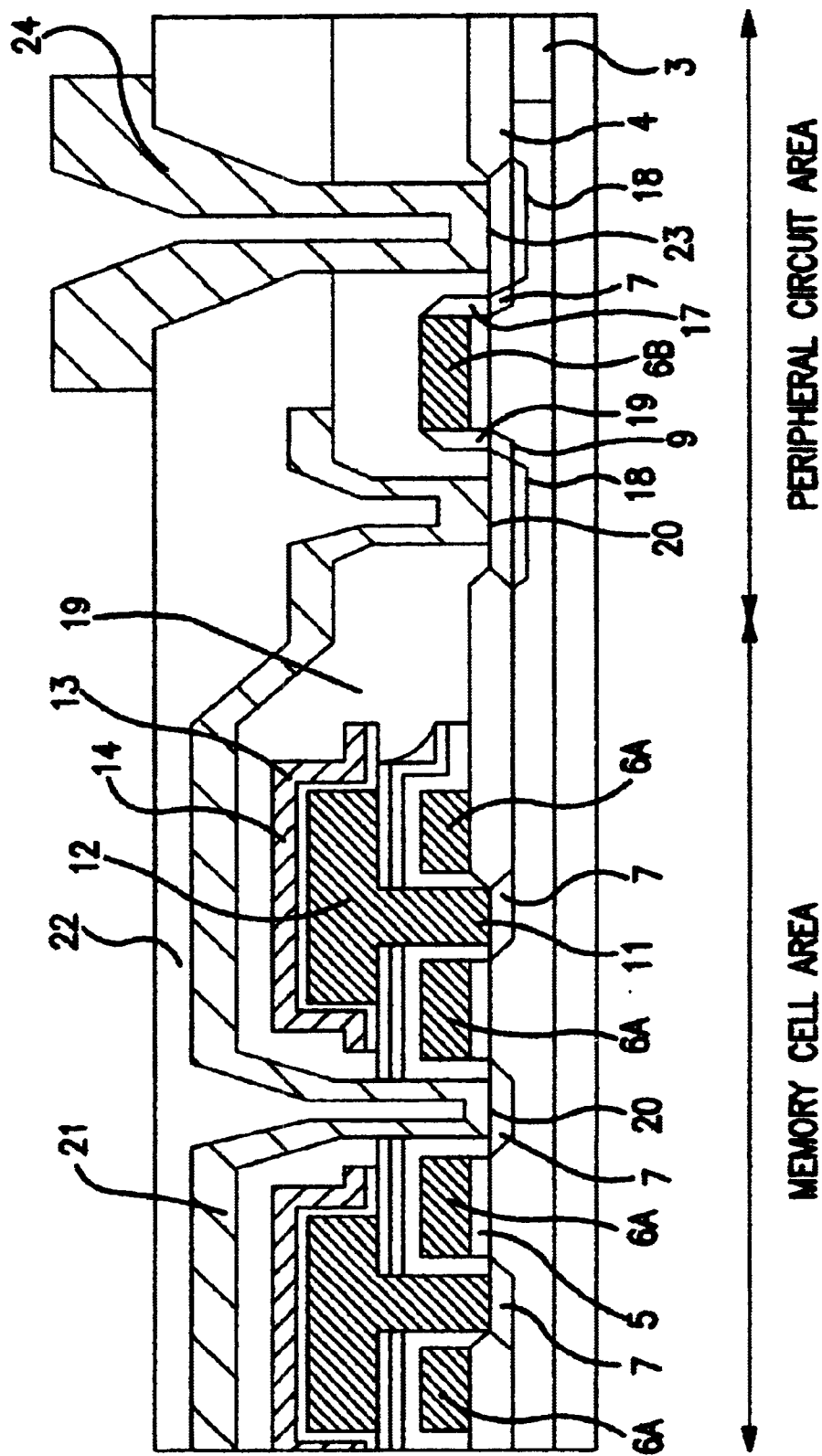

With reference to FIG. 2E, the used photo-resist not shown is removed. A second inter-layer insulator 19 is entirely deposited, which bury the stacked capacitors and the n-channel MOS field effect transistors in the memory cell array area as well as the n-channel and p-channel MOS field effect transistors in the peripheral circuit area. The surface of the second inter-layer insulator 19 is planarized and has a height of 800 nanometers from the surfaces of the n-well 2 and the p-well 3. The second inter-layer insulator 19 may comprise a silicon oxide film (HOT film) formed by a low pressure chemical vapor deposition method at a high temperature and a boro-phospho silicate glass film covering the silicon oxide film. The HTO film has been provided in order to ensure a step coverage of the second inter-layer insulator against the stacked capacitor opposite electrode 14 and the gate electrode as well as to prevent diffusions of phosphorus and boron from the boro-phospho silicate glass film into the impurity diffusion layers. Subsequently, by an anisotropic etching process using the fluoro-carbon system etching gas ($CHF_3$, and $CF_4$), the second inter-layer insulator 19 is then selectively etched to form bit line contacts 20 which are positioned over the $n^-$-type diffusion layers 7 not adjacent to the field oxide films 4 in the memory cell array area as well as over the $n^+$-diffusion layer 18 in the peripheral circuit area and adjacent to the boundary between the memory cell array area and the peripheral circuit area so that the $n^-$-type diffusion layers 7 and the $n^+$-diffusion layer 18 are shown through the bit line contacts 20. An $n^+$-type impurity doped polysilicon film is entirely deposited, which has a thickness of approximately 100 nanometers. A tungsten silicide film is then entirely deposited over the $n^+$-type impurity doped polysilicon film. The tungsten silicide film has a thickness of approximately 100 nanometers to thereby form a tungsten polyside film which serves as a bit line 21. The tungsten polyside bit line 21 extends over the second inter-layer insulator 19 and within the bit line contacts 20 so that the tungsten polyside bit line 21 is made into contact with the $n^-$-type diffusion layers 7 and the $n^+$-diffusion layer 18 shown through the bit line contacts 20. A third inter-layer insulator 22 is entirely deposited, which extends over the bit line 21 and the second inter-layer insulator 19. The second inter-layer insulator 19 and the third inter-layer insulator 22 are then selectively etched to form a contact hole 23 which is positioned over the $n^+$-diffusion layer 18 in the peripheral circuit area and closer to the n-well 3 so that the $n^+$-diffusion layer 18 in the peripheral circuit area and closer to the n-well 3 is shown through the contact hole 23. An aluminum film is entirely deposited, which extends over the second inter-layer insulator 19 and within the contact hole 23 so that the aluminum film is partially made into contact with the $n^+$-diffusion layer 18 in the peripheral circuit area and closer to the n-well 3. The aluminum film is patterned to form an aluminum interconnection 24 which extends within the contact hole 23 and over the $n^+$-diffusion layer 18 as well as over the second inter-layer insulator 19 but in the vicinity of the contact hole 23. As a result, the dynamic random access memory device having the stacked capacitor memory cell arrays has been fabricated.

In accordance with the above novel fabrication method, the inter-layer insulator between the stacked capacitors and the gate electrodes are planarized so that the extremely narrow apertures of the gate electrodes in the memory cell array area are buried with the first inter-layer insulator, for which reason the conductive film or the impurity doped polysilicon film to be formed into the stacked capacitor storage electrodes 12 is not deposited in the extremely narrow aperture between the gate electrodes. This make it unnecessary to remove or etch any conductive films within the extremely narrow apertures defined between the gate electrodes in the memory cell array area. For this reason, the above novel fabrication method is free from the problem in difficulty to completely remove the conductive films within the extremely narrow apertures defined between the gate electrodes in the memory cell array area. Namely, there is no possibility in having the conductive films remain in the extremely narrow apertures defined between the gate electrodes in the memory cell array area nor possibility to cause a problem with short circuit due to the remaining conductive film within the extremely narrow apertures defined between the gate electrodes in the memory cell array areas.

Further, after the memory cells have been formed, the side wall oxide films of the gate electrode in the peripheral circuit area as well as the .source/drain diffusion regions are formed in the peripheral circuit area. As a result, the source/drain regions in the peripheral circuit area are free from the influences of the heat treatments carried out to form the memory cell arrays. Also, the time of over-etching is reduced into not more than one fifth of that of the conventional method. The heat treatments have been carried out at a temperature in the range of 800° C. to 950° C, but the time of the heat treatment is largely reduced to 30 minutes from 120 minutes of the conventional method. It is therefore possible to prevent the short channel effect from being caused in the MOS field effect transistors in the peripheral circuit area. This makes it possible to prevent any reduction in threshold voltage of the MOS field effect transistors in the peripheral circuit area. This allows a channel length to be shorten of the MOS field effect transistors in the peripheral circuit area, thereby allowing the MOS field effect transistors to show high speed performances.

In accordance with the present invention, the side wall oxide films of the gate electrode of the lightly doped drain structure MOS. field effect transistor comprises the first silicon oxide film. Further, the silicon nitride film is formed over the first silicon oxide film. Furthermore, the first inter-layer insulator is formed over the silicon nitride film. The first inter-layer insulator serves as an etching stopper against the following etching processes. After the stacked capacitor storage electrode contacts 12 have been formed to show the n⁻-type diffusion layers 7, then the wet etching process is carried out by use of hydrofluoric solution for removal of any .spontaneous oxide film from the n⁻-type diffusion layers 7. The first inter-layer insulator serves as an etching mask against this wet etching. The first inter-layer insulator serves as an etching mask against an anisotropic etching for patterning the stacked capacitor storage electrodes 12. The first inter-layer insulator serves as an etching mask against a wet etching for removal of any spontaneous oxide film from the surfaces of the stacked capacitor storage electrodes 12 before the stacked capacitor insulation film 13 is, then formed. The first inter-layer insulator serves as an etching mask against an anisotropic etching for patterning the stacked capacitor opposite electrodes 12. While the surface of the first inter-layer insulator 10 is etched by each of the above etching processes, the first silicon oxide film to be formed into the side wall oxide films is not etched. This allows the side wall oxide films to be desirable defined. This means it possible to obtain any desired light doped drain structure of the MOS field effect transistors in the peripheral circuit area.

A second embodiment according to the present invention will be described with reference to FIGS. 3A through 3E which are illustrative of a novel method of fabricating a dynamic random access memory device having stacked capacitor memory cell arrays under bit lines.

Figure 3A:
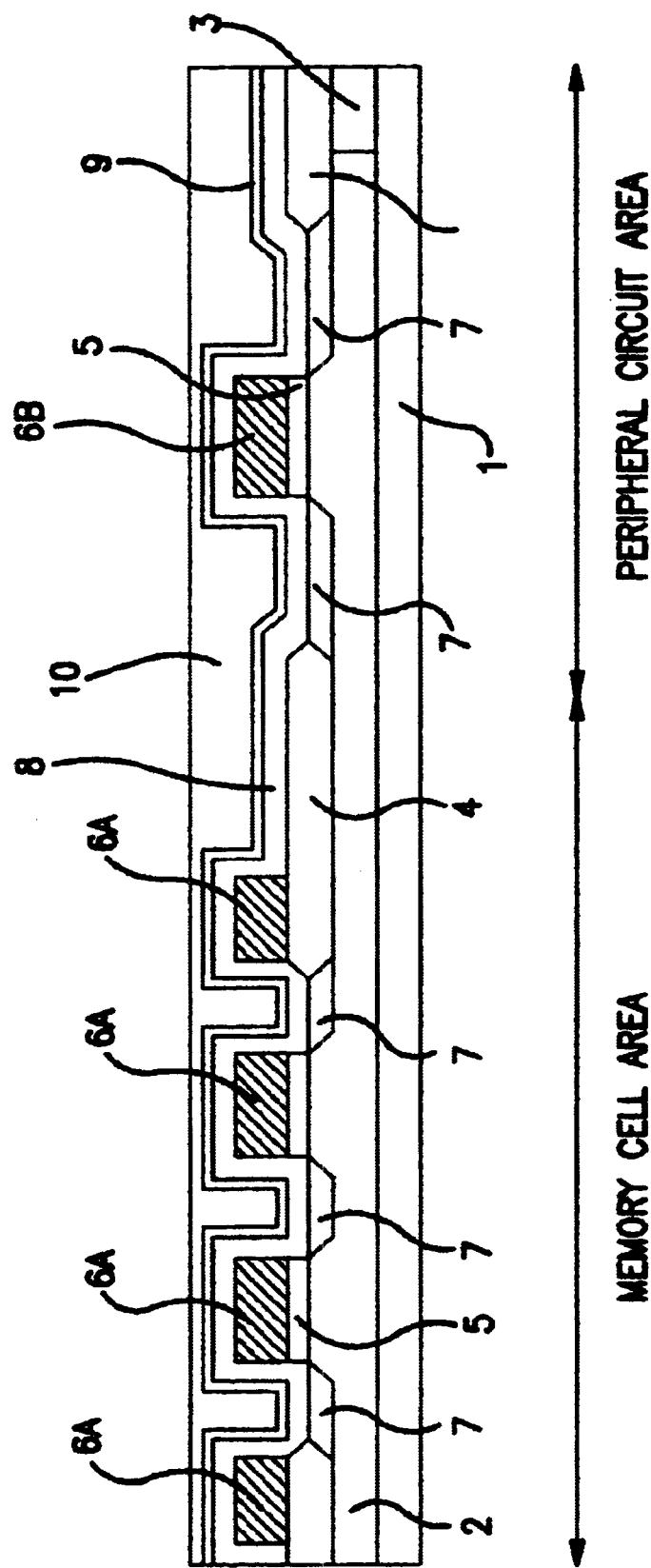
FIGS. 3A through 3E are fragmentary cross sectional elevation views illustrative of a novel method of fabricating a dynamic random access memory device having stacked oxide memory cell arrays under bit lines in a second embodiment according to the present invention.

With reference to FIG. 3A, a p-well 2 and an n-well 3 are formed over a p-type silicon substrate 1. Over the p-well 2 and the n-well 3, field oxide films 4 are selectively formed by a local oxidation of silicon method. A silicon nitride film not shown is entirely deposited, which extends over the n-well 2 and the p-well. A photo-resist film is then provided to selectively etch the silicon nitride film so that the silicon nitride film remains only over active legions on which respective elements will be formed later. The used photo-resist film is then removed. Field oxide films 4 are selectively formed over the n-well and the p-well by use of a local oxidation of silicon method using the remaining silicon nitride film as a mask. The field oxide films 4 have a thickness of approximately 300 nanometers. The used silicon nitride film is then removed. An ion-implantation of impurity may optionally be carried out to control a threshold voltage. A gate oxide film 5 is then formed on the active region by a thermal oxidation of silicon method. The gate oxide film 5 has a thickness of approximately 10–12 nanometers. A phosphorus-doped polysilicon film is entirely deposited over the wafer so that the phosphorus-doped polysilicon film extends over the field oxide films 4 and the gate oxide film 5. The phosphorus-doped polysilicon film has a thickness of approximately 100 nanometers. Further, a tungsten silicide film not shown is subsequently and entirely deposited over the wafer so that the tungsten silicide film extends over the phosphorus-doped polysilicon film. The phosphorus-doped polysilicon film and the tungsten silicide film are then patterned to form gate electrodes 6A and 6B. By use of the gate electrodes 6A and 6B and the field oxide films 4 as masks, an ion-implantation of phosphorus is carried out at a dose of $2\times10^{13}$ cm$^{-2}$ and an ion-implantation energy of 40 keV to form phosphorus doped regions. A heat treatment to the substrate is carried out to cause a phosphorus diffusion to thereby form n⁻-type diffusion layers 7. The n⁻-type diffusion layers 7 serve as source/drain diffusion regions of the MOS transistors. A first silicon oxide film 8 is then entirely deposited by a chemical vapor deposition method. The first silicon oxide film 8 extends over the field oxide films 4 the gate electrodes 6A and 6B and the n⁻-type diffusion layers 7. The first silicon oxide film 8 is to serve as an inter-layer insulator between MOS transistors and stacked capacitors which will be formed later as well as serve as side wall oxide films to be formed at opposite sides of the gate electrode 6B in a peripheral circuit area. The first silicon oxide film 8 may comprise an HTO film. In this case, the HTO film may be formed by a low pressure chemical vapor deposition method which has been carried out at a temperature of approximately 800° C. by use of SiH$_4$ and N$_2$O as source gases. The HTO film has a thickness of approximately 100 nanometers.

Further, a silicon nitride film 9 is entirely deposited over the wafer by a low pressure chemical vapor deposition method using dichlorosilane (SiH$_2$Cl$_2$) and ammonia (NH$_3$) as source gases. The silicon nitride film 9 has a thickness of approximately 50 nanometers. The silicon nitride film 9 extends over the first silicon oxide film 8. Furthermore, a boro-phospho silicate glass film is entirely deposited over the wafer by a low pressure chemical vapor deposition method using Si(OC$_2$H$_5$)$_4$, PH$_3$, B(OCH$_3$)$_3$ and O$_2$ as source gases. The boro-phospho silicate glass film extends over the silicon nitride film 9. The boro-phospho silicate glass film has a thickness of approximately 300 nanometers. The boro-phospho silicate glass film is then reflowed at a temperature in the range of 750–900° C. for surface planarization thereof to thereby form a first inter-layer insulator 10.

Figure 3B:
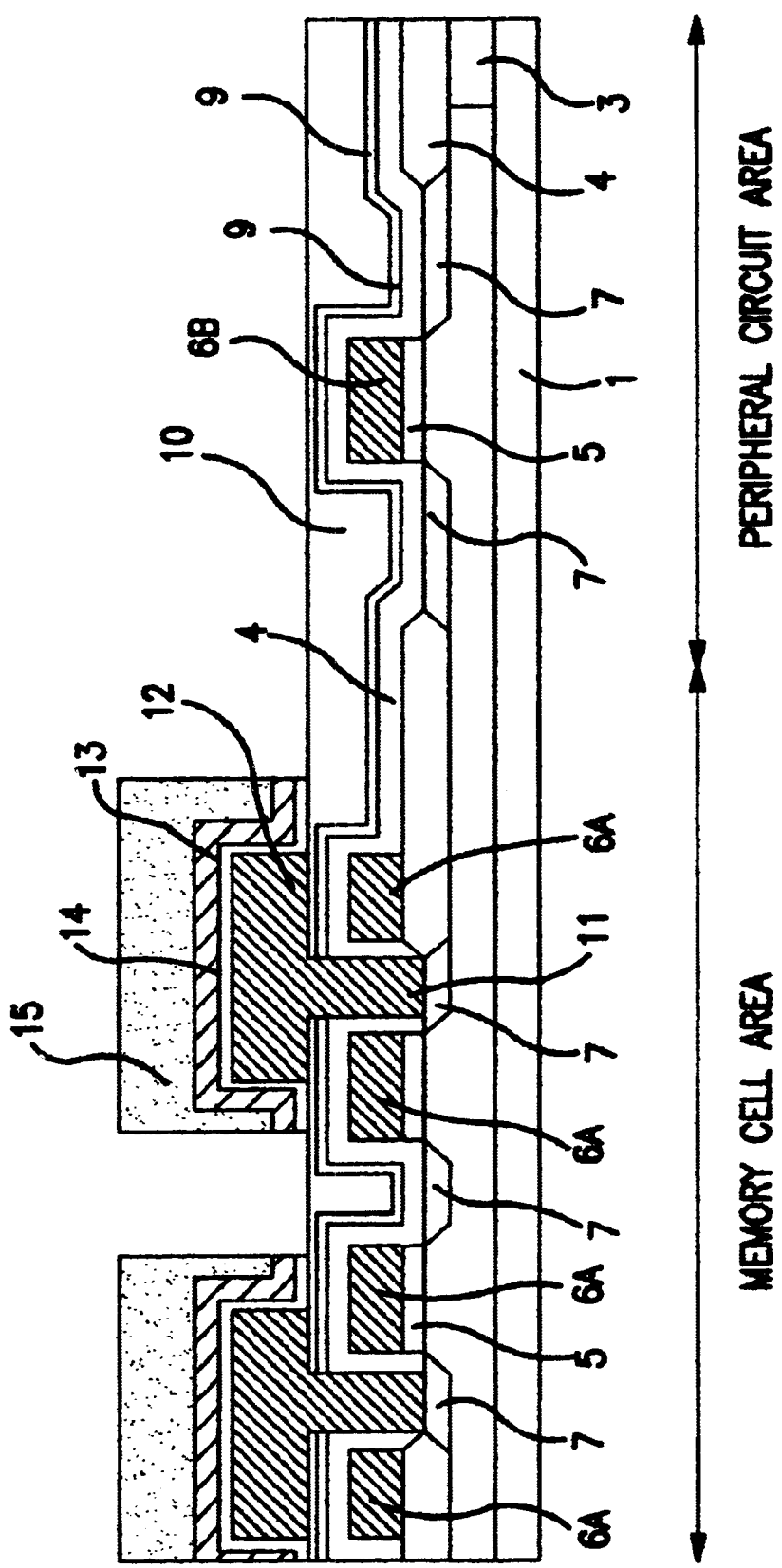

With reference to FIG. 3B, a photo-resist film is provided over the first inter-layer insulator 10. An anisotropic etching process is carried out by use of a fluoro-carbon system etching gas such as $CHF_3$ and $CF_4$ to selectively etch the silicon nitride film 9, the first inter-layer, insulator 10 and the first silicon oxide 8 so as to form stacked capacitor storage electrode contacts 11 over the n⁻-type diffusion layers 7 adjacent to the field oxide films 4. An n-type impurity doped amorphous silicon film is entirely deposited over the wafer by a low pressure chemical vapor deposition method using $SiH_4$ and $PH_3$ as source gases so that the n-type impurity doped amorphous silicon film extends over the n⁻-type diffusion layers 7 shown through the stacked capacitor storage electrode contacts 11 as well as over the fast inter-layer insulator 10. The n-type impurity doped amorphous silicon film has a thickness of approximately 800 nanometers. In place of the n-type impurity doped amorphous silicon film, it is possible to deposit a non-doped polysilicon film for subsequent ion-implantation of arsenic or phosphorus into the non-doped polysilicon film or a thermal diffusion of phosphorus into the non-doped polysilicon film so that the non-doped polysilicon film is made into an n-type impurity doped polysilicon film. The impurity concentration of the n-type impurity doped amorphous silicon film or the n-type impurity doped polysilicon film is approximately $1\times10^{20}$ cm⁻². A photo-resist film is then formed over the n-type impurity doped amorphous silicon film or the n-type impurity doped polysilicon film. By use of the photo-resist film as a mask, an anisotropic etching is carried out to selectively pattern the n-type impurity doped amorphous silicon film or the n-type impurity doped polysilicon film so as to form stack capacitor storage electrodes 12. The stacked capacitor storage electrodes 12 extend within the stacked capacitor storage electrode contacts 11 and also extend over the first inter-layer insulator 10 in the vicinity of the stacked capacitor storage electrode contacts 11. A cleaning of surfaces of the stacked capacitor storage electrodes 12 is made and a spontaneous oxide film is removed from the surfaces of the stacked capacitor storage electrodes 12. A rapid thermal nitration is carried out at a temperature of approximately 870° C. for 60 seconds in an ammonium atmosphere to form a silicon nitride film not shown, which, however, extends over the surfaces of the stacked capacitor storage electrodes 12 and over the first inter-layer insulator 10. The silicon nitride film has a thickness of 0.5 nanometers. Another silicon nitride film not shown is further formed entirely over the above silicon nitride film by a low pressure chemical vapor deposition method. The other silicon nitride film has a thickness of 6 nanometers. The silicon nitride films are then subjected to a steam atmosphere at a temperature of 850° C. for 30 minutes for thermal oxidation of a surface of the silicon nitride film to thereby form a silicon oxide film on the silicon nitride film. The silicon oxide film has an approximated thickness of 5 nanometers. As a result, .a stacked capacitor insulation film 13 is formed over the stacked capacitor storage electrodes 12 and over the first inter-layer insulator 10. An n-type impurity doped polysilicon film is entirely deposited over the wafer so that the n-type impurity doped polysilicon film extends over the stacked capacitor insulation film 13. The n-type impurity doped polysilicon film has a thickness of 150 nanometers. A photo-resist 15 is formed over the n-type impurity doped polysilicon film. By use of the photo-resist 15 as a mask, the stacked capacitor insulation films 13 and the n-type impurity doped polysilicon film are etched to form the stacked capacitor insulation films 13 and stacked capacitor opposite electrodes 14. The stacked capacitor insulation films 13 extend over the stacked capacitor storage electrodes 12 and parts of the first inter-layer insulator adjacent to the stacked capacitor storage electrodes 12. The stacked, capacitor opposite electrodes 14 extend over the stacked capacitor insulation films 13. As a result, the stacked capacitor has been fabricated, which comprises the stacked capacitor storage electrode 12, the stacked capacitor insulation film 13 and the stacked capacitor opposite electrode 14.

Figure 3C:
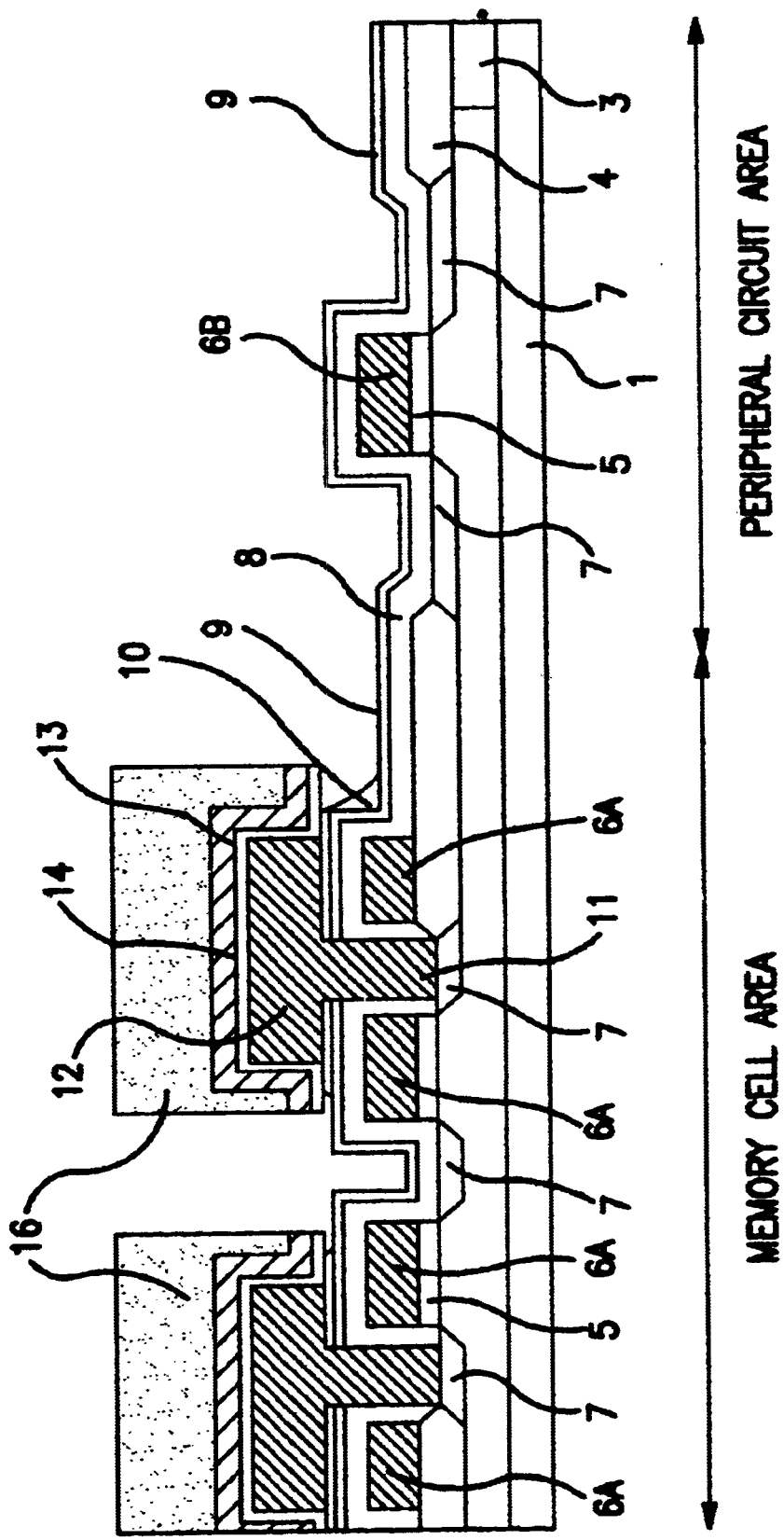

With reference to FIG. 3C, by use of the photo-resist film 15 as a mask, the first inter-layer insulator 10 is selectively removed by a wet etching of a hydrofluoric solution so that the first inter-layer insulator 10 remains in the memory cell array area. As a result, the silicon nitride film is shown in the peripheral circuit area. If the hydrofluoric solution is used as an etchant for the wet etching process, then an etching rate of the boro-phospho silicate glass film serving as the first inter-layer insulator 10 to the silicon nitride film 9 is approximately 100. The silicon nitride film 9 serves as an etching stopper. In order to remove the boro-phospho silicate glass film having a thickness of 300 nanometers, it is necessary to use the silicon nitride film having a thickness of 50 nanometers as the etching stopper, so that it is possible to suppress any etching of the field oxide films 4 and the first oxide film 8 whilst the first inter-layer insulator 10 is removed but only in the peripheral circuit area.

In place of the silicon nitride film 9, it is possible to form a silicon oxide film. In place of the wet etching by use of the hydrofluoric solution, it is possible to use a low pressure vapor phase etching by use of a hydrofluoric gas. In this case, for the silicon oxide film, an HTO is used, which has a thickness of 50 nanometers and has been formed by a low pressure chemical vapor deposition method. The low pressure vapor phase etching is carried out at a pressure of 600 Pa by use of hydrofluoric acid and carried out at a pressure of 300 Pa by use of a steam ($H_2O$) at a temperature of 30° C. Under those conditions, the etching rate of the boro-phospho silicate glass film to the silicon oxide film is approximately 1000. This means that under those etching conditions, the silicon oxide film is available as the etching stopper. Therefore, it is possible to suppress etching of the field oxide film 4 and the first silicon oxide film 8, whilst the first inter-layer insulator is completely removed.

By use of the photo-resist 15 as a mask, the silicon nitride film 9 and the first silicon oxide film 8 are sequentially subjected to etch-back to thereby form side wall oxide films 17 which comprises the remaining parts of the first silicon oxide film 8. The etch back process is a reactive ion etching which has been carried out at a power of 250 W and a pressure of 700 mTorr by use of argon gas as a carrier gas and $CHF_3$ gas and $CF_4$ gas as etching gases, wherein gas flow rates are $CHF_3$ :$CF_4$:Ar=40 sccm; 40 sccm; 800 sccm.

The silicon nitride film 9 remains at the opposite sides of the gate electrode 6B in the peripheral circuit area. The silicon nitride film 9 is however, not in contact with the silicon substrate 1. The silicon nitride film 9 is separated by the first silicon oxide film 8 from the silicon substrate 1. There is no possibility of increase in junction leakage current by the silicon nitride film 9. Even in order to remove the silicon nitride film 9 from the side wall oxide films, it is possible to remove the silicon nitride film by a wet etching process using a thermal phosphorus acid and by use of the stacked capacitor opposite electrode as a mask for subsequent etch back process of the first silicon oxide film 8 so as to completely remove the silicon nitride film 9.

Figure 3D:
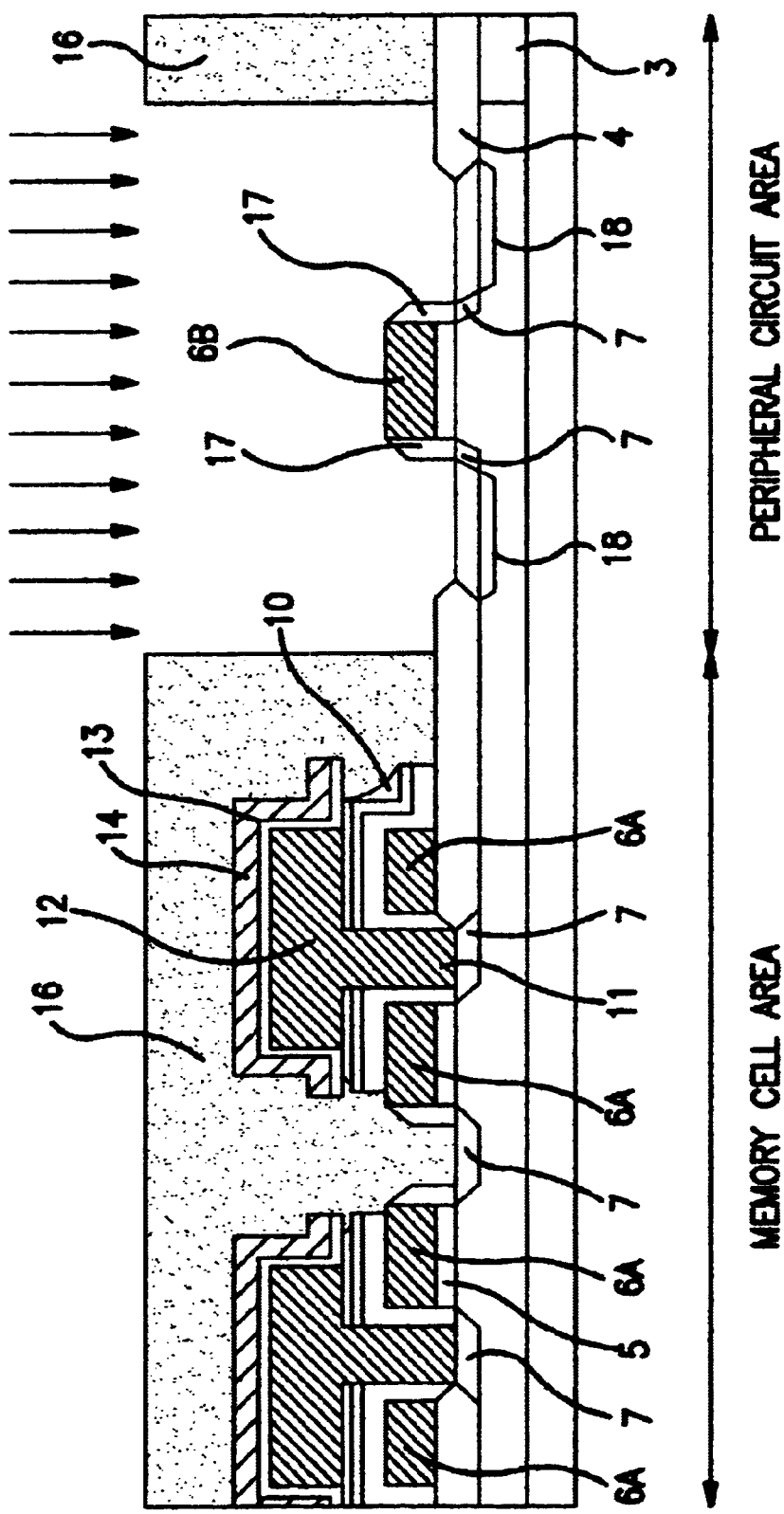

With reference to FIG. 3D, the used photo-resist 15 is removed before another photo-resist 16 is selectively formed on the memory cell array area except on the peripheral circuit area. By use of the photo-resist 16, the gate electrode 6B and the side wall oxide films 17 as masks, an ion-implantation of arsenic is carried out at a dose of $3\times10^{15}$ $cm^{-2}$ to form n$^+$-diffusion layers 18 in the p-well 2 in the peripheral circuit area. As a result, an n-channel MOS field effect transistor having a lightly doped drain structure has been fabricated in the p-well 2 in the peripheral circuit area. The used photo-resist 16 is then removed before still another photo-resist not shown is formed which extends over the memory cell area and over the n-channel MOS field effect transistor. By use of the photo-resist not shown, the gate electrode not shown and the side wall oxide films not shown as masks, an ion-implantation of BF2 is carried out at a dose of $3\times10^{15}$ $cm^{-2}$ to form p-diffusion layers not shown but in the n-well 3 in the peripheral circuit area. As a result, a p-channel MOS field effect transistor having a lightly doped drain structure has been fabricated in the n-well 3 in the peripheral circuit area.

Figure 3E:
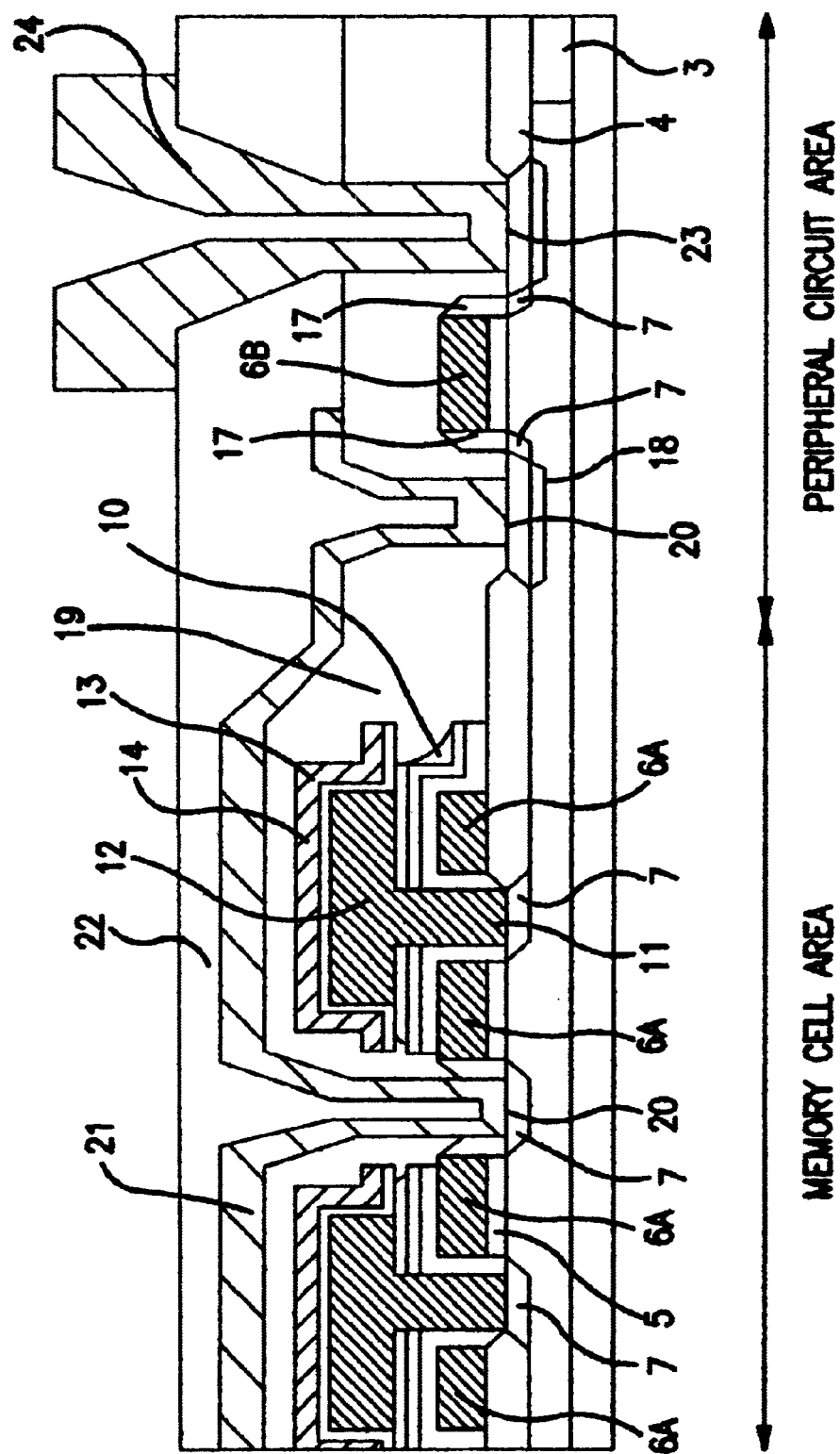

With reference to FIG. 3E, the used photo-resist not shown is removed. A second inter-layer insulator 19 is entirely deposited, which bury the stacked capacitors and the n-channel MOS field effect transistors in the memory cell array area as well as the n-channel and p-channel MOS field effect transistors in the peripheral circuit area. The surface of the second inter-layer insulator 19 is planarized and has a height of 800 nanometers from the surfaces of the n-well 2 and the p-well 3. The second inter-layer insulator 19 may comprise a silicon oxide film (HOT film) formed by a low pressure chemical vapor deposition method at a high temperature and a boro-phospho silicate glass film covering the silicon oxide film. The HTO film has been provided in order to ensure a step coverage of the second inter-layer insulator against the stacked capacitor opposite electrode 14 and the gate electrode as well as to prevent diffusions of phosphorus and boron from the boro-phospho silicate glass film into the impurity diffusion layers. Subsequently, by an anisotropic etching process using the fluoro-carbon system etching gas ($CHF_3$, and $CF_4$), the second inter-layer insulator 19 is then selectively etched to form bit line contacts 20 which are positioned over the n$^-$-type diffusion layers 7 not adjacent to the field oxide films 4 in the memory cell array area as well as over the n$^+$-diffusion layer 18 in the peripheral circuit area and adjacent to the boundary between the memory cell array area and the peripheral circuit area so that the n$^-$-type diffusion layers 7 and the n$^+$-diffusion layer 18 are shown through the bit line contacts 20. An n$^+$-type impurity doped polysilicon film is entirely deposited, which has a thickness of approximately 100 nanometers. A tungsten silicide film is then entirely deposited over the n$^+$-type impurity doped polysilicon film. The tungsten silicide film has a thickness of approximately 100 nanometers to thereby form a tungsten polyside film which serves as a bit line 21. The tungsten polyside bit line 21 extends over the second inter-layer insulator 19 and within the bit line contacts 20 so that the tungsten polyside bit line 21 is made into contact with the n$^-$-type diffusion layers 7 and the n$^+$-diffusion layer 18 shown through the bit line contacts 20. A third inter-layer insulator 22 is entirely deposited, which extends over the bit line 21 and the second inter-layer insulator 19. The second inter-layer insulator 19 and the third inter-layer insulator 22 are then selectively etched to form a contact hole 23 which is positioned over the n$^+$-diffusion layer 18 in the peripheral circuit area and closer to the n-well 3 so that the n$^+$-diffusion layer 18 in the peripheral circuit area and closer to the n-well 3 is shown through the contact hole 23. An aluminum film is entirely deposited, which extends over the second inter-layer insulator 19 and within the contact hole 23 so that the aluminum film is partially made into contact with the n$^+$-diffusion layer 18 in the peripheral circuit area and closer to the n-well 3. The aluminum film is patterned to form an aluminum interconnection 24 which extends within the contact hole 23 and over the n$^+$-diffusion layer 18 as well as over the second inter-layer insulator 19 but in the vicinity of the contact hole 23. As a result, the dynamic random access memory device having the stacked capacitor memory cell arrays has been fabricated.

In accordance with the above novel fabrication method, the inter-layer insulator between the stacked capacitors and the gate electrodes are planarized so that the extremely narrow apertures of the gate electrodes in the memory cell array area are buried with the first inter-layer insulator, for which reason the conductive film or the impurity doped polysilicon film to be formed into the stacked capacitor storage electrodes 12 is not deposited in the extremely narrow aperture between the gate electrodes. This makes it unnecessary to remove or etch any conductive films within the extremely narrow apertures defined between the gate electrodes in the memory cell array area. For this reason, the above novel fabrication method is free from the problem in difficulty to completely remove the conductive films within the extremely narrow apertures defined between the gate electrodes in the memory cell array area. Namely, there is no possibility in having the conductive films remain in the extremely narrow apertures defined between the gate electrodes in the memory cell array area nor possibility to cause a problem with short circuit due to the remaining conductive film within the extremely narrow apertures defined between the gate electrodes in the memory cell array an area.

Further, after the memory cells have been formed, the side wall oxide films of the gate electrode in the peripheral circuit area as well as the source/drain diffusion regions are formed in the peripheral circuit area. As a result, the source/drain regions in the peripheral circuit area are free from the influences of the heat treatments carried out to form the memory cell arrays. Also, the time of over-etching is reduced into not more than one fifth of that of the conventional method. The heat treatments have been carried out at a temperature in the range of 800° C. to 950° C. but the time of the heat treatment is largely reduced to 30 minutes from 120 minutes of the conventional method. It is therefore possible to prevent the short channel effect from being caused in the MOS field effect transistors in the peripheral circuit area. This makes it possible to prevent any reduction in threshold voltage of the MOS field effect transistors in the peripheral circuit area. This allows a channel length to be shorten of the MOS field effect transistors in the peripheral circuit area, thereby allowing the MOS field effect transistors to show high speed performances.

In accordance with the present invention, the side wall oxide films of the gate electrode of the lightly doped drain structure MOS field effect transistor comprises the first silicon oxide film. Further, the silicon nitride film is formed over the first silicon oxide film. Furthermore, the first inter-layer insulator is formed over the silicon nitride film. The first inter-layer insulator serves as an etching stopper against the following etching processes. After the stacked capacitor storage electrode contacts 12 have been formed to show the n$^{-1}$-type diffusion layers 7, then the wet etching process is carried out by use of hydrofluoric solution for removal of any spontaneous oxide film from the n$^-$-type diffusion layers 7. The first inter-layer insulator serves as an etching mask against this wet etching. The first inter-layer insulator serves as an etching mask against an anisotropic etching for patterning the stacked capacitor storage electrodes 12. The first inter-layer insulator serves as an etching mask against a wet etching for removal of any spontaneous oxide film from the surfaces of the stacked capacitor storage electrodes 12 before the stacked capacitor insulation film 13 is then formed. The first inter-layer insulator serves as an etching mask against an anisotropic etching for patterning the stacked capacitor opposite electrodes 12. While the surface of the first inter-layer insulator 10 is etched by each of the above etching processes, the first silicon oxide film to be formed into the side wall oxide films is not etched. This allows the side wall oxide films to be desirable defined. This means it possible to obtain any desired light doped drain structure of the MOS. field effect transistors in the peripheral circuit area.

A third embodiment according to the present invention will be described with reference to FIGS. 4A through 4E which are illustrative of a novel method of fabricating a dynamic random access memory device having stacked capacitor memory cell arrays under bit lines.

Figure 4A:
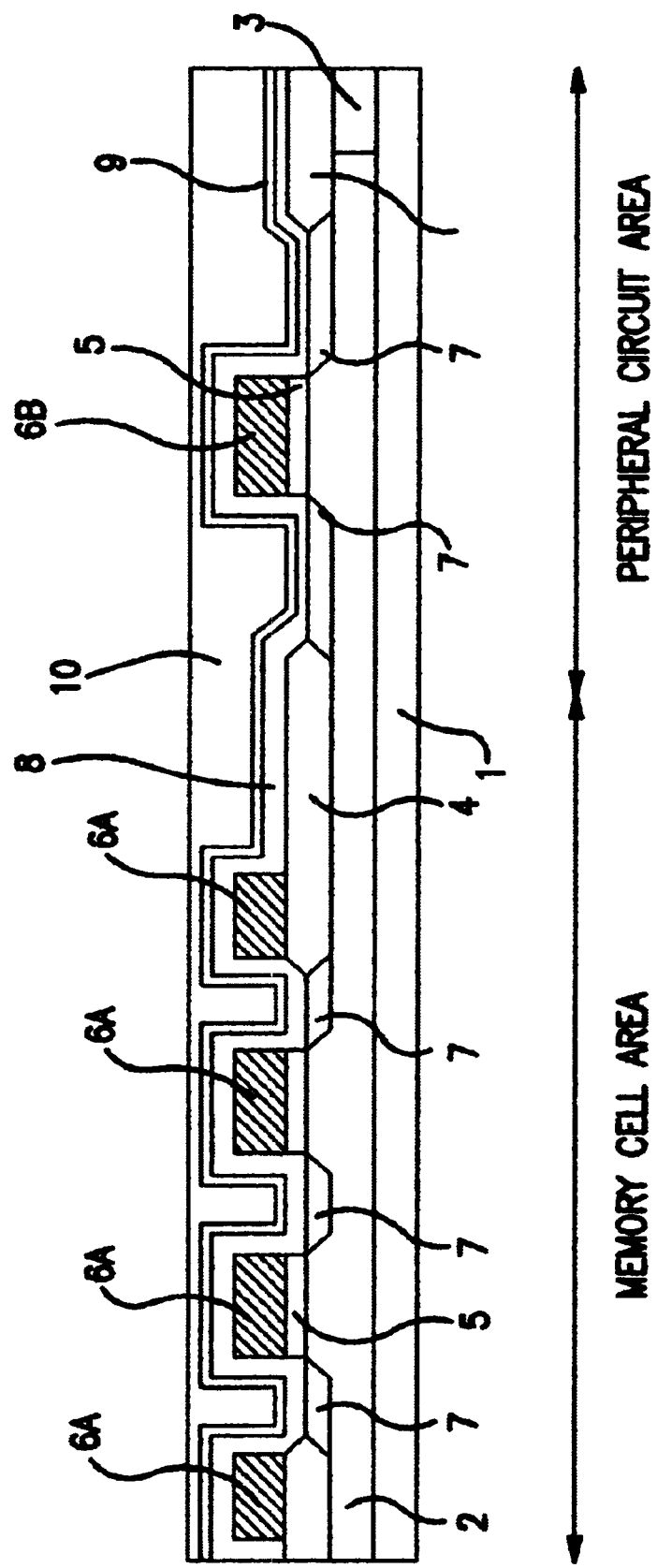
FIGS. 4A through 4E are fragmentary cross sectional elevation views illustrative of a novel method of fabricating a dynamic random access memory device having stacked capacitor memory cell arrays under bit lines in a third embodiment according to the present invention.

With reference to FIG. 4A, a p-well 2 and an n-well 3 are formed over p-type silicon substrate 1. Over the p-well 2 and the n-well 3, field oxide films 4 are selectively formed by a local oxidation of silicon method. A silicon nitride film not shown is entirely deposited, which extends over the n-well 2 and the p-well. A photo-resist film is then provided to selectively etch the silica nitride film so that the silicon nitride film remains only over active regions on which respective elements will be formed later. The used photo-resist film is then removed. Field oxide films 4 are selectively formed over the n-well and the p-well by use of a local oxidation of silicon method using the remaining silicon nitride film as a mask. The field oxide films 4 have a thickness of approximately 300 nanometers. The used silicon nitride film is then removed. An ion-implantation of impurity may optionally be carried out to control a threshold voltage. A gate oxide film 5 is then formed on the active region by a thermal oxidation of silicon method. The gate oxide film 5 has a thickness of approximately 10–12 nanometers. A phosphorus-doped polysilicon film is entirely deposited over the wafer so that the phosphorus-doped polysilicon film extends over the field oxide films 4 and the gate oxide film 5. The phosphorus-doped polysilicon film has a thickness of approximately 100 nanometers. Further, a tungsten silicide film not shown is subsequently and entirely deposited over the wafer so that the tungsten silicide film extends over the phosphorus-doped polysilicon film. The phosphorus-doped polysilicon film and the tungsten silicide film are then patterned to form gate electrodes 6A and 6B. By use of the gate electrodes 6A and 6B and the field oxide films 4 as masks, an ion-implantation of phosphorus is carried out at a dose of $2-10^{13}$ $cm^{-2}$ and an ion-implantation energy of 40 keV to form phosphorus doped regions. A heat treatment to the substrate is carried out to cause a phosphorus diffusion to thereby form $n^-$-type diffusion layers 7. The $n^-$-type diffusion layers 7 serve as source/drain diffusion regions of the MOS transistors. A first silicon oxide film 8 is then entirely deposited by a chemical vapor deposition method. The first silicon oxide film 8 extends over the field oxide films 4 the gate electrodes 6A and 6B and the $n^-$-type diffusion layers 7. The first silicon oxide film 8 is to serve as an inter-layer insulator between MOS transistors and stacked capacitors which will be formed later as well as serve as side wall oxide films to be formed at opposite sides of the gate electrode 6B in a peripheral circuit area. The first silicon oxide film 8 may comprise an HTO film. In this case, the HTO film may be formed by a low pressure chemical vapor deposition method which has been carried out at a temperature of approximately 800° C. by use of $SiH_4$ and $N_2O$ as source gases. The HTO film has a thickness of approximately 100 nanometers.

Further, a silicon nitride film 9 is entirely deposited over the wafer by a low pressure chemical vapor deposition method using dichlorosilane ($SiH_2Cl_2$) and ammonia ($NH_3$) as source gases. The silicon nitride film 9 has a thickness of approximately 50 nanometers. The silicon nitride film 9 extends over the first silicon oxide film 8. Furthermore, a boro-phospho silicate glass film is entirely deposited over the wafer by a low pressure chemical vapor deposition method using $Si(OC_2H_5)4$, $PH_3$, $B(OCH_3)_3$ and $O_2$ as source gases. The boro-phospho silicate glass film extends over the silicon nitride film 9. The boro-phospho silicate glass film has a thickness of approximately 300 nanometers. The boro-phospho silicate glass film is then reflowed at a temperature in the range of 750–900° C. for surface planarization thereof to thereby form a first inter-layer insulator 10.

Figure 4B:
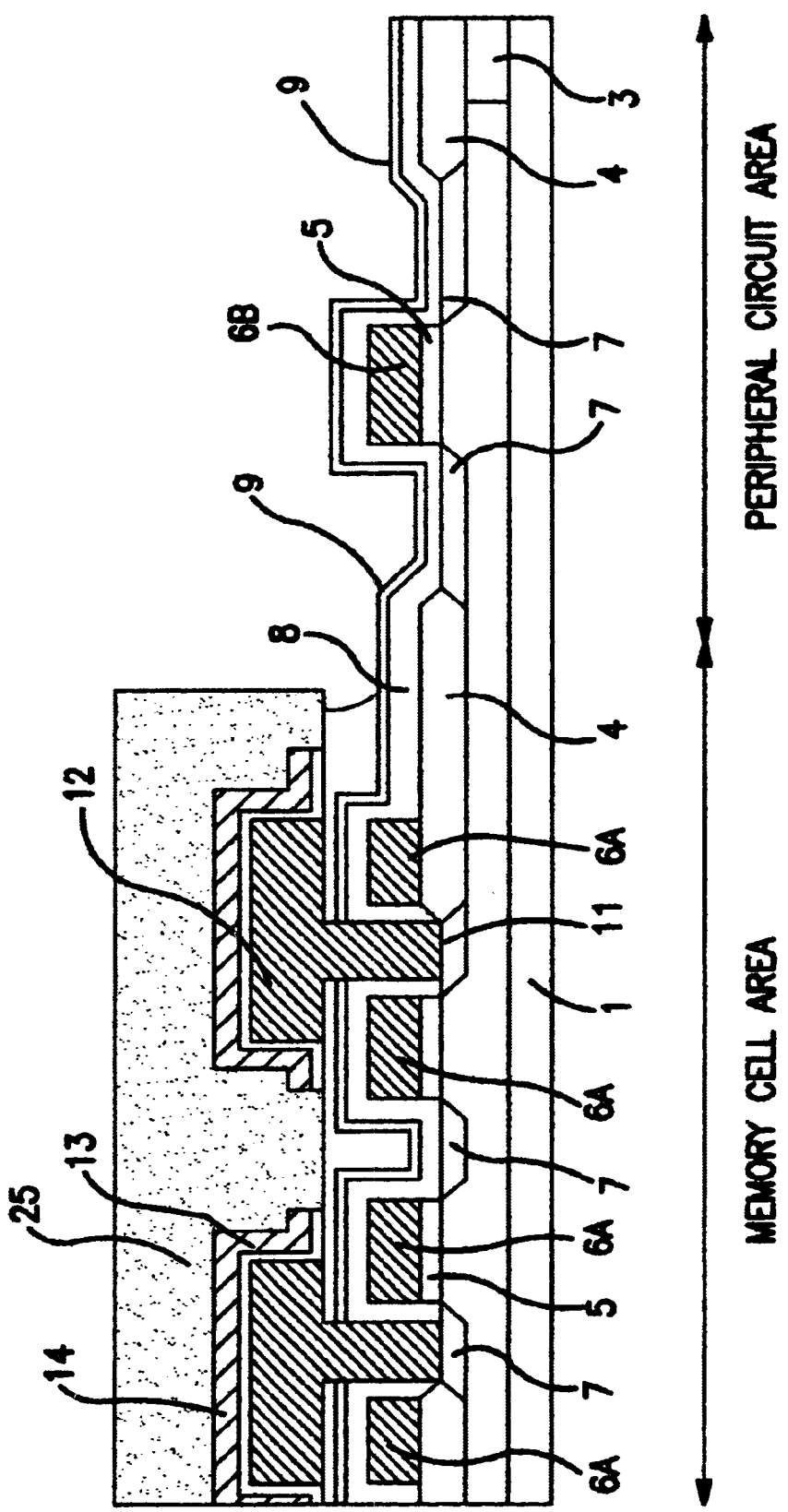

With reference to FIG. 4B, a photo-resist film is provided over the first inter-layer insulator 10. An anisotropic etching process is carried out by use of a fluoro-carbon system etching gas such as $CHF_3$ and $CF_4$ to selectively etch the silicon nitride film 9, the first inter-layer insulator 10 and the first silicon oxide film 8 so as to form stacked capacitor storage electrode contacts 11 over the $n^-$-type diffusion layers 7 adjacent to the field oxide films 4. An n-type impurity doped amorphous silicon film is entirely deposited over the wafer by a low pressure chemical vapor deposition method using $SiH_4$ and $PH_3$ as source gases so that the n-type impurity doped amorphous silicon film extends over the $n^-$-type diffusion layers 7 shown through the stacked capacitor storage electrode contacts 11 as well as over the first interlayer insulator 10. The n-type impurity doped amorphous silicon film has a thickness of approximately 800 nanometers. In place of the n-type impurity doped amorphous silicon film, it is possible to deposit a non-doped polysilicon film for subsequent ion-implantation of arsenic or phosphorus into the non-doped polysilicon film or a thermal diffusion of phosphorus into the non-doped polysilicon film so that the non-doped polysilicon film is made into an n-type impurity doped polysilicon film. The impurity concentration of the n-type impurity doped amorphous silicon film or the n-type impurity doped polysilicon film is approximately $1\times10^{20}$ $cm^{-2}$. A photo-resist film is there formed over the n-type impurity doped amorphous silicon film or the n-type impurity doped polysilicon film. By use of the photo-resist film as a mask, an anisotropic etching is carried out to selectively pattern the n-type impurity doped amorphous silicon film or the n-type impurity doped polysilicon film so as to form stacked capacitor storage electrodes 12. The stacked capacitor storage electrodes 12 extend within the stacked capacitor storage electrode contacts 11 and also extend over the first inter-layer insulator 10 in the vicinity of the stacked capacitor storage electrode contacts 11. A cleaning of surfaces of the stacked capacitor storage electrodes 12 is made and a spontaneous oxide film is removed from the surfaces of the stacked capacitor storage electrodes 12. A rapid thermal nitration is carried out at a temperature of approximately 870° C. for 60 seconds in an ammonium atmosphere to form a silicon nitride film not shown, which, however, extends over the surfaces of the stacked capacitor storage electrodes 12 and over the first inter-layer insulator 10. The silicon nitride film has a thickness of 0.5 nanometers. Another silicon nitride film not shown is further formed entirely over the above silicon nitride film by a low pressure chemical vapor deposition method. The other silicon nitride film has a thickness of 6 nanometers. The silicon nitride films are then subjected to a steam atmosphere at a temperature of 850° C. for 30 minutes for thermal oxidation of a surface of the silicon nitride film to thereby form a silicon oxide film on the silicon nitride film. The silicon oxide film has an approximated thickness of 5 nanometers. As a result, a stacked capacitor insulation film 13 is formed over the stacked capacitor storage electrodes 12 and over the first inter-layer insulator 10. An n-type impurity doped polysilicon film is entirely deposited over the wafer so that the n-type impurity doped polysilicon film extends over the stacked capacitor insulation film 13. The n-type impurity doped polysilicon film has a thickness of 150 nanometers. A photo-resist 15 is formed over the n-type impurity doped polysilicon film. By use of the photo-resist 15 as a mask, the stacked capacitor insulation films 13 and the n-type impurity doped polysilicon film are etched to form the stacked capacitor insulation films 13 and stacked capacitor opposite electrodes 14. The stacked capacitor insulation films 13 extend over the stacked capacitor storage electrodes 12 and parts of the first inter-layer insulator adjacent to the stacked capacitor storage electrodes 12. The stacked capacitor opposite electrodes 14 extend over the stacked capacitor insulation films 13. As a result, the stacked capacitor has been fabricated, which comprises the stacked capacitor storage electrode 12, the stacked capacitor insulation film 13 and the stacked capacitor opposite electrode 14.

The used photo-resist 15 is removed. A photo-resist film 25 is provided, which extends over the memory cell array area. By use of the photo-resist film 25 as a mask, the first inter-layer insulator 10 is selectively removed by a wet etching of a hydrofluoric solution so that the first inter-layer insulator 10 remains in the memory cell array area. As a result, the silicon nitride film is shown in the peripheral circuit area. If the hydrofluoric solution is used as an etchant for the wet etching process, then an etching rate of the boro-phospho silicate glass film serving as the first inter-layer insulator 10 to the silicon nitride film 9 is approximately 100. The silicon nitride film 9 serves as an etching stopper. In order, to remove the boro-phospho silicate glass film having a thickness of 300 nanometers, it is necessary to use the silicon nitride film having a thickness of 50 nanometers as the etching stopper, so that it is possible to suppress any etching of the field oxide films 4 and the first oxide film 8 whilst the first inter-layer insulator 10 is removed but only in the peripheral circuit area.

In place of the silicon nitride film 9, it is possible to form a silicon oxide film. In place of the wet etching by use of the hydrofluoric solution, it is possible to use a low pressure vapor phase etching by use of a hydrofluoric gas. In this case, for the silicon oxide film, an HTO is used, which has a thickness of 50 nanometers and has been formed by a low pressure chemical vapor deposition method. The low pressure vapor phase etching is carried out at a pressure of 600 Pa by use of hydrofluoric acid and carried out at a pressure of 300 Pa by use of a steam. ($H_2O$) at a temperature of 30° C. Under those conditions, the etching rate of the boro-phospho silicate glass film to the silicon oxide film is approximately 1000. This means that under those etching conditions, the silicon oxide film is available as the etching stopper. Therefore, it is possible to suppress etching of the field oxide film 4 and the first silicon oxide film 8, whilst the first inter-layer insulator is completely removed.

By use of the photo-resist 25 as a mask, the silicon nitride film 9 and the first silicon oxide film 8 are sequentially subjected to etch-back to thereby form side wall oxide films 17 which comprise the remaining parts of the first silicon oxide film 8. The etch back process is a reactive ion etching which has been carried out at a power of 250 W and a pressure of 700 mTorr by use of argon gas as a carrier gas and $CHF_3$ gas and $CF_4$ gas as etching gases, wherein gas flow rates are $CHF_3$ :$CF_4$:Ar=40 sccm; 40 sccm; 800 sccm The silicon nitride film 9 remains at the opposite sides of the gate electrode 6B in the peripheral circuit area. The silicon nitride film 9 is however, not in contact with the silicon substrate 1. The silicon nitride film 9 is separated by the first silicon oxide film 8 from the silicon substrate 1. There is no possibility of increase in junction leakage current by the silicon nitride film 9. Even in order to remove the silicon nitride film 9 from the side wall oxide films, it is possible to remove the silicon nitride film by a wet etching process using a thermal phosphorus acid and by use of the stacked capacitor opposite electrode as a mask for subsequent etch back process of the first silicon oxide film 8 so as to completely remove the silicon nitride film 9.

Figure 4C:
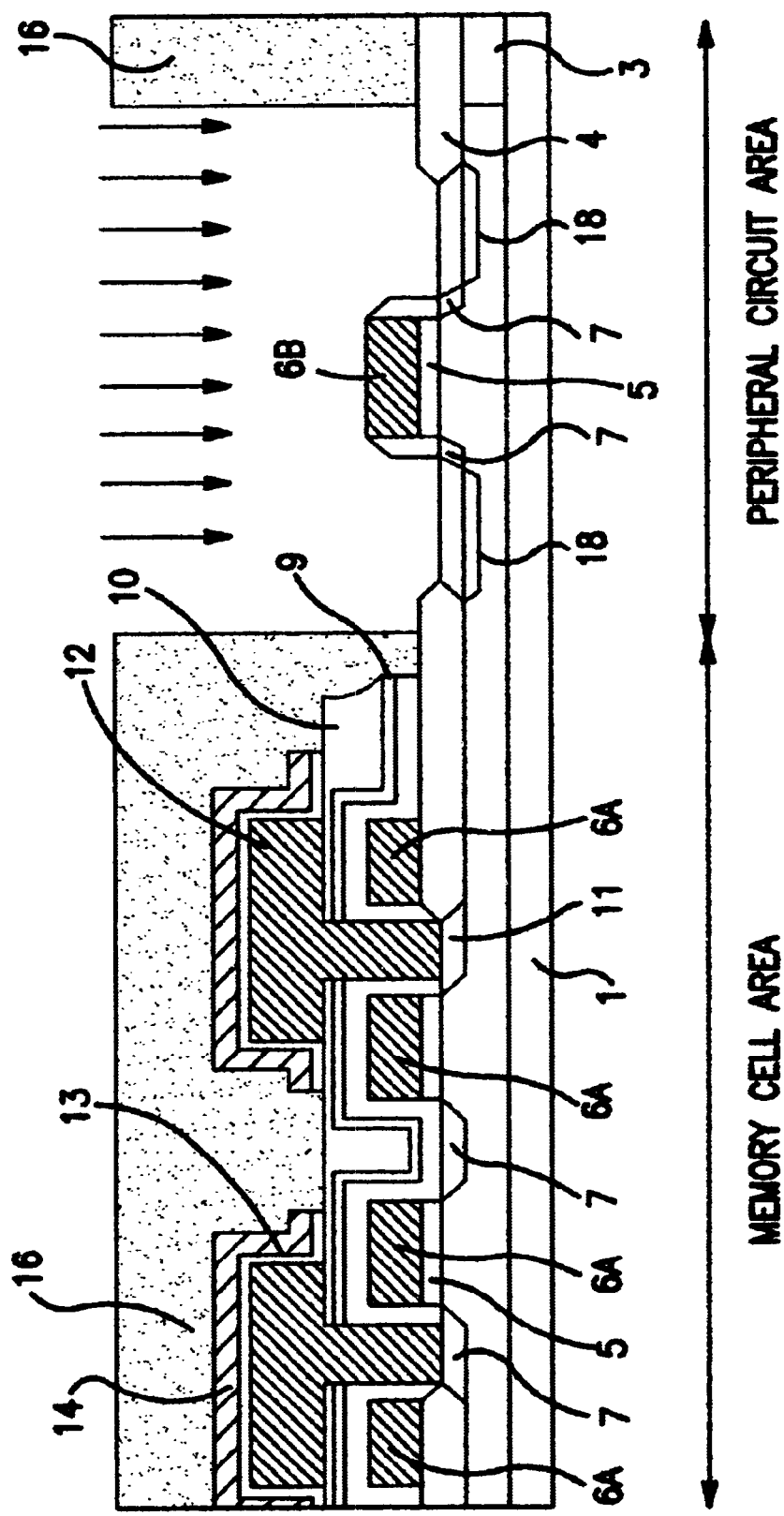

With reference to FIG. 4C, the used photo-resist 25 is removed before another photo-resist 16 is selectively formed on the memory cell array area except on the peripheral circuit area. By use of the photo-resist 16, the gate electrode 6B and the side wall oxide films 17 as masks, an ion-implantation of arsenic is carried out at a dose of $3 \times 10^{15}$ $cm^{-2}$ to form $n^+$-diffusion layers 18 in the p-well 2 in the peripheral circuit area. As a result, an n-channel MOS field effect transistor having a lightly doped drain structure has been fabricated in the p-well 2 in the peripheral circuit area. The used photo-resist 16 is then removed before still another photo-resist not shown is formed which extends over the memory cell area and over the n-channel MOS field effect transistor. By use of the photo-resist not shown, the gate electrode not shown and the side wall oxide films not shown as masks, an ion-implantation of $BF_2$ is carried out at a dose of $3 \times 10^{15}$ $cm^{-2}$ to form p-diffusion layers not shown but in the n-well 3 in the peripheral circuit area. As a result, a p-channel MOS field effect transistor having a lightly doped drain structure has been fabricated in the n-well 3 in the peripheral circuit area.

Figure 4D:
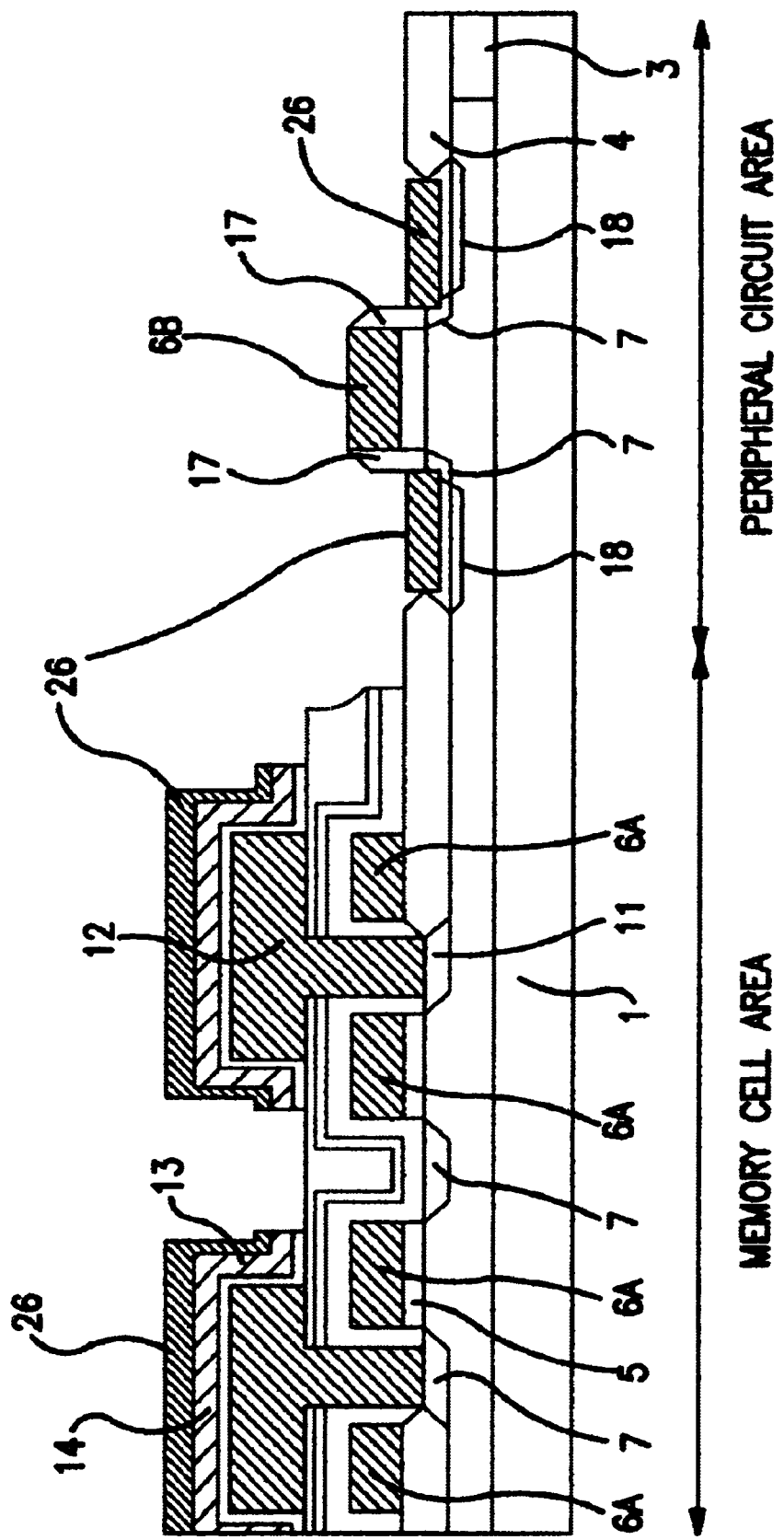

With reference to FIG. 4D, the used photo-resist not shown is removed. A titanium film is entirely deposited by sputtering titanium. A rapid thermal annealing or a lump anneal is carried out at a temperature in the range of 800–900° C. in the nitrogen atmosphere for ten seconds to cause a silicidation reaction of titanium and silicon whereby surfaces of the $n^+$-type and $p^+$-type impurity doped silicon regions both in the memory cell array area and in the peripheral circuit area are made into titanium silicide layers 26. Namely, the titanium silicide layers 26 are formed over the stacked capacitor opposite electrodes 14 in the memory cell array area as well as over the source/drain diffusion regions and the gate electrodes in the peripheral circuit area. No silicidation reaction is caused over the layers, for example, the field oxide films 4 and the first inter-layer insulator, except for silicon layers. The unreacted titanium layers may be removed by a wet etching process using hydrofluoric add solution.

Figure 4E:
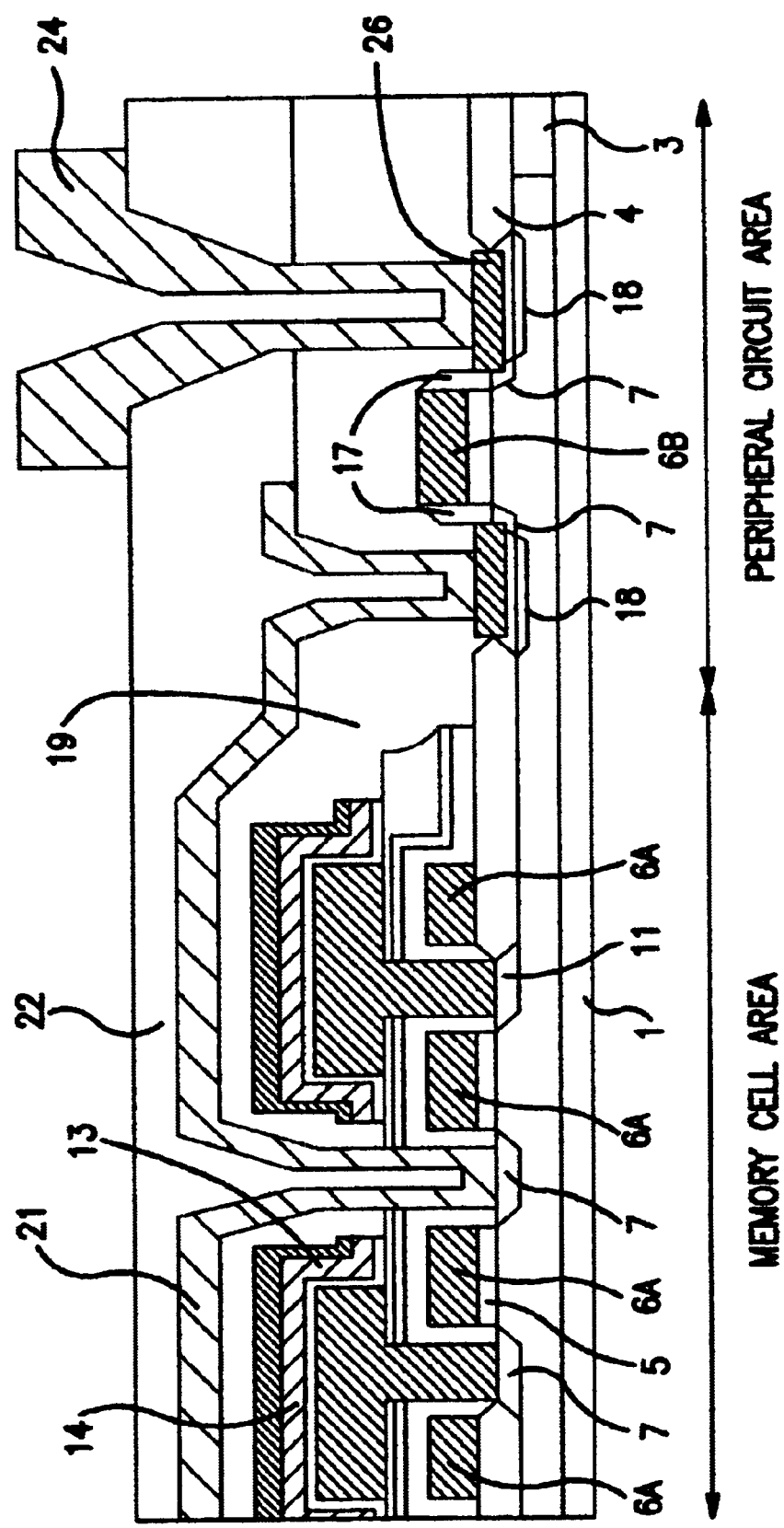

With reference to FIG. 4E, a second inter-layer insulator 19 is entirely deposited, which bury the stacked capacitors and the n-channel MOS field effect transistors in the memory cell array area as well as the n-channel and p-channel MOS field effect transistors in the peripheral circuit area. The surface of the second inter-layer insulator 19 is planarized and has a height of 800 nanometers from the surfaces of the n-well 2 and the p-well 3. The second inter-layer insulator 19 may comprise a silicon oxide film formed by an atmospheric pressure chemical vapor deposition method at a temperature of 500° C. and a boro-phospho silicate glass film covering the silicon oxide film. The silicon oxide film has been provided in order to prevent diffusions of phosphorus and boron from the boro-phospho silicate glass film into the impurity diffusion layers. In order to planarize the second inter-layer insulator, a rapid thermal anneal or a lamp anneal to the boro-phospho silicate glass film is carried out at a temperature of 800° C. for a short time of ten seconds. Subsequently, the surface of the boro-phospho silicate glass film is then subjected to a chemical and mechanical polishing for planarization. The above planarization processes have been made in order to shorten the time of the heat treatment so as to prevent as much as possible the titanium silicide film from receipt of any influence of the heat treatment.

Alternatively, the planarization process may be carried out as follows. A rapid thermal anneal or a lamp anneal to the boro-phospho silicate glass film, is carried out for subsequent spin coating method to form an applicable insulation film such as a silica film. A furnace anneal is carried out at a temperature of approximately 500° C. for 60 minutes. Further, an etch back process is carried out by an anisotropic etching for planarization process. The above planarization processes have also been made in order to shorten the time of the heat treatment so as to prevent as much as possible the titanium silicide film from receipt of any influence of the heat treatment.

Subsequently, by an anisotropic etching process using the fluoro-carbon system etching gas ($CHF_3$, and $CF_4$), the second inter-layer insulator 19 is then selectively etched to form bit line contacts 20 which are positioned over the n-type diffusion layers 7 not adjacent to the field oxide films 4 in the memory cell array area as well as over the $n^+$-diffusion layer 18 in the peripheral circuit area and adjacent to the boundary between the memory cell array area and the peripheral circuit area so that the $n^-$-type diffusion layers 7 and the $n^+$-diffusion layer 18 are shown through the bit line contacts 20. An $n^+$-type impurity doped polysilicon film is entirely deposited, which has a thickness of approximately 100 nanometers. A tungsten silicide film is then entirely deposited over the $n^+$-type impurity doped polysilicon film. The tungsten silicide film has a thickness of approximately 100 nanometers to thereby form a tungsten polyside film which serves as a bit line 21. The tungsten polyside bit line 21 extends over the second inter-layer insulator 19 and within the bit line contacts 20 so that the tungsten polyside bit line 21 is made into contact with the $n^-$-type diffusion layers 7 and the $n^+$-diffusion layer 18 shown through the bit line contacts 20. A third inter-layer insulator 22 is entirely deposited, which extends over the bit line 21 and the second inter-layer insulator 19. The second inter-layer insulator 19 and the third inter-layer insulator 22 are then selectively etched to form a contact hole 23 which is positioned over the $n^+$-diffusion layer 18 in the peripheral circuit area and closer to the n-well 3 so that the $n^+$-diffusion layer 18 in the peripheral circuit arcs and closer to the n-well 3 is shown through the contact hole 23. An aluminum film is entirely deposited, which extends over the second inter-layer insulator 19 and within the contact hole 23 so that the aluminum film is partially made into contact with the $n^+$-diffusion layer 18 in the peripheral circuit area and closer to the n-well 3. The aluminum film is patterned to form an aluminum interconnection 24 which extends within the contact hole 23 and over the $n^+$-diffusion layer 18 as well as over the second inter-layer insulator 19 but in the vicinity of the contact hole 23. As a result, the dynamic random access memory device having the stacked capacitor memory cell arrays has been fabricated.

In accordance with the above novel fabrication method, since the titanium silicide layers are formed in the upper regions of the source/drain diffusion layers in the peripheral circuit area in order to reduce by 2–3% the parasitic resistance of the MOS field effect transistors in the peripheral circuit area. This allows the MOS field effect transistors in the peripheral circuit area to show high speed performances.

Further, the inter-layer insulator between the stacked capacitors and the gate electrodes are planarized so that the extremely narrow apertures of the gate electrodes in the memory cell array area are buried with the first inter-layer insulator, for which reason the conductive film or the impurity doped polysilicon film to be formed into the stacked capacitor storage electrodes 12 is not deposited in the extremely narrow aperture between the gate electrodes. This makes it unnecessary to remove or etch any conductive films within the extremely narrow apertures defined between the gate electrodes in the memory cell array area. For this reason, the above novel fabrication method is free from the problem in difficulty to completely remove the conductive films within the extremely narrow apertures defined between the gate electrodes in the memory cell array area. Namely, there is no possibility in having the conductive films remain in the extremely narrow apertures defined between the gate electrodes in the memory cell array area nor possibility to cause a problem with short circuit due to the remaining conductive film within the extremely narrow apertures defined between the gate electrodes in the memory cell array area.

Furthermore, after the memory cells have bean formed, the side wall oxide films of the gate electrode in the peripheral circuit area as well as the source/drain diffusion regions are formed in the peripheral circuit area. As a result, the source/drain regions in the peripheral circuit area are free from the influences of the heat treatments carried out to form the memory cell arrays. Also, the time of over-etching is reduced into not more than one fifth of that of the conventional method. The heat treatments have been carried out at a temperature in the range of 800° C. to 950° C., but the time of the heat treatment is largely reduced to 30 minutes from 120 minutes of the conventional method. It is therefore possible to prevent the short channel effect from being caused in the MOS field effect transistors in the peripheral circuit area. This makes it possible to prevent any reduction in threshold voltage of the MOS field effect transistors in the peripheral circuit area. This allows a channel length to be shorten of the MOS field effect transistors in the peripheral circuit area, thereby allowing the MOS field effect transistors to show high speed performances.

In accordance with the present invention, the side wall oxide films of the gate electrode of the lightly doped drain structure MOD field effect transistor comprises the first silicon oxide film. Further, the silicon nitride film is formed over the first silicon oxide film. Furthermore, the first inter-layer insulator is formed over the silicon nitride film. The first inter-layer insulator serves as an etching stopper against the following etching processes. After the stacked capacitor storage electrode contacts 12 have been formed to show the $n^-$-type diffusion layers 7, then the wet etching process is carried out by use of hydrofluoric solution for removal of any spontaneous oxide film from the $n^-$-type diffusion layers 7. The first inter-layer insulator serves as an etching mask against this wet etching. The first inter-layer insulator serves as an etching mask against an anisotropic etching for patterning the stacked capacitor storage electrodes 12. The first inter-layer insulator serves as an etching mask against a wet etching for removal of any spontaneous oxide film from the surfaces of the stacked capacitor storage electrodes 12 before the stacked capacitor insulation film 13 is then formed. The first inter-layer insulator serves as an etching mask against an anisotropic etching for patterning the stacked capacitor opposite electrodes 12. While the surface of the first inter-layer insulator 10 is etched by each of the above etching processes the first silicon oxide film to be formed into the side wall oxide films is not etched. This allows the side wall oxide films to be desirable defined. This means it possible to obtain any desired light doped drain structure of the MOS field effect transistors in the peripheral circuit area.

A fourth embodiment according to the present invention will be described with reference to FIGS. 5A through 5E which are illustrative of a novel method of fabricating a dynamic random access memory device having stacked capacitor memory cell arrays over bit lines.

Figure 5A:
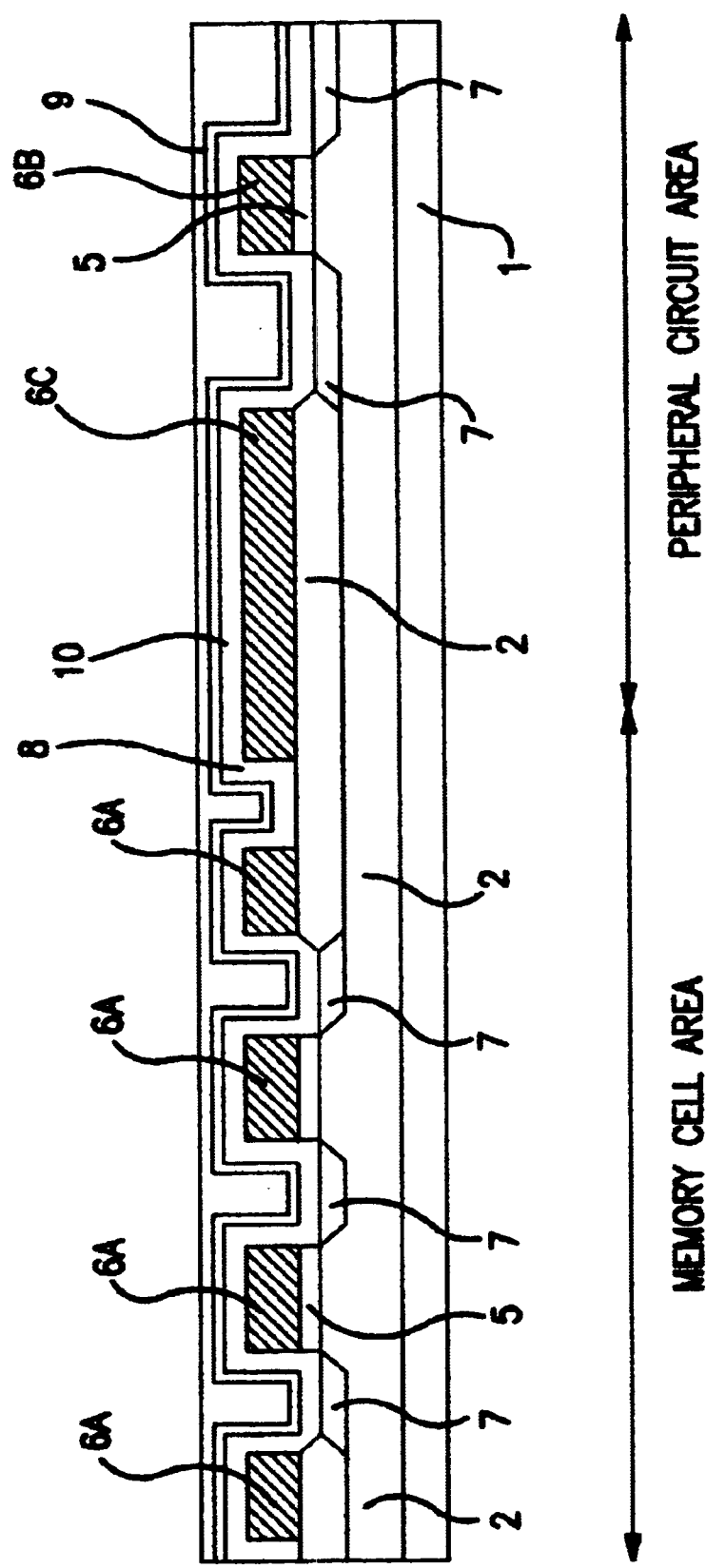
FIGS. 5A through 5E are fragmentary cross sectional elevation views illustrative of a novel method of fabricating a dynamic random access memory device having stacked capacitor memory cell arrays over bit lines in a fourth embodiment according to the present invention.

With reference to FIG. 5A, a p-well 2 and an n-well 3 are formed over a p-type silicon substrate 1. Over the p-well 2 and the n-well 3, field oxide films 4 are selectively formed by a local oxidation of silicon method. A silicon nitride film not shown is entirely deposited, which extends over the n-well 2 and the p-well. A photo-resist film is then provided to selectively etch the silicon nitride film so that the silicon nitride film remains only over active regions on which respective elements will be formed later. The used photo-resist film is them removed. Field oxide films 4 are selectively formed over the n-well and the p-well by use of a local oxidation of silicon method using the remaining silicon nitride film as a mask. The field oxide films 4 have a thickness of approximately 300 nanometers. The used silicon nitride film is then removed An ion-implantation of impurity may optionally be carried out to control a threshold voltage. A gate oxide film 5 is then formed on the active region by a thermal oxidation of silicon method. The gate oxide film 5 has a thickness of approximately 10–12 nanometers. A phosphorus-doped polysilicon film is entirely deposited over the wafer so that the phosphorus-doped polysilicon film extends over the field oxide films 4 and the gate oxide film 5. The phosphorus-doped polysilicon film has a thickness of approximately 100 nanometers. Further, a tungsten silicide film not shown is subsequently and entirely deposited over the wafer so that the tungsten silicide film extends over the phosphorus-doped polysilicon film. The phosphorus-doped polysilicon film and the tungsten silicide film are then patterned to form gate electrodes 6A and 6B and an interconnection 6C. The interconnection 6C extends over the memory cell array area and the peripheral circuit area so as to connect a bit line to be formed later in the memory cell array area into an aluminum interconnection to be formed later in the peripheral circuit area. A photo-resist not shown is provided which covers the n-well 3. By use of the photo-resist as masks, an ion-implantation of phosphorus is carried out at a dose of $2 \times 10^{13}$ cm$^{-2}$ and an ion-implantation energy of 40 keV to form phosphorus doped regions. A beat treatment to the substrate is carried out to cause a phosphorus diffusion to thereby foam n$^-$-type diffusion layers 7. The n$^-$-type diffusion layers 7 serve as source/drain diffusion regions of the MOS transistors. A first silicon oxide film 8 is then entirely deposited by a chemical vapor deposition method. The first silicon oxide film 8 extends over the field oxide films 4, the gate electrodes 6A and 6B and the n$^-$-type diffusion layers 7. The first silicon oxide film 8 is to serve as an inter-layer insulator between MOS transistors and stacked capacitors which will be formed later as well as serve as side wall oxide films to be foamed at opposite sides of the gate electrode 6B in a peripheral circuit area. The first silicon oxide film 8 may comprise an HTO film. In this case, the. HTO film may be formed by a low pressure chemical vapor deposition method which has been carried out at a temperature of approximately 800° C. by use of SiH$_4$ and N$_2$O as source gases. The HTO film has a thickness of approximately 100 nanometers.

Further, a silicon nitride film 9 is entirely deposited over the wafer by a low pressure chemical vapor deposition method using dichlorosilane (SiH$_2$Cl$_2$) and ammonia (NH$_3$) as source gases. The silicon nitride film 9 has a thickness of approximately 50 nanometers. The silicon nitride film 9 extends over the first silicon oxide film 8. Furthermore, a boro-phospho silicate glass film is entirely deposited over the wafer by a low pressure chemical vapor deposition method using Si(OC$_2$H$_5$)$_4$, PH$_3$, B(OCH$_3$)$_3$ and O$_2$ as source gases. The boro-phospho silicate glass film extends over the silicon nitride film 9. The boro-phospho silicate glass film has a thickness of approximately 300 nanometers. The boro-phospho silicate glass film is then reflowed at a temperature in the range of 750–900° C. for surface planarization thereof to thereby form a first inter-layer insulator 10.

Figure 5B:
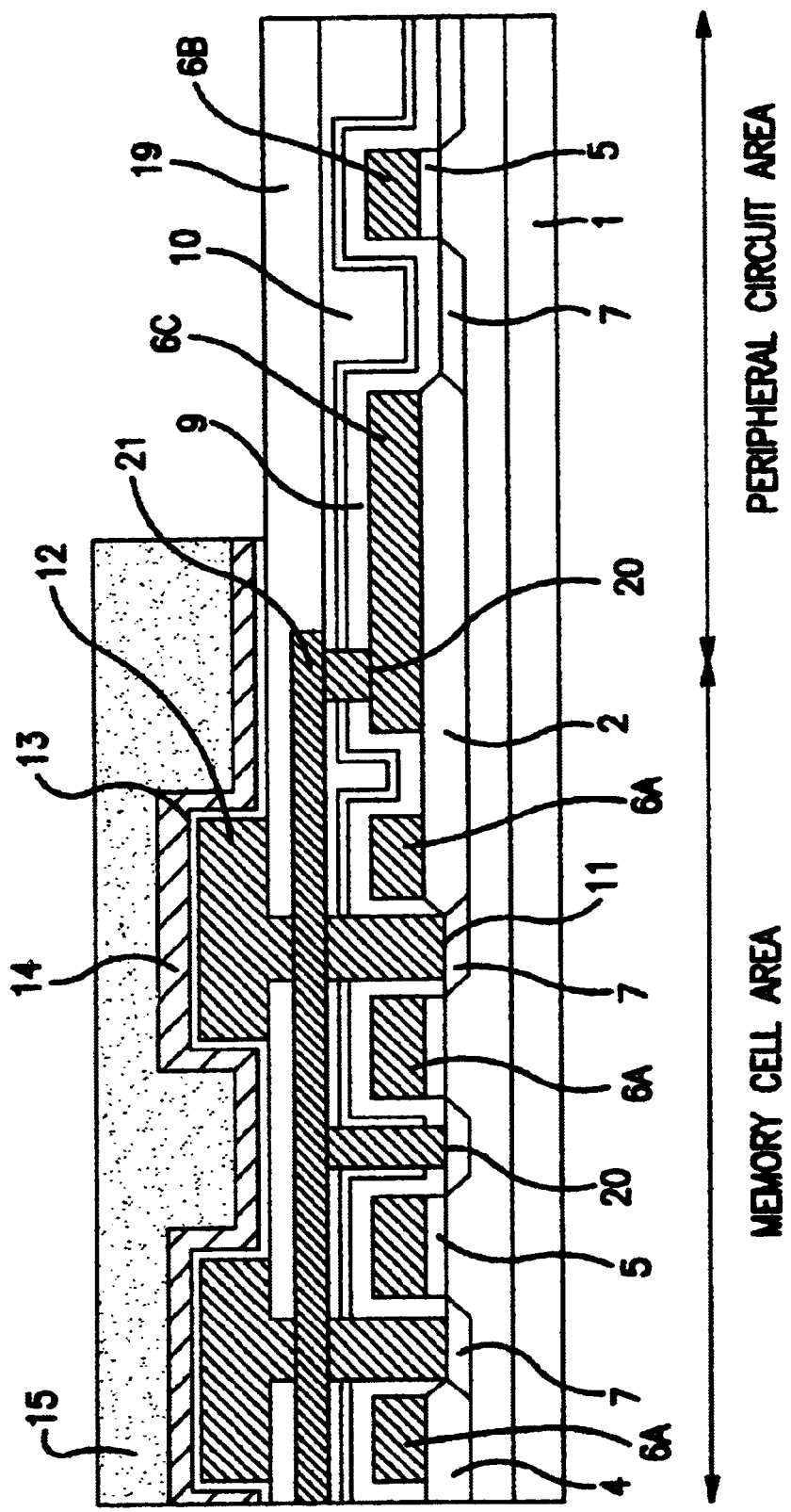

With reference to FIG. 5B, a photo-resist film is provided over the first inter-layer insulator 10. An anisotropic etching process is carried out by use of a fluoro-carbon system etching gas such as CHF$_3$ and CF$_4$ to selectively etch the silicon nitride film 9, the first inter-layer insulator 10 and the first silicon oxide film 8 so as to form bit line contacts 20 which show the n$^-$-type diffusion layers 7 not adjacent to the field oxide films 4 and also show a part of the interconnection 6C. An n$^+$-type impurity doped polysilicon film is entirely deposited, which has a thickness of approximately 100 nanometers. A tungsten silicide film is then entirely deposited over the n$^+$-type impurity doped polysilicon film. The tungsten silicide film has a thickness of approximately 100 nanometers to thereby form a tungsten polyside film which serves as a bit line 21. The tungsten polyside bit line 21 extends over the second inter-layer insulator 19 and within the bit line contacts 20 so that the tungsten polyside bit line 21 is made into contact with the n$^-$-type diffusion layers 7 and the n$^+$-diffusion layer 18 shown through the bit line contacts 20. A second inter-layer insulator 19 is entirely deposited, which bury the stacked capacitors and the n-channel MOS field effect transistors in the memory cell array area as well as the n-channel and p-channel MSO field effect transistors in the peripheral circuit area. The surface of the second inter-layer insulator 19 is planarized and has a height of 800 nanometers from the surfaces of the n-well 2 and the p-well 3. The second inter-layer insulator 19 may comprise a boro-phospho silicate glass film having a thickness of 400 nanometers. A photo-resist film is provided before an anisotropic etching process is carried out by use of a fluoro-carbon system etching gas such as CHF$_3$ and CF$_4$ to selectively etch the silicon nitride film 9, the first inter-layer insulator 10 and the first silicon oxide film 8 so as to form stacked capacitor storage electrode contacts 11 over the n$^-$-type diffusion layers 7 adjacent to the field oxide films 4. After the photo-resist film has been removed, an n-type impurity doped amorphous silicon film is entirely deposited over the wafer by a low pressure chemical vapor deposition method using SiH$_4$ and PH$_3$ as source gases so that the n-type impurity doped amorphos silicon film extends over the n$^-$-type diffusion layers 7 shown through the stacked capacitor storage electrode contacts 11 as well as over the first inter-layer insulator 10. The n-type impurity doped amorphous silicon film has a thickness of approximately 800 nanometers and an impurity concentration of approximately $1\times10^{20}$ cm$^{-3}$. In place of the n-type impurity doped amorphous silicon film, it is possible to deposit a non-doped polysilicon film for subsequent ion-implantation of arsenic or phosphorus into the non-doped polysilicon film or a thermal diffusion of phosphorus into the non-doped polysilicon film so that the non-doped polysilicon film is made into an n-type impurity doped polysilicon film. The impurity concentration of the n-type impurity doped amorphous silicon film or the n-type impurity doped polysilicon film is approximately $1\times10^{20}$ cm$^{-2}$. A photo-resist film is then formed over the n-type impurity doped amorphous silicon film or the n-type impurity doped polysilicon film. By use of the photo-resist film as a mask, an anisotropic etching is carried out to selectively pattern the n-type impurity doped amorphous silicon film or the n-type impurity doped polysilicon film so as to form stacked capacitor storage electrodes 12. The stacked capacitor storage electrodes 12 extend within the stacked capacitor storage electrode contacts 11 and also extend over the first inter-layer insulator 10 in the vicinity of the stacked capacitor storage electrode contacts 11. A cleaning of surfaces of the stacked capacitor storage electrodes 12 is made and a spontaneous oxide film is removed from the surfaces of the stacked capacitor storage electrodes 12. A rapid thermal nitration is carried out at a temperature of approximately 870° C. for 60 seconds in an ammonium atmosphere to form a silicon nitride film not shown, which, however, extends over the surfaces of the stacked capacitor storage electrodes 12 and over the first inter-layer insulator 10. The silicon nitride film has a thickness of 0.5 nanometers. Another silicon nitride film not shown is further formed entirely over the above silicon nitride film by a low pressure chemical vapor deposition method. The other silicon nitride film has a thickness of 6 nanometers. The silicon nitride films are then subjected to a steam atmosphere at a temperature of 850° C. for 30 minutes for thermal oxidation of a surface of the silicon nitride film to thereby form a silicon oxide film on the silicon nitride film. The silicon oxide film has an approximated thickness of 5 nanometers. As a result, a stacked capacitor insulation film 13 is formed over the stacked capacitor storage electrodes 12 and over the first inter-layer insulator 10. An n-type impurity doped polysilicon film is entirely deposited over the wafer so that the n-type impurity doped polysilicon film extends over the stacked capacitor insulation film 13. The n-type impurity doped polysilicon film has a thickness of 150 nanometers. A photo-resist 15 is formed over the n-type impurity doped polysilicon film. By use of the photo-resist 15 as a mask, the stacked capacitor insulation films 13 and the n-type impurity doped polysilicon film are etched to form the stacked capacitor insulation films 13 and stacked capacitor opposite electrodes 14. The stacked capacitor insulation films 13 extend over the stacked capacitor storage electrodes 12 and parts of the first inter-layer insulator adjacent to the stacked capacitor storage electrodes 12. The stacked capacitor opposite electrodes 14 extend over the stacked capacitor insulation films 13. As a result, the stacked capacitor has been fabricated, which comprises the stacked capacitor storage electrode 12, the stacked capacitor insulation film 13 and the stacked capacitor opposite electrode 14.

Figure 5C:
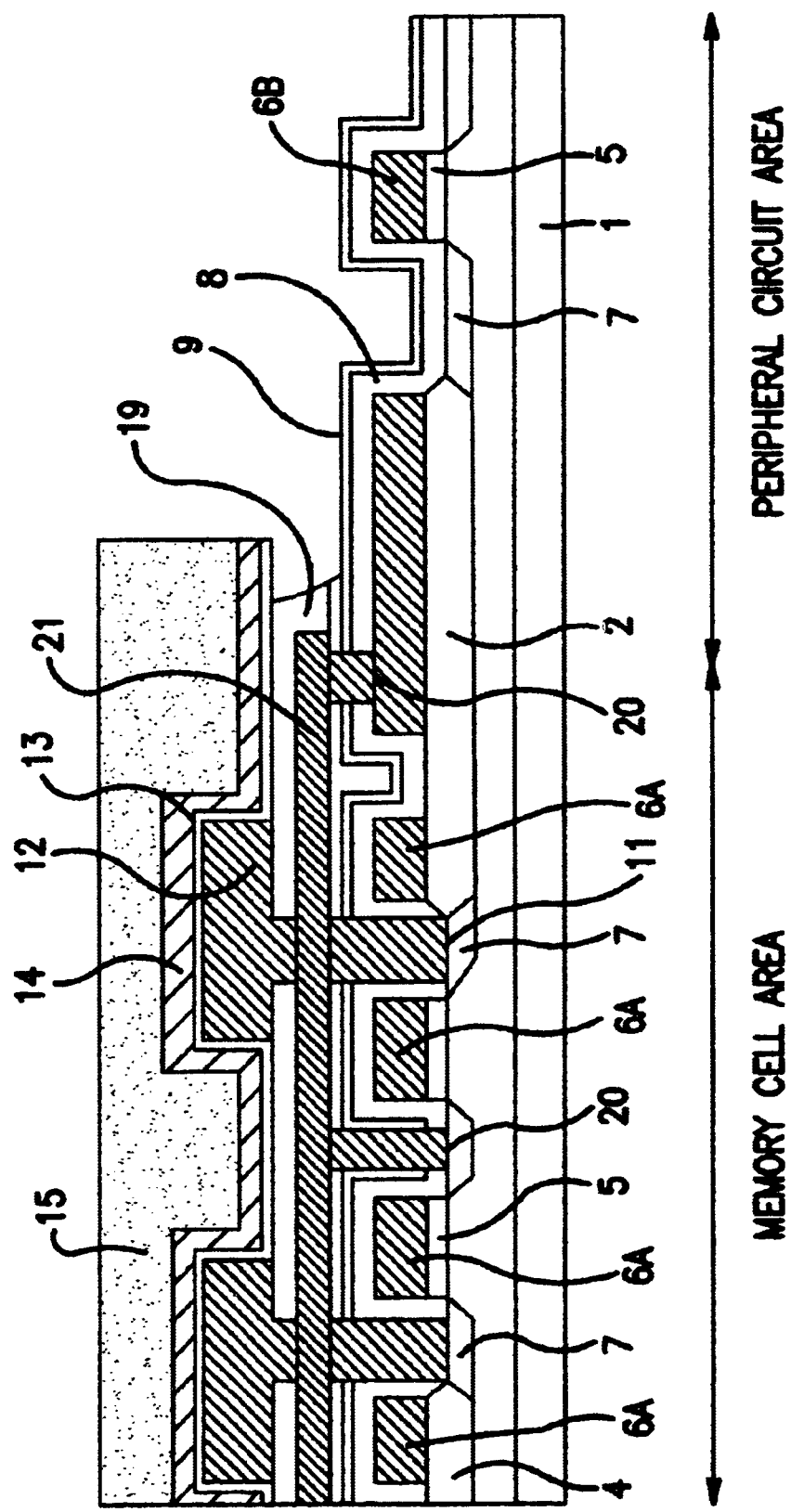
Figure 5D:
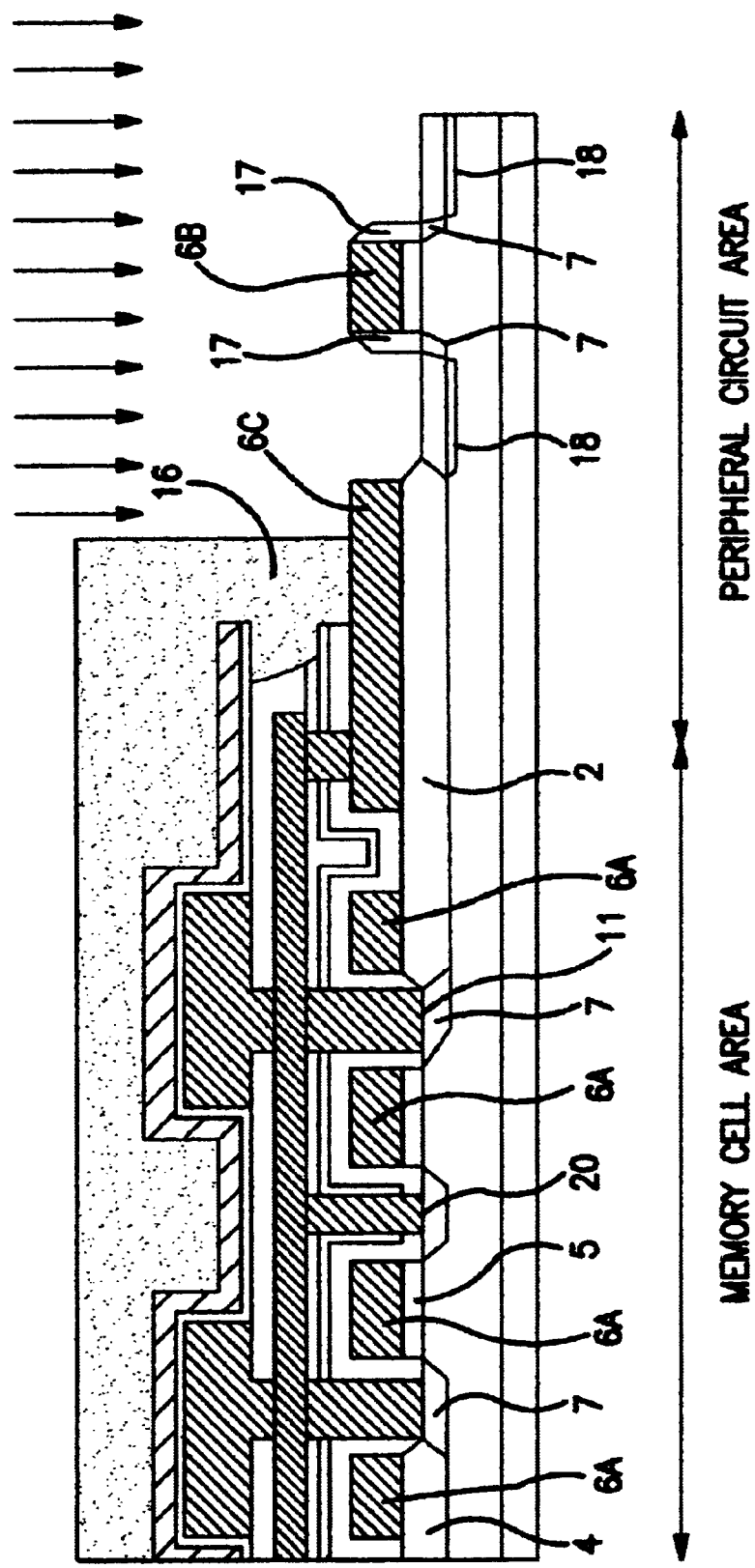

With reference to FIG. 5C, a photo-resist film 15 is provided, which extends over the memory cell array area. By use of the photo-resist film 15 as a mask, the first inter-layer insulator 10 and the second inter-layer insulator 19 are selectively removed by a wet etching of a hydrofluoric acid solution so that the first and second inter-layer insulators 10 and 19 remain in the memory cell array area. As a result, the silicon nitride film 9 is shown in the peripheral circuit area. If the hydrofluoric solution is used as an etchant for the wet etching process, then an etching rate of the boro-phospho silicate glass film serving as the first inter-layer insulator 10 to the silicon nitride film 9 is approximately 100. The silicon nitride film 9 serves as an etching stopper. In order to remove the boro-phospho silicate glass film having a thickness of 600 nanometers, it is necessary to use the silicon nitride film having a thickness of 50 nanometers as the etching stopper, so that it is possible to suppress any etching of the field oxide films 4 and the first oxide film 8 whilst the first inter-layer insulator 10 is removed but only in the peripheral circuit area.

In place of the silicon nitride film 9, it is possible to form a silicon oxide film. In place of the wet etching by use of the hydrofluoric solution, it is possible to use a low pressure vapor phase etching by use of a hydrofluoric gas. In this case, for the silicon oxide film, an HTO is used, which has a thickness of 50 nanometers and has been formed by a low pressure chemical vapor deposition method. The low pressure vapor phase etching is carried out at a pressure of 600 Pa by use of hydrofluoric acid and carried out at a pressure of 300 Pa by use of a steam ($H_2O$) at a temperature of 30° C. Under those conditions, the etching rate of the boro-phospho silicate glass film to the silicon oxide film is approximately 1000. This means that under those etching conditions, the silicon oxide film is available as the etching stopper. Therefore, it is possible to suppress etching of the field oxide film 4 and the first silicon oxide film 8, whilst the first inter-layer insulator is completely removed.

By use of the photo-resist 15 as a mask, the silicon nitride film 9 and the first silicon oxide film 8 are sequentially subjected to etch-back to thereby form side wall oxide films 17 which comprises the remaining parts of the first silicon oxide film 8. The etch back process is a reactive ion etching which has been carried out at a power of 250 W and a pressure of 700 mTorr by use of argon gas as a carrier gas and $CHF_3$ gas and $CF_4$ gas as etching gases, wherein gas flow rates are $CHF_3$: $CF_4$: Ar=40 sccm: 40 sccm: 800 sccm.

The silicon nitride film 9 remains at the opposite sides of the gate electrode 6B in the peripheral circuit area. The silicon nitride film 9 is however, not in contact with the silicon substrate 1. The silicon nitride film 9 is separated by the first silicon oxide film 8 from the silicon substrate 1. There is no possibility of increase in junction leakage current by the silicon nitride film 9. Even in order to remove the silicon nitride film 9 from the side wall oxide films, it is possible to remove the silicon nitride film by a wet etching process using a thermal phosphorus acid and by use of the stacked capacitor opposite electrode as a mask for subsequent etch back process of the first silicon oxide film 8 so as to completely remove the silicon nitride film 9.

Subsequently, the used photo-resist 15 is removed before another photo-resist 16 is selectively formed on the n-well 2 and the memory cell array area. By use of the photo-resist 16, the gate electrode 6B and the side wall oxide films 17 as masks, an ion-implantation of arsenic is carried out at a dose of $3\times10^{15}$ cm$^{-2}$ to form n$^+$-diffusion layers 18 in the p-well 2 in the peripheral circuit area. As a result, an n-channel MOS field effect transistor having a lightly doped drain structure has been fabricated in the p-well 2 in the peripheral circuit area. The used photo-resist 16 is then removed before still another photo-resist not shown is formed which extends over the memory cell area and over the n-channel MOS field effect transistor. By use of the photo-resist not shown, the gate electrode not shown and the side wall oxide films not shown as masks, an ion-implantation of $BF_2$ is carried out at a dose of $3 \times 10^{15}$ cm$^{-2}$ to form p-diffusion layers not shown but in the n-well 3 in the peripheral circuit area. As a result, a p-channel MOS field effect transistor having a lightly doped drain structure has been fabricated in the n-well 3 in the peripheral circuit area.

Figure 5E:
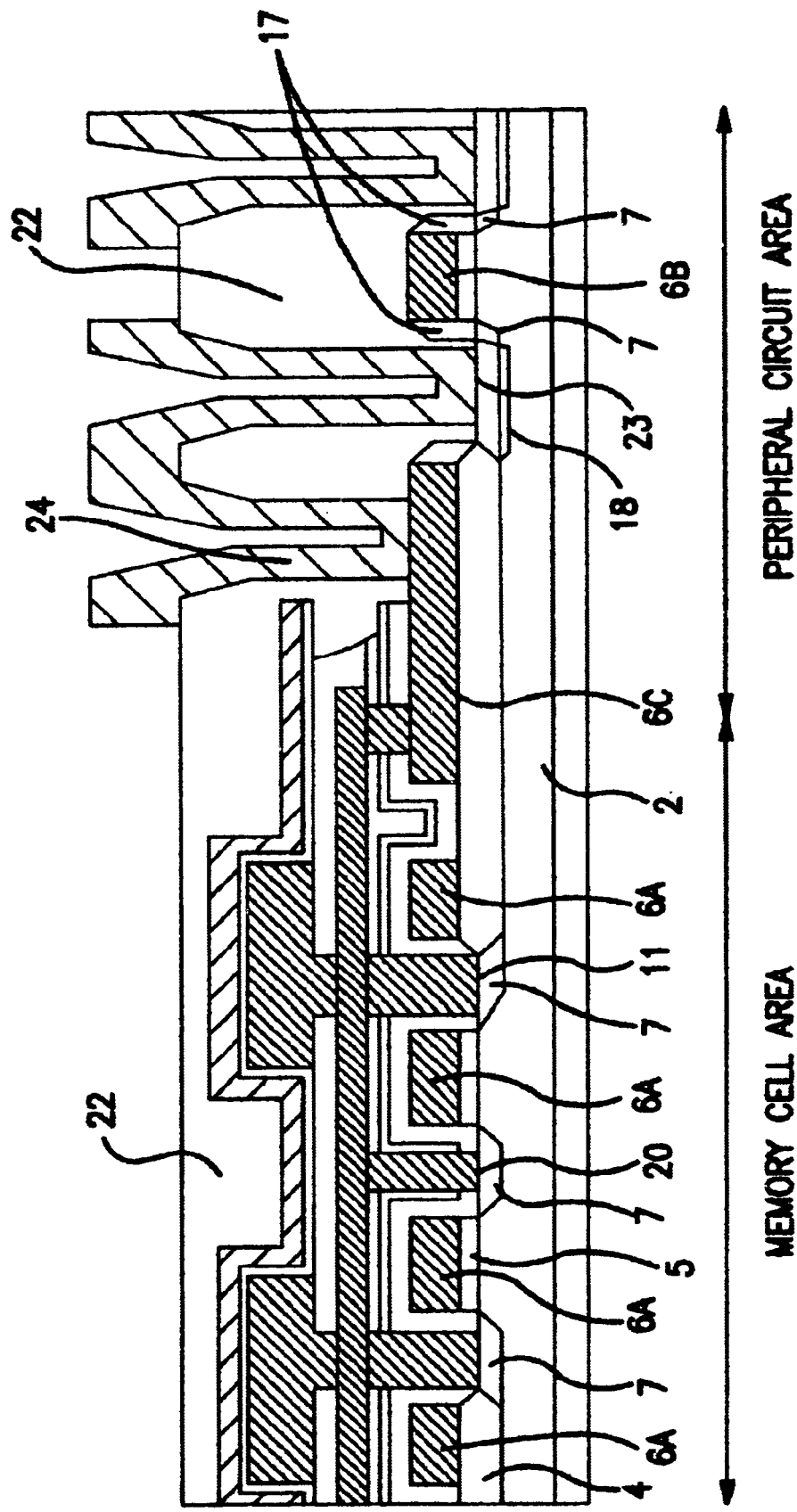

With reference to FIG. 5E, the used photo-resist not shown is removed. A third inter-layer insulator 22 is entirely deposited, which bury the stacked capacitors over the bit line 21 extending over the n-channel MOS field effect transistors in the memory cell area as well as bury the n-channel and p-channel MOS field effect transistors in the peripheral circuit area. The surface of the third inter-layer insulator 22 is planarized and has a height of 1200 nanometers from the surfaces of the n-well 2 and the p-well 3. The third inter-layer insulator 22 may comprise a silicon oxide film (HOT film) formed by a low pressure chemical vapor deposition method at a high temperature and a boro-phospho silicate glass film covering the silicon oxide film. The HTO film has been provided in order to ensure a step coverage of the second inter-layer insulator against the stacked capacitor opposite electrode 14 and the gate electrode as well as to prevent diffusions of phosphorus and boron from the boro-phospho silicate glass film into the impurity diffusion layers. The second inter-layer insulator 19 and the third inter-layer insulator 22 are then selectively etched to form contact holes 23 which are positioned over the n$^+$-diffusion layer 18 in the peripheral circuit area and closer to the n-well 3 so that the n$^+$-diffusion layer 18 in the peripheral circuit area and closer to the n-well 3 are shown through the contact holes 23. An aluminum film is entirely deposited, which extends over the second inter-layer insulator 19 and within the contact hole 23 so that the aluminum film is partially made into contact with the n$^+$-diffusion layer 18 in the peripheral circuit area and closer to the n-well 3. The aluminum film is patterned to form an aluminum interconnection 24 which extends within the contact hole 23 and over the n$^+$-diffusion layer 18 as well as over the second inter-layer insulator 19 but in the vicinity of the contact hole 23. As a result, the dynamic random access memory device having the stacked capacitor memory cell arrays has been fabricated.

In accordance with the above novel fabrication method, the capacitor over bit line structure is provided, wherein the stacked capacitors are provided under the bit lines. The time of the heat treatment carried out after the MOS field effect transistors have been formed in the peripheral circuit area can be reduced. As a result, the scale reduction of the memory cells and increase in the density of the integration are facilitated.

Further, the inter-layer insulator between the stacked capacitors and the gate electrodes are planarized so that the extremely narrow apertures of the gate electrodes in the memory cell array area are buried with the first inter-layer insulator, for which reason the conductive film or the impurity doped polysilicon film to be formed into the stacked capacitor storage electrodes 12 is not deposited in the extremely narrow aperture between the gate electrodes. This makes it unnecessary to remove or etch any conductive films within the extremely narrow apertures defined between the gate electrodes in the memory cell array area. For this reason, the above novel fabrication method is free from the problem in difficulty to completely remove the conductive films within the extremely narrow apertures defined between the gate electrodes in the memory cell array area. Namely, there is no possibility in having the conductive films remain in the extremely narrow apertures defined between the gate electrodes in the memory cell array area nor possibility to cause a problem with short circuit due to the remaining conductive film within the extremely narrow apertures defined between the gate electrodes in the memory cell array area.

Still further, after the memory cells have been formed, the side wall oxide films of the gate electrode in the peripheral circuit area as well as the source/drain diffusion regions are formed in the peripheral circuit area. As a result, the source/drain regions in the peripheral circuit area are free from the influences of the heat treatments carried out to form the memory cell arrays. Also, the time of over-etching is reduced into not more than one fifth of that of the conventional method. The heat treatments have been carried out at a temperature in the range of 800° C. to 950° C., but the time of the heat treatment is largely reduced to 30 minutes from 120 minutes of the conventional method. It is therefore possible to prevent the short channel effect from being caused in the MOS field effect transistors in the peripheral circuit area. This makes it possible to prevent any reduction in threshold voltage of the MOS field effect transistors in the peripheral circuit area. This allows a channel length to be shorten of the MOS field effect transistors in the peripheral circuit area, thereby allowing the MOS field effect transistors to show high speed performances.

In accordance with the present invention, the side wall oxide films of the gate electrode of the lightly doped drain structure MOS field effect transistor comprises the first silicon oxide film. Further, the silicon nitride film is formed over the first silicon oxide film. Furthermore, the first inter-layer insulator is formed over the silicon nitride film. The first inter-layer insulator serves as an etching stopper against the following etching processes. After the stacked capacitor storage electrode contacts 12 have been formed to show the n$^-$-type diffusion layers 7, then the wet etching process is carried out by use of hydrofluoric solution for removal of any spontaneous oxide film from the n$^-$-type diffusion layers 7. The first inter-layer insulator serves as an etching mask against this wet etching. The first inter-layer insulator serves as an etching mask against an anisotropic etching for patterning the stacked capacitor storage electrodes 12. The first inter-layer insulator serves as an etching mask against a wet etching for removal of any spontaneous oxide film from the surfaces of the stacked capacitor storage electrodes 12 before the stacked capacitor insulation film 13 is then formed. The first inter-layer insulator serves as an etching mask against an anisotropic etching for patterning the stacked capacitor opposite electrodes 12. While the surface of the first inter-layer insulator 10 is etched by each of the above etching processes, the first silicon oxide film to be formed into the side wall oxide films is not etched. This allows the side wall oxide films to be desirable defined. This means it possible to obtain any desired light doped drain structure of the MOS field effect transistors in the peripheral circuit area.

As a modification of this embodiment, it is possible to form titanium silicide films over the source/drain diffusion layers and over the stacked capacitor opposite electrode in order to reduce by 2–3% the parasitic resistance of the MOS field effect transistors in the peripheral circuit area. This allows the MOS field effect transistors in the peripheral circuit area to show high speed performances.

Whereas modifications of the present invention will be apparent to a person having ordinary skill in the art, to which the invention pertains, it is to be understood that embodiments as shown and described by way of illustrations are by no means intended to be considered in a limiting sense.

Accordingly, it is to be intended to cover by claims any modifications of the present invention which fall within the spirit and scope of the present invention.

What is claimed is:

1. A method of forming stacked capacitor storage electrodes over a bit line extending over field effect transistors having been provided in a memory cell area of a semiconductor memory device, said method comprising the steps of:

entirely forming a first insulation film which extends over and directly contacts doped sidewalls of gate electrodes of said field effect transistors and within apertures defined between said gate electrodes of said field effect transistors;

planarization of a surface of said first insulation film so that said first insulation film has a first planarized surface, where said gate electrodes of said field effect transistors are buried in said first insulation film;

electively forming at least a bit line contact hold in said first insulation film extending within said apertures defined between said gate electrodes to show a surface of one of source and drain regions of said field effect transistors;

selectively forming at least a bit line which extends over said first planarized surface of said first insulation film and within said bit line contact hole;

entirely forming a second insulation film which extends over said bit line and over said first insulation film;

planarization of a surface of said second insulation film so that said second insulation film has a second planarized surface, where said bit line is buried in said second insulation film;

selectively forming at least a stacked capacitor storage electrode contact hole in said first and second insulation films to show a surface of the opposite one of said source and drain regions of said field effect transistors;

entirely forming a first conductive film which extends over said second planarized surface of said second insulation film and within said stacked capacitor storage electrode contact hole so that said first conductive film is made into contact with said opposite one of said source and drain regions; and subjecting said first conductive film to an anisotropic etching to selectively remove part of said first conductive film which extends only over said second planarized surface of said second insulation film except both in the vicinity of and within said stacked capacitor storage electrode contact hole to pattern stacked capacitor storage electrodes, wherein said step of forming said first insulation film further comprises the steps of:

entirely forming a silicon oxide film which extends over said gate electrodes and within apertures defined between said gate electrodes;

forming a silicon nitride film over said silicon oxide film;

forming an impurity doped silicate glass film over said silicon nitride film; and planarization of a surface of said impurity doped silicate glass film.

2. The method as claimed in claim 1, wherein said impurity doped silicate glass film comprises a boro-phospho silicate glass film which as been formed by a low pressure chemical vapor deposition using $Si(OC_2H_5)_4$ gas, $PH_3$ gas, $B(COH_3)_3)$ gas and $O_2$.

3. The method as claimed in claim 1, wherein said silicon oxide film comprises an HTO film which has been formed by a low pressure chemical vapor deposition using $SiH_4$ and $N_2O$ as source gases.

4. The method as claimed in claim 1, wherein said silicon nitride film is formed by a low pressure chemical vapor deposition using $SiH_2Cl_2$ and $NH_3$ as source gases.

5. The method as claimed in claim 1, further comprising the step of subjecting a surface of said semiconductor substrate to a wet etching to remove a spontaneous oxide film from surfaces of said stacked capacitor storage electrodes, wherein said impurity doped silicate glass film serves as a mask and said silicon nitride film serves as an etching stopper so as to prevent said silicon oxide film from being etched.

6. The method as claimed in claim 1, wherein said planarization of said first insulation film is carried out by a reflow of a surface region of said impurity doped silicate glass film.

7. The method as claimed in claim 1, wherein said planarization of said first insulation film is carried out by a rapid thermal anneal of said impurity doped silicate glass film for subsequent chemical and mechanical polishing to said impurity doped silicate glass film.

8. The method as claimed in claim 1, wherein said planarization of said first insulation film is carried out by a rapid thermal anneal of said impurity doped silicate glass film for subsequent spin coating of a silica film prior to an anneal of said impurity doped silicate glass film before said impurity doped silicate glass film is then subjected to an etch back by an anisotropic etching process.

9. A method of forming stacked capacitors over first field effect transistors having been provided in a memory cell area of a semiconductor memory device and at least a second field effect transistor in a peripheral circuit area of said semiconductor memory device, said method comprising the steps of:

entirely forming a first insulation film which extends over first gate electrodes of said first field effect transistors and within first apertures defined between said first gate electrodes of said first field effect transistors as well as extends over a second gate electrode of said second field effect transistor;

entirely forming a first inter-layer insulator which extends over said first insulation film to completely bury said first and second gate electrodes of said first and second field effect transistors;

planarization of a surface of said first inter-layer insulator so that said first inter-layer insulator has a first planarized surface, where said first and second gate electrodes of said first and second field effect transistors are buried in said first inter-layer insulator;

forming at least a first contact hole in said first insulation film extending within said apertures defined between said first gate electrodes to show a surface of one of source and drain regions of said first field effect transistors;

entirely forming a first conductive film which extends over said first planarized surface of said first inter-layer insulator and within said first contact hole so that said first conductive film is made into contact with said one of said source and drain regions of said first field effect transistors;

subjecting said first conductive film to a first anisotropic etching to selectively remove part of said first conductive film which extends only over said first planarized surface of said first inter-layer insulator except both in the vicinity of and within said first contact hole to pattern stacked capacitor storage electrodes in said memory cell array area, wherein said first inter-layer insulator protects said first insulation film from said first anisotropic etching;

forming a stacked capacitor insulation film which extends over said stacked capacitor storage electrodes as well as over said first planarized surface of said first inter-layer insulator;

entirely forming a second conductive film which extends over said stacked capacitor insulation film;

subjecting said second conductive film and said stacked capacitor insulation film to a second anisotropic etching to selectively remove parts of said second conductive film and said stacked capacitor insulation film from said first planarized surface of said first inter-layer insulator except over and in the vicinity of said first gate electrodes of said first field effect transistors to pattern stacked capacitor insulation films and stacked capacitor opposite electrodes to thereby form stacked capacitors in said memory cell array area, wherein said first inter-layer insulator protects said first insulation film from said second anisotropic etching;

selective removal of said first inter-layer insulator extending only in said peripheral circuit area by a wet etching with use of a first photo-resist film provided over said stacked capacitors in said memory cell array area to thereby show said first insulation film only in said peripheral circuit area;

removal of said first photo-resist film; and subjecting said first insulation film only in said peripheral circuit area to an etch-back by use of a second photo-resist film provided over said stacked capacitors in said memory cell array area so that said first insulation film remains only on opposite side walls of said second gate electrode of said second field effect transistor to thereby form side wall oxide films at said opposite side walls of said second gate electrode.

10. The method as claimed in claim 9, further comprising the step of removal of a spontaneous oxide film from said surface of said source and drain regions shown through said first contact hole by a first wet etching, wherein said first inter-layer insulator protects said first insulation film from said first wet etching, before said first conductive film is formed.

11. The method as claimed in claim 9, further comprising the step of removal of a spontaneous oxide film from surfaces of said stacked capacitor storage electrodes by a third wet etching, wherein said first inter-layer insulator protects said first insulation film from said third wet etching, before said stacked capacitor insulation film is formed.

12. The method as claimed in claim 9, further comprising the step of carrying out an ion-implantation of an impurity into said source and drain regions of said second field effect transistor by use of said second gate electrode, said side wall oxide films and said second photo-resist film as masks to form lightly doped drain structure of said second field effect transistor.

13. The method as claimed in claim 12, further comprising the step of, after said second photo-resist film has been removed, entirely depositing a titanium film for subsequent rapid heat anneal to cause a silicidation reaction of titanium with silicon to thereby form titanium silicide films over at least said stacked capacitor opposite electrodes and said source and drain regions of said second field effect transistor before an unreacted titanium film is then removed.

14. The method as claimed in claim 13, further comprising the step of:

entirely forming a second inter-layer insulator to bury said stacked capacitors in said memory cell array area and said second field effect transistor in said peripheral circuit area;

forming bit line contact holes in said first and second inter-layer insulators and said first insulation film so as to show surfaces of opposite one of said source and drain regions of each of said first and second field effect transistors; and forming a bit line which extends over said second inter-layer insulator and within said bit line contact holes so that said bit line is made into contact with said surfaces of said opposite one of said source and drain regions of each of said first and second field effect transistors.

15. The method as claimed in claim 14, wherein said bit line is formed by the steps of:

depositing an impurity doped polysilicon film over said second inter-layer insulator and within said bit line contact;

forming a tungsten silicide film over said impurity doped polysilicon film to thereby form a tungsten polyside film; and patterning said tungsten polyside film.

16. The method as claimed in claim 9, wherein said step of forming said first insulation film further comprises the steps of:

entirely forming a silicon oxide film which extends over said gate electrodes and within apertures defined between said gate electrodes; and forming a silicon nitride film over said silicon oxide film.

17. The method as claimed in claim 9, wherein said first inter-layer insulator is formed by depositing an impurity doped silicate glass film.

18. The method as claimed in claim 17, wherein said impurity doped silicate glass film comprises a boro-phospho silicate glass film which has been formed by a low pressure chemical vapor deposition using $Si(OC_2H_5)_4$ gas, $PH_3$ gas, $B(COH_3)_3$) gas and $O_2$.

19. The method as claimed in claim 16, wherein said silicon oxide film comprises an HTO film which has been formed by a low pressure chemical vapor deposition using $SiH_4$ and $N_2O$ as source gases.

20. The method as claimed in claim 16, wherein said silicon nitride film is formed by a low pressure chemical vapor deposition using $SiH_2Cl_2$ and $NH_3$ as source gases.

21. The method as claimed in claim 9, wherein said first contact hole is formed by an anisotropic etching process using a fluoro-carbon system etching gas.

22. The method as claimed in claim 9, wherein said first conductive film is formed by depositing an impurity doped amorphous silicon film.

23. The method as claimed in claim 9, wherein said first conductive film is formed by depositing an undoped poly-silicon film for subsequent ion-implantation of an impurity into said undoped polysilicon film to form an impurity doped polysilicon film.

24. The method as claimed in claim 9, wherein said first conductive film is formed by depositing an undoped poly-silicon film for subsequent thermal diffusion of an impurity into said undoped polysilicon film to form an impurity doped polysilicon film.

25. The method as claimed in claim 9, wherein said planarization of said first inter-layer insulator is carried out by a reflow of a surface region of said first inter-layer insulator.

26. The method as claimed in claim 17, wherein said planarization of said first inter-layer insulator is carried out by a reflow of a surface region of said impurity doped silicate glass film.

27. The method as claimed in claim 17, wherein said planarization of said first inter-layer insulator is carried out by a rapid thermal anneal of said impurity doped silicate glass film for subsequent chemical and mechanical polishing to said impurity doped silicate glass film.

28. The method as claimed in claim 17, wherein said planarization of said first inter-layer insulator is carried out by a rapid thermal anneal of said impurity doped silicate glass film for subsequent spin coating of a silica film prior to an anneal of said impurity doped silicate glass film before said impurity doped silicate glass film is then subjected to an etch back by an anisotropic etching process.

29. A method of forming stacked capacitors over a bit line extending over first field effect transistors having been provided in a memory cell area of a semiconductor memory device and at least a second field effect transistor in a peripheral circuit area of said semiconductor memory device, said method comprising the steps of:

entirely forming a first insulation film which extends over first gate electrodes of said first field effect transistors and within first apertures defined between said first gate electrodes of said first field effect transistors as well as extends over a second gate electrode of said second field effect transistor;

entirely forming a first inter-layer insulator which extends over said first insulation film to completely bury said first and second gate electrodes of said first and second field effect transistors;

planarization of a surface of said first-layer insulator so that said first inter-layer insulator has a first planarized surface, where said first and second gate electrodes of said first and second field effect transistors are buried in said first inter-layer insulator;

selectively forming bit line contact holes in said first inter-layer insulator and said first insulation film so as to show surfaces of one of said source and drain regions of each of said first and second field effect transistors;

selectively forming a bit line which extends over said first planarized surface of said first inter-layer insulator and within said bit line contact holes so that said bit line is made into contact with said surfaces of said one of said source and drain regions of each of said first and second field effect transistors;

entirely forming a second inter-layer insulator which extends over said bit line and said first planarized surface of said first inter-layer insulator;

planarization of a surface of said second inter-layer insulator so that said second inter-layer insulator has a second planarized surface;

forming at least a first contact hole in said first and second inter-layer insulators and in said first insulation film extending within said apertures defined between said first gate electrodes so as to show a surface of opposite one of said source and drain regions of said first field effect transistors;

entirely forming a first conductive film which extends over said second planarized surface of said second inter-layer insulator and within said first contact hole so that said first conductive film is made into contact with said opposite one of said source and drain regions of said first field effect transistors;

subjecting said first conductive film to a first anisotropic etching to selectively remove part of said first conductive film which extends only over said second planarized surface of said second inter-layer insulator except both in the vicinity of and within said first contact hole to pattern stacked capacitor storage electrodes in said memory cell array area, wherein said first and second inter-layer insulators protect said first insulation film from said first anisotropic etching;

forming a stacked capacitor insulation film which extends over said stacked capacitor storage electrodes as well as over said second planarized surface of said second inter-layer insulator;

entirely forming a second conductive film which extends over said stacked capacitor insulation film;

subjecting said second conductive film and said stacked capacitor insulation film to a second anisotropic etching to selectively remove parts of said second conductive film and said stacked capacitor insulation film from said second planarized surface of said second inter-layer insulator except over and in the vicinity of said first gate electrodes of said first field effect transistors to pattern stacked capacitor insulation films and stacked capacitor opposite electrodes to thereby form stacked capacitors in said memory cell array area, wherein said first inter-layer insulator protects said first insulation film from said second anisotropic etching;

selective removal of said first and second inter-layer insulators extending only in said peripheral circuit area by a wet etching with use of a first photo-resist film provided over said stacked capacitors in said memory cell array area to thereby show said first insulation film only in said peripheral circuit area;

removal of said first photo-resist film; and subjecting said first insulation film only in said peripheral circuit area to an etch-back by use of a second photo-resist film provided over said stacked capacitors in said memory cell array area so that said first insulation film remains only on opposite side walls of said second gate electrode of said second field effect transistor to thereby form side wall oxide films at said opposite side walls of said second gate electrode.

30. The method as claimed in claim 29, further comprising the step of removal of a spontaneous oxide film from said surface of said source and drain regions shown through said first contact hole by a first wet etching, wherein said first and second inter-layer insulators protect said first insulation film from said first wet etching, before said first conductive film is formed.

31. The method as claimed in claim 29, further comprising the step of removal of a spontaneous oxide film from said surface of said source and drain regions shown through said bit line contact hole by a second wet etching, wherein said first inter-layer insulator protects said first insulation film from said second wet etching, before said bit line is formed.

32. The method as claimed in claim 29, further comprising the step of removal of a spontaneous oxide film from surfaces of said stacked capacitor storage electrodes by a third wet etching, wherein said first and second inter-layer insulators protect said first insulation film from said third wet etching, before said stacked capacitor insulation film is formed.

33. The method as claimed in claim 29, further comprising the step of carrying out an ion-implantation of an impurity into said source and drain regions of said second field effect transistor by use of said second gate electrode, said side wall oxide films and said second photo-resist film as masks to form lightly doped drain structure of said second field effect transistor.

34. The method as claimed in claim 33, further comprising the step of, after said second photo-resist film has been removed, entirely depositing a titanium film for subsequent rapid heat anneal to cause a silicidation reaction of titanium with silicon to thereby form titanium silicide films over at least said stacked capacitor opposite electrodes and said source and drain regions of said second field effect transistor before an unreacted titanium film is then removed.

35. The method as claimed in claim 29, wherein said step of forming said first insulation film further comprises the steps of:
   entirely forming a silicon oxide film which extends over said gate electrodes and within apertures defined between said gate electrodes; and
   forming a silicon nitride film over said silicon oxide film.

36. The method as claimed in claim 29, wherein said first inter-layer insulator is formed by depositing an impurity doped silicate glass film.

37. The method as claimed in claim 36, wherein said impurity doped silicate glass film comprises a boro-phospho silicate glass film which has been formed by a low pressure chemical vapor deposition using $Si(OC_2H_5)_4$ gas, $PH_3$ gas, $B(COH_3)_3)$ gas and $O_2$.

38. The method as claimed in claim 35, wherein said silicon oxide film comprises an HTO film which has been formed by a low pressure chemical vapor deposition using $SiH_4$ and $N_2O$ as source gases.

39. The method as claimed in claim 35, wherein said silicon nitride film is formed by a low pressure chemical vapor deposition using $SiH_2Cl_2$ and $NH_3$ as source gases.

40. The method as claimed in claim 29, wherein said first contact hole is formed by an anisotropic etching process using a fluoro-carbon system etching gas.

41. The method as claimed in claim 29, wherein said first conductive film is formed by depositing an impurity doped amorphous silicon film.

42. The method as claimed in claim 29, wherein said first conductive film is formed by depositing an undoped polysilicon film for subsequent ion-implantation of an impurity into said undoped polysilicon film to form an impurity doped polysilicon film.

43. The method as claimed in claim 29, wherein said first conductive film is formed by depositing an undoped polysilicon film for subsequent thermal diffusion of an impurity into said undoped polysilicon film to form an impurity doped polysilicon film.

44. The method as claimed in claim 29, wherein said planarization of said first inter-layer insulator is carried out by a reflow of a surface region of said first inter-layer insulator.

45. The method as claimed in claim 36, wherein said planarization of said first inter-layer insulator is carried out by a reflow of a surface region of said impurity doped silicate glass film.

46. The method as claimed in claim 36, wherein said planarization of said first inter-layer insulator is carried out by a rapid thermal anneal of said impurity doped silicate glass film for subsequent chemical and mechanical polishing to said impurity doped silicate glass film.

47. The method as claimed in claim 36, wherein said planarization of said first inter-layer insulator is carried out by a rapid thermal anneal of said impurity doped silicate glass film for subsequent spin coating of a silica film prior to an anneal of said impurity doped silicate glass film before said impurity doped silicate glass film is then subjected to an etch back by an anisotropic etching process.

48. The method as claimed in claim 27, wherein said second inter-layer insulator is formed by depositing an impurity doped silicate glass film.

49. The method as claimed in claim 48, wherein said impurity doped silicate glass film comprises a boro-phospho silicate glass film which has been formed by a low pressure chemical vapor deposition using $Si(OC_2H_5)_4$ gas, $PH_3$ gas, $B(COH_3)_3)$ gas and $O_2$.

50. The method as claimed in claim 29, wherein said planarization of said second inter-layer insulator is carried out by a reflow of a surface region of said first inter-layer insulator.

51. The method as claimed in claim 48, wherein said planarization of said fist inter-layer insulator is carried out by a reflow of a surface region of said impurity doped silicate glass film.

52. The method as claimed in claim 48, wherein said planarization of said first inter-layer insulator is carried out by a rapid thermal anneal of said impurity doped silicate glass film for subsequent chemical and mechanical polishing to said impurity doped silicate glass film.

53. The method as claimed in claim 48, wherein said planarization of said first inter-layer insulator is carried out by a rapid thermal anneal of said impurity doped silicate glass film for subsequent spin coating of a silica film prior to an anneal of said impurity doped silicate glass film before said impurity doped silicate glass film is then subjected to an etch back by an anisotropic etching process.

54. The method as claimed in claim 29, wherein said bit line is formed by the steps of:
   depositing an impurity doped polysilicon film over said first planarized surface of said first inter-layer insulator and within said bit line contact;
   forming a tungsten silicide film over said impurity doped polysilicon film to thereby form a tungsten polyside film; and
   patterning said tungsten polyside film.

55. A method for forming a semiconductor memory device, including the steps of:
   forming gate electrodes in a memory cell area and a peripheral circuit area respectively over a silicon substrate;
   selectively introducing an impurity into said silicon substrate by using said gate electrodes as masks to form low impurity concentration layers in said silicon substrate;
   forming an insulating film which covers said gate electrodes;
   forming an inter-layer insulator with a planarized surface over said insulating film;
   forming storage electrode contact holes in said inter-layer insulator and said insulating film;
   forming a conductive film over said planarized surface of said inter-layer insulator and within said storage electrode contacts;
   selectively removing said conductive film to load said conductive film within said storage electrode contacts only to form capacitive storage electrodes;
   selectively forming capacitive insulating films which cover said capacitive storage electrodes;
   selectively forming capacitive opposite electrodes which cover said capacitive insulating films;
   selectively forming a resist pattern which covers said capacitive opposite electrodes in said memory cell region to leave exposed a part of said planarized surface of said inter-layer insulator in said peripheral circuit area;
   selectively removing said inter-layer insulator and said insulating film in said peripheral circuit area by using said resist pattern as a mask to form side walls on sides of said gate electrodes;
   removing said resist pattern and in place selectively forming another resist pattern which cover said memory cell area; and
   selectively introducing an impurity into said substrate in said peripheral circuit area by using said another resist pattern as a mask to form high impurity concentration layers in said peripheral circuit area.

* * * * *